US009738765B2

(12) United States Patent
Brink et al.

(10) Patent No.: US 9,738,765 B2
(45) Date of Patent: Aug. 22, 2017

(54) HYBRID TOPOGRAPHICAL AND CHEMICAL PRE-PATTERNS FOR DIRECTED SELF-ASSEMBLY OF BLOCK COPOLYMERS

(71) Applicant: International Business Machines Corporation, Armonk, NY (US)

(72) Inventors: Markus Brink, White Plains, NY (US); Joy Cheng, San Jose, CA (US); Gregory S. Doerk, Mountain View, CA (US); Alexander M. Friz, San Jose, CA (US); Michael A. Guillorn, Yorktown Heights, NY (US); Chi-Chun Liu, Altamont, NY (US); Daniel P. Sanders, San Jose, CA (US); Gurpreet Singh, Hillsboro, OR (US); Melia Tjio, San Jose, CA (US); HsinYu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 14/626,082

(22) Filed: Feb. 19, 2015

(65) Prior Publication Data

US 2016/0244581 A1    Aug. 25, 2016

(51) Int. Cl.
*B44C 1/22* (2006.01)
*C08J 7/04* (2006.01)
(Continued)

(52) U.S. Cl.
CPC ............ *C08J 7/047* (2013.01); *B05D 3/0453* (2013.01); *B05D 7/54* (2013.01);
(Continued)

(58) Field of Classification Search
CPC ......... H01L 21/02255; H01L 21/02118; C23C 14/042; B81C 1/00436
(Continued)

(56) References Cited

U.S. PATENT DOCUMENTS 7,521,090 B1    4/2009 Cheng et al.
7,521,094 B1    4/2009 Cheng et al.
(Continued)

FOREIGN PATENT DOCUMENTS

CN    101202213 A    6/2008
CN    103839785 A    6/2014
(Continued)

OTHER PUBLICATIONS

Basker, V.S. et al., "A 0.063 pm2 FinFET SRAM cell demonstration with conventional lithography using a novel integration scheme with aggressively scaled fin and gate pitch" 2010 Symposium on VLSI Technology Digest of Technical Papers (Jun. 15-17, 2010) pp. 19-20.
(Continued)

*Primary Examiner* — Binh X Tran
(74) *Attorney, Agent, or Firm* — Michael R. Roberts

(57) ABSTRACT

Hybrid pre-patterns were prepared for directed self-assembly of a given block copolymer capable of forming a lamellar domain pattern. The hybrid pre-patterns have top surfaces comprising independent elevated surfaces interspersed with adjacent recessed surfaces. The elevated surfaces are neutral wetting to the domains formed by self-assembly. Material below the elevated surfaces has greater etch-resistance than material below the recessed surfaces in a given etch process. Following other dimensional constraints of the hybrid pre-pattern described herein, a layer of the given block copolymer was formed on the hybrid pre-pattern. Self-assembly of the layer produced a lamellar
(Continued)

domain pattern comprising self-aligned, unidirectional, perpendicularly oriented lamellae over the elevated surfaces, and parallel and/or perpendicularly oriented lamellae over recessed surfaces. The domain patterns displayed long range order along the major axis of the pre-pattern. The lamellar domain patterns are useful in forming transfer patterns comprising two-dimensional customized features.

31 Claims, 20 Drawing Sheets

(51) Int. Cl.
    *H01L 21/02*         (2006.01)
    *B05D 3/04*          (2006.01)
    *B05D 7/00*          (2006.01)
    *C23C 14/04*        (2006.01)

(52) U.S. Cl.
    CPC .. *H01L 21/02118* (2013.01); *H01L 21/02255* (2013.01); *C08J 2325/14* (2013.01); *C08J 2333/12* (2013.01); *C08J 2333/14* (2013.01); *C08J 2453/00* (2013.01); *C23C 14/042* (2013.01)

(58) Field of Classification Search
    USPC ............................................. 216/41, 47, 72
    See application file for complete search history.

(56) References Cited

U.S. PATENT DOCUMENTS

| | | |
|---|---|---|
| 7,790,350 B2 | 9/2010 | Breyta et al. |
| 7,923,373 B2 | 4/2011 | Sandhu |
| 8,088,551 B2 | 1/2012 | Sills et al. |
| 8,133,534 B2 | 3/2012 | Stoykovich et al. |
| 8,226,838 B2 | 7/2012 | Cheng et al. |
| 8,747,682 B2 | 6/2014 | Matsunaga et al. |
| 2007/0227383 A1 | 10/2007 | Decre et al. |
| 2008/0265415 A1 | 10/2008 | Colburn et al. |
| 2009/0191713 A1 | 7/2009 | Yoon et al. |
| 2009/0308837 A1 | 12/2009 | Albrecht et al. |
| 2010/0124629 A1 | 5/2010 | Gopalan et al. |
| 2010/0167214 A1 | 7/2010 | Yoon et al. |
| 2010/0297847 A1 | 11/2010 | Cheng et al. |
| 2011/0059299 A1 | 3/2011 | Kim et al. |
| 2012/0138571 A1 | 6/2012 | Black et al. |
| 2012/0217220 A1 | 8/2012 | Dobisz et al. |
| 2014/0273476 A1 | 9/2014 | Cheng et al. |
| 2014/0287083 A1* | 9/2014 | Gao .................. G03F 7/0035 425/385 |
| 2014/0335324 A1 | 11/2014 | Kim et al. |
| 2015/0021295 A1* | 1/2015 | Yoshikawa ........... G03F 7/0002 216/66 |
| 2015/0031210 A1* | 1/2015 | Ban .................... H01L 21/0337 438/703 |
| 2015/0206548 A1 | 7/2015 | Yang et al. |
| 2016/0064027 A1* | 3/2016 | Arora .................. G11B 5/855 216/22 |
| 2016/0122579 A1* | 5/2016 | Wu ..................... C09D 153/00 216/67 |
| 2016/0122859 A1* | 5/2016 | Cushen ................ G03F 7/0002 216/49 |
| 2016/0141184 A1* | 5/2016 | Sirard ................. H01L 21/3088 438/719 |

FOREIGN PATENT DOCUMENTS

| | | |
|---|---|---|
| KR | 100858223 B1 | 9/2008 |
| WO | 2014120320 A2 | 8/2014 |
| WO | 2016132248 A1 | 8/2016 |

OTHER PUBLICATIONS

Black, C.T., "Self-Aligned Self Assembly of Multi-Nanowire Silicon Field Effect Transistors" Applied Physics Letters, Oct. 2005, pp. 163116-1-163116-3, vol. 87.

Korean Patent Office, International Search Report and Written Opinion, PCT/US2013/069988, mailed Aug. 11, 2014 corresponding to U.S. Appl. No. 13/683,447, filed Nov. 21, 2012.

Liu, G. et al., "Integration of Density Multiplication in the Formation of Device-Oriented Structures by Directed Assembly of Block Copolymer—Homopolymer Blends" Advanced Functional Materials (Apr. 23, 2010) pp. 1251-1257, vol. 20, No. 8.

Ruiz, R. et al., "Rectangular Patterns Using Block Copolymer Directed Assembly for High Bit Aspect Ratio Patterned Media". ACS Nano (2011) pp. 79-84, vol. 5, No. 1.

Stoykovich, M. P. et al., "Directed Self-Assembly of Block Copolymers for Nanolithography: Fabrication of Isolated Features and Essential Integrated Circuit Geometries" ACS Nano (Oct. 6, 2007) pp. 168-175, vol. 1, No. 3.

ISA/CN, Chinese Patent Office, International search report and written opinion, international application PCT/IB2016050644, mailed Jun. 6, 2016, PCT filing date Feb. 8, 2016.

Cheng, et al., "Customization and Design of Directed Self-Assembly Using Hybrid Prepatterns", SPIE Advanced Lithography, Abstract, Feb. 24, 2015.

Cheng, et al., "Simple and Versatile Methods To Integrate Directed Self-Assembly with Optical Lithography Using a Polarity-Switched Photoresist", ACSNano, 2010, vol. 4, pp. 4815-4823.

Detcheverry, et al., "Interpolation in the Directed Assembly of Block Copolymers on Nanopatterned Substrates: Simulation and Experiments", Macromolecules 2010, 43, 3446-3454.

Doerk, et al., "Deterministically Isolated Gratings through the Directed Self-Assembly of Block Copolymers", Proc. SPIE 8680, Alternative Lithographic Technologies V, 86800Y (Mar. 26, 2013).

Doerk, et al., "Enabling Complex Nanoscale Pattern Customization Using Directed Self-Assembly", Nature Communications 5, Article No. 5805, Published Dec. 16, 2014.

Doerk, et al., "Pattern Placement Accuracy in Block Copolymer Directed Self-Assembly Based on Chemical Epitaxy", ACS Nano, 2013, 7, 276-285.

IBM, List of IBM Patents or Patent Applications Treated as Related, Feb. 13, 2015.

Liu, et al., "Chemical Patterns for Directed Self-Assembly of Lamellae-Forming Block Copolymers with Density Multiplication of Features", Macromolecules 2013, 46, 1415-1424.

Liu, et al., "Fabrication of Lithographically Defined Chemically Patterned Polymer Brushes and Mats", Macromolecules 2011, 44, 1876-1885.

Liu, et al., "Integration of Density Multiplication in the Formation of Device-Oriented Structures by Directed Assembly of Block Copolymer-Homopolymer Blends", Adv. Funct. Mater. 2010, 20, 1251-1257.

Liu, et al., "Towards Electrical Testable SOI Devices Using Directed Self-Assembly for Fin Formation", Proc. SPIE 9049, Alternative Lithographic Technologies VI, 904909 (Mar. 28, 2014).

Rincon, et al., "Determination of Critical Parameters for Control of Directed Self-Assembly of Block Copolymers Using Frequency Multiplication", SRC Annual Review, Sep. 25, 2012.

Sayan, et al., "Directed Self-Assembly Process Integration—Fin Patterning Approaches and Challenges", Proc. SPIE 9051, Advances in Patterning Materials and Processes XXXI, 90510M (Mar. 27, 2014).

Seidel, et al., "Investigation of cross-linking poly(methyl methacrylate) as a guiding material in block copolymer directed self-assembly", Proc. SPIE 9051, Advances in Patterning Materials and Processes XXXI, 90510K (Mar. 27, 2014).

Tiron, et al., "Optimization of block copolymer self-assembly through graphoepitaxy: A defectivity study", Journal of Vacuum Science & Technology B 29, 06F206 (2011).

(56) References Cited

OTHER PUBLICATIONS

Intellectual Property Office of UK, Examination Report, Application No. GB1704200.3, dated May 12, 2017.

* cited by examiner

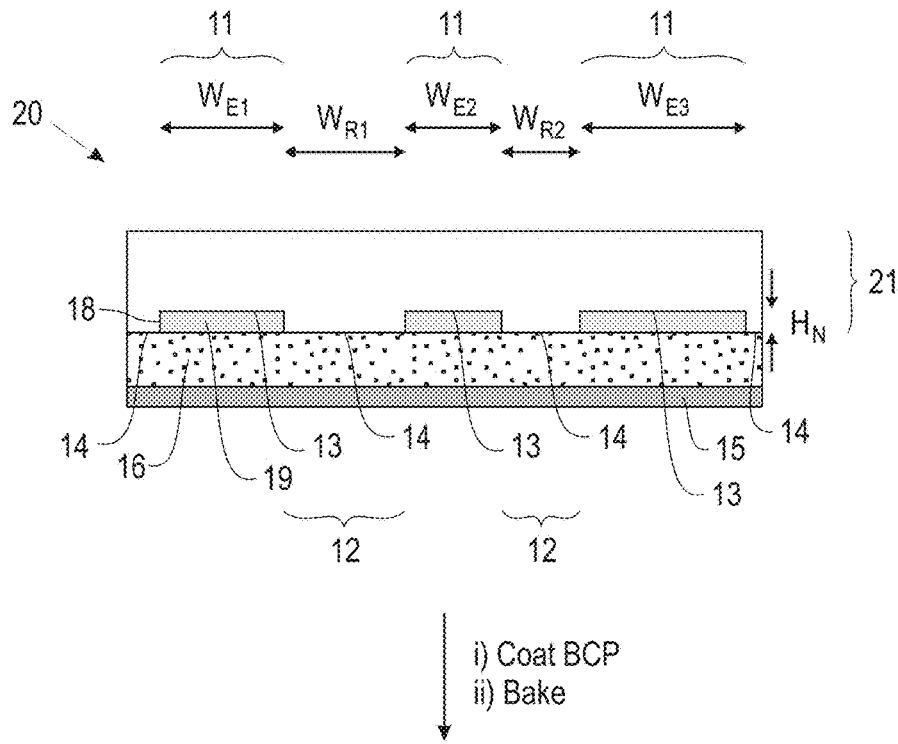
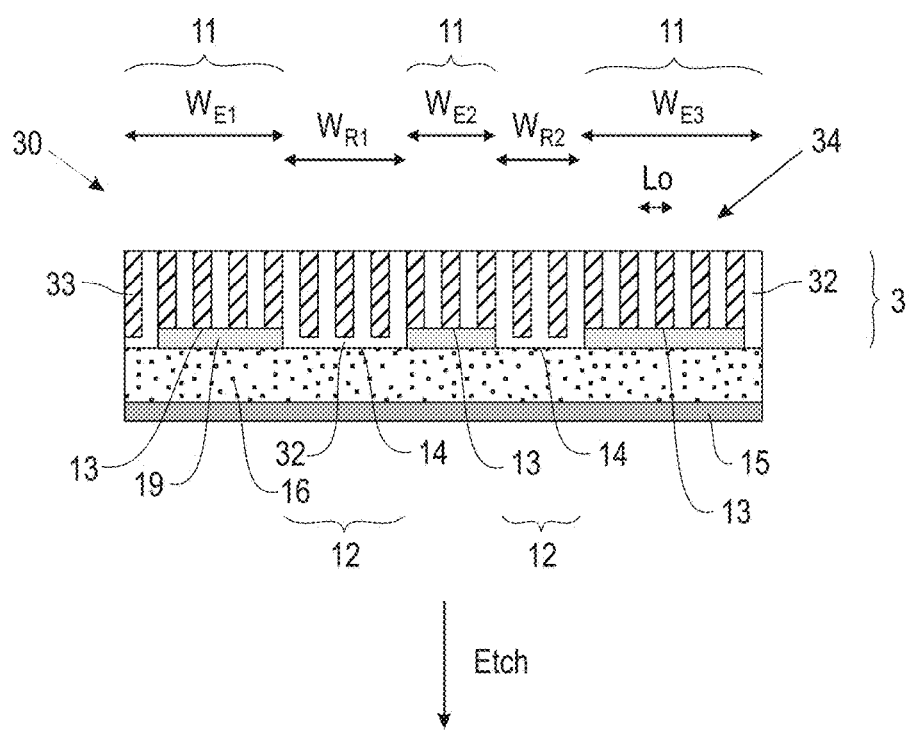

Coat Underlayer

Coat
Pattern-Wise Expose
Develop

Backfill

Strip Resist

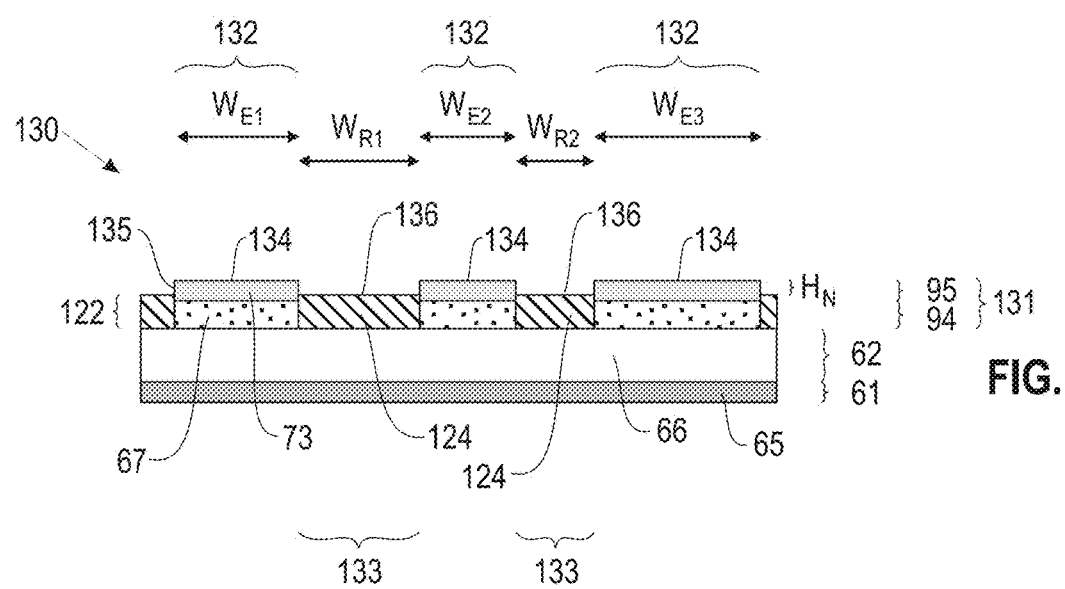

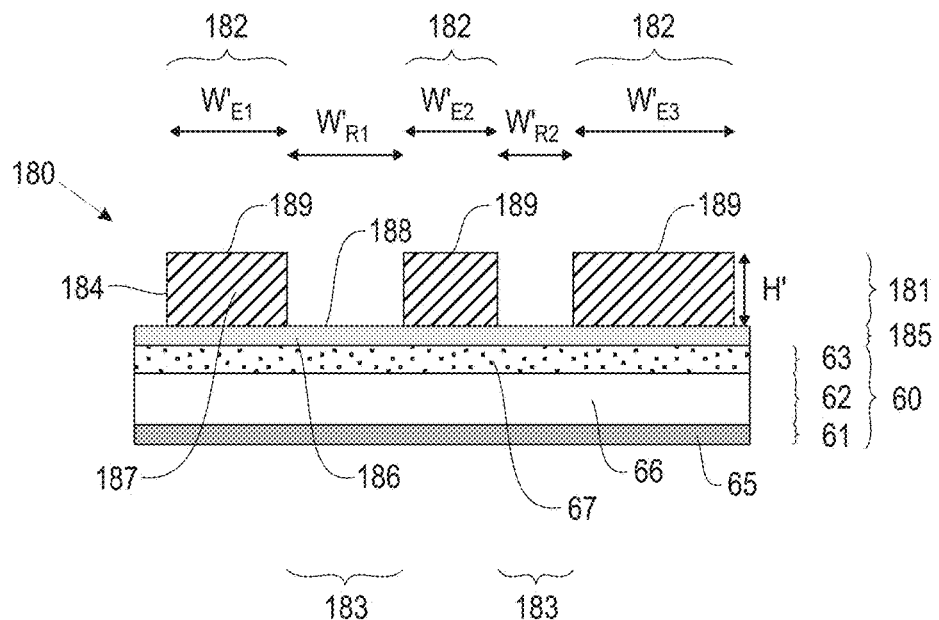
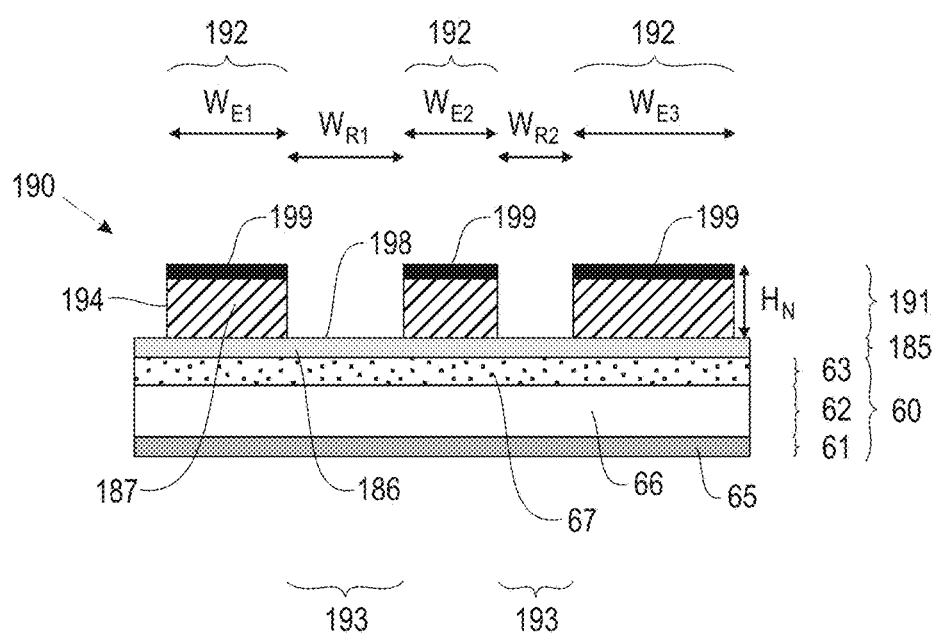

Ex 6A
$W_E + W_R = 4L_0$
$W_E + W_R = 5L_0$

Ex 6B
$W_E + W_R = 9L_0$

Ex 6C
$W_E + W_R = 6L_0$

HYBRID TOPOGRAPHICAL AND CHEMICAL PRE-PATTERNS FOR DIRECTED SELF-ASSEMBLY OF BLOCK COPOLYMERS

STATEMENT REGARDING PRIOR DISCLOSURES BY THE INVENTOR OR A JOINT INVENTOR

The following disclosure(s) are submitted under 35 U.S.C. 102(b)(1)(A):
i) Doerk, et. al, "Deterministically isolated gratings through the directed self-assembly of block copolymers", Proc. SPIE 8680, Alternative Lithographic Technologies V, 86800Y, 26 Mar. 2013; and
ii) Cheng, et al., "Customization and Design of Directed Self-Assembly Using Hybrid Prepatterns", Abstract submitted for Proc. SPIE Advanced Lithography, Conference Feb. 22-26, 2015, San Jose, Calif.

BACKGROUND

The present invention relates to hybrid topographical and chemical pre-patterns for directed self-assembly of block copolymers, and more specifically, to pre-patterns supporting perpendicular orientation of self-assembled domain patterns over regions of the pre-pattern having different etch characteristics.

The directed self-assembly (DSA) of block copolymers (BCPs) is a promising resolution enhancement technology to extend patterning. Chemoepitaxy, a form of DSA, has been demonstrated to reliably generate dense grating and hexagonal arrays from sparse chemical pre-patterns comprising a directing region (alignment conferring non-neutral region with preferential affinity to one domain) and a non-directing region (neutral region) supporting perpendicular orientation of BCP domains. In chemoepitaxy for a block copolymer having a bulk periodicity (pitch) of Lo ("L nought"), the width of the alignment conferring regions can be approximately 0.5 Lo (i.e., 0.5 times Lo) or approximately 1.5 Lo.

For example, in a report of systematic study of chemoepitaxy using a chemical pre-pattern having a pitch of 3 Lo for 3× density multiplication (i.e., 3 times density multiplication), where the pre-pattern was made from crosslinked polystyrene as the directing region and a neutral material as the non-directing region that supports perpendicular orientation, good DSA was only achieved when the width of the alignment conferring region of the pre-pattern was 0.4 Lo to 0.8 Lo, or about 1.3 Lo (Detcheverry, et al., Macromolecules, 2010, vol 43, pages 3446-3454; Rincon, et al., "Determination of Critical Parameters for Control of Directed Self-Assembly of Block Copolymers Using Frequency Multiplication, 2012 Report of SRC Annual Review, University of Chicago). If the width of alignment conferring region was outside this range of values, good DSA was not obtained. In addition, if the alignment conferring region was larger than 2 Lo, good DSA was not obtained. Instead, flipped domains and defects were observed.

Many patterning applications demand complex customization of dense DSA patterns. Recently the customizations of dense DSA arrays using a separate cut layer were implemented in two different approaches: customization before DSA layer formation ("cut-first"), and customization after DSA layer formation ("cut-last"). Cut-first schemes using buried customization levels under the DSA guiding layer have been demonstrated (Sayan, et al., "Directed Self-Assembly Process Integration—Fin Patterning Approaches and Challenges", Proc. of SPIE, Advances in Patterning Materials and Processes XXXI, 2014, Vol. 9051, 90510M). Cut-last customization of 42 nm pitch line-space DSA patterns after DSA with separate mask have also been demonstrated (Liu, et. al., "Towards electrical testable SOI devices using Directed Self-Assembly for fin formation", Proc. SPIE 9049, Alternative Lithographic Technologies VI, 904909, 2014). However, as the pitch of the DSA pattern becomes smaller, customization of the DSA pattern becomes more challenging because of the tight overlay budget.

A need exists for multi-layer pre-patterns supporting self-aligned customization of perpendicularly oriented DSA domain patterns over regions possessing different wetting properties and etch characteristics with wide design spaces, for generation of self-aligned customized transfer patterns that minimize the need to align separate cut layers.

SUMMARY

Accordingly, a method is disclosed, comprising:
i) forming a layer (SA layer) comprising a material for self-assembly (SA material) on a top surface of a hybrid pre-pattern, and optionally forming a topcoat disposed on a top surface of the SA layer, wherein
the SA material is capable of self-assembling to form a phase separated lamellar domain pattern having a characteristic pitch Lo,
the pre-pattern is disposed on a substrate,
the top surface of the pre-pattern has a geometrical major axis,
the top surface of the pre-pattern comprises a) independent elevated surfaces interspersed with adjacent recessed surfaces and b) sidewalls joining elevated surfaces to recessed surfaces,
material underlying the elevated surfaces of the pre-pattern has greater etch-resistance in a given etch process compared to material underlying the recessed surfaces of the pre-pattern,
a given elevated surface has width $W_E$ defined as the length of the given elevated surface in a direction perpendicular to the major axis,
a given recessed surface has width $W_R$ defined as the length of the recessed surface in a direction perpendicular to the major axis,
$W_R+W_E$ for each pair of adjacent recessed and elevated surfaces is an independent sum having a value of about nLo (n times Lo), wherein n is an integer of 2 to about 30,
$W_R$ of at least one of the recessed surfaces is greater than about 2 Lo,
$W_E$ of at least one of the elevated surfaces is greater than about 2 Lo,
each of the sidewalls has an independent height $H_N$ of about 0.1 Lo to about 2 Lo,
the SA layer contacts the elevated surfaces, recessed surfaces, and sidewalls of the pre-pattern, and
the SA layer has a top surface in contact with an atmosphere or the topcoat;
ii) allowing or inducing the SA material to self-assemble, thereby forming a self-assembled SA layer comprising the lamellar domain pattern, the domain pattern comprising alternating domains comprising respective chemically distinct components of the SA material, each of the domains comprising a plurality of lamellae, wherein
the elevated surfaces are neutral wetting to the domains,
each of the elevated surfaces contacts at least one of the lamellae of each of the domains, each of the lamellae in contact with a given elevated surface of the pre-pattern a) is oriented perpendicular to the given elevated surface, b) is in contact with the atmosphere interface and/or the topcoat above the given elevated surface, and c) is aligned along the major axis of the pre-pattern, iii) selectively removing one of the domains using an etch process, thereby forming an etched domain pattern comprising lamellae of a remaining domain; and iv) selectively transferring the etched domain pattern into the material having greater etch-resistance below the elevated surfaces using a second etch process, thereby forming a transfer pattern comprising topographical features comprising the material of greater etch-resistance.

Another method is disclosed, comprising:

i) forming a layer (SA layer) comprising a material suitable for self-assembly (SA material) on a top surface of a hybrid pre-pattern, and optionally forming a topcoat over the SA layer, wherein the SA material is capable of self-assembling to form a phase separated lamellar domain pattern having a characteristic pitch Lo, the pre-pattern is disposed on a substrate, the top surface of the pre-pattern has a geometrical major axis, the top surface of the pre-pattern comprises a) independent elevated surfaces interspersed with adjacent recessed surfaces and b) sidewalls joining elevated surfaces to recessed surfaces, material underlying the elevated surfaces of the pre-pattern has greater etch-resistance in a given etch process than material underlying the recessed surfaces of the pre-pattern, a given elevated surface has a width $W_E$ defined as the length of the given elevated surface in a direction perpendicular to the major axis, a given adjacent recessed surface has a width $W_R$ defined as the length of the recessed surface in a direction perpendicular to the major axis, $W_R+W_E$ for each pair of adjacent recessed and elevated surfaces is an independent sum having a value of about nLo (n times Lo), wherein n is an integer of 2 to about 30, $W_E$ of at least one of the elevated surfaces is greater than about 2 Lo, $W_R$ of at least one of the recessed surfaces is greater than about 2 Lo, each of the sidewalls independently has a height $H_N$ of about 0.1 Lo to about 2 Lo, the SA layer contacts the elevated surfaces, recessed surfaces, and sidewalls of the pre-pattern, and the SA layer has a top surface in contact with an atmosphere interface and/or a topcoat;

ii) allowing or inducing the SA material to self-assemble, thereby forming a first self-assembled SA layer comprising a first lamellar domain pattern;

iii) selectively removing the first self-assembled SA layer, thereby forming a modified pre-pattern comprising a modified top surface, wherein the modified top surface has a geometrical major axis, the modified top surface comprises a) independent modified elevated surfaces interspersed with adjacent modified recessed surfaces and b) modified sidewalls joining modified elevated surfaces to modified recessed surfaces, iv) disposing a second SA layer of the SA material on the modified top surface;

v) allowing or inducing the second SA layer to self-assemble, thereby forming a second self-assembled SA layer comprising a second lamellar domain pattern comprising fewer defects associated with the self-assembled domains compared to the first lamellar domain pattern, wherein the modified elevated surfaces are neutral wetting to the domains of the second lamellar domain pattern, each of the modified elevated surfaces contacts at least one of the lamellae of each of the domains of the second lamellar domain pattern, and each of the lamellae in contact with a given modified elevated surface of the modified pre-pattern a) is oriented perpendicular to the given modified elevated surface, b) is in contact with the atmosphere interface or the topcoat above the given modified elevated surface, and c) is aligned along the major axis of the modified pre-pattern, iii) selectively removing one of the domains of the second lamellar domain pattern using an etch process, thereby forming an etched domain pattern comprising a remaining domain; and iv) selectively transferring the etched domain pattern into the material having greater etch-resistance below the elevated surfaces of the modified pre-pattern, thereby forming a transfer pattern.

Also disclosed is a layered structure, comprising:

a hybrid pre-pattern disposed on a substrate, the pre-pattern comprising a top surface having a geometrical major axis;

wherein the layered structure is suitable for forming a semiconductor device by directed self-assembly of a given self-assembly layer (given SA layer) disposed on the top surface of the pre-pattern, wherein the given SA layer has a top surface in contact with an atmosphere interface and/or a topcoat, and the SA layer comprises a given self-assembly material (given SA material) capable of forming a phase separated lamellar domain pattern having a characteristic pitch Lo, the top surface of the pre-pattern comprises a) independent elevated surfaces interspersed with adjacent recessed surfaces and b) sidewalls joining elevated surfaces to recessed surfaces, material underlying the elevated surfaces of the pre-pattern has greater etch-resistance in a given etch process than material underlying the recessed surfaces of the pre-pattern, a given elevated surface has a width $W_E$ defined as the length of the given elevated surface in a direction perpendicular to the major axis, a given adjacent recessed surface has a width $W_R$ defined as the length of the recessed surface in a direction perpendicular to the major axis, $W_R+W_E$ for each pair of adjacent recessed and elevated surfaces is an independent sum having a value of about an integer multiple of Lo, wherein the integer is 2 to about 30, $W_R$ of at least one of the recessed surfaces is greater than about 2 Lo, $W_E$ of at least one of the recessed surfaces is greater than about 2 Lo, and each of the sidewalls independently has a height $H_N$ of about 0.1 Lo to about 2 Lo, and the domain pattern formed by the given SA layer comprises alternating lamellar domains comprising respective chemically distinct components of the given SA material, each of the domains comprising a plurality of lamellae, wherein the elevated surfaces are neutral wetting to the domains of the self-assembled given SA layer, each of the elevated surfaces contacts at least one of the lamellae of each of the domains of the self-assembled given SA layer, each of the lamellae in contact with a given elevated surface of the pre-pattern a) is oriented perpendicular to the given elevated surface, b) is in contact with the atmosphere interface and/or topcoat above the given elevated surface, and c) is aligned along the major axis of the pre-pattern.

Further disclosed is a method of forming a hybrid pre-pattern, comprising:

selecting a self-assembly material (SA material) capable of self-assembling to form a phase separated lamellar domain pattern comprising lamellar domains having a characteristic pitch Lo;

forming a underlayer disposed on a substrate;

forming a topographical resist pattern disposed on the underlayer, the resist pattern comprising resist features separated by trenches having bottom surfaces comprising material of the underlayer;

selectively removing material below the bottom surfaces of the trenches, thereby forming a second topographic pattern, the second topographic pattern comprising trenches having a bottom surface comprising material of the substrate;

removing the resist pattern from the second topographic pattern, thereby forming the hybrid pre-pattern;

wherein the hybrid pre-pattern has a top surface and a geometrical major axis at the top surface, the top surface of the pre-pattern comprises a) independent elevated surfaces comprising underlayer material interspersed with adjacent recessed surfaces comprising substrate material and b) sidewalls joining elevated surfaces to recessed surfaces, the elevated surfaces are neutral wetting to the domains, the recessed surfaces and sidewalls are non-neutral wetting to the domains, material underlying the elevated surfaces of the pre-pattern has greater etch-resistance in a given etch process than material underlying the recessed surfaces of the pre-pattern, elevated surfaces of the pre-pattern have independent widths $W_E$ defined as the length of the given elevated surface in a direction perpendicular to the major axis, recessed surfaces of the pre-pattern have independent widths $W_R$ defined as the length of the recessed surface in a direction perpendicular to the major axis, $W_E+W_R$ of a given pair of adjacent elevated and recessed surfaces has a value of about an integer multiple of Lo, wherein the integer is 2 to about 30, $W_E$ of at least one of the elevated surfaces is greater than about 2 Lo, $W_R$ of at least one of the recessed surfaces is greater than about 2 Lo, the sidewalls have a height $H_N$ of about 0.1 Lo to about 2 Lo, and a self-assembly layer (SA layer), comprising the SA material that is disposed on the top surface of the pre-pattern and having a top surface in contact with an atmosphere interface and/or a topcoat, is capable of self-assembling to form the lamellar domain pattern, the domain pattern comprising alternating domains comprising respective chemically distinct components of the SA material, each of the domains comprising a plurality of lamellae, wherein each of the elevated surfaces contacts at least one of the lamellae of each of the domains, and each of the lamellae in contact with a given elevated surface of the pre-pattern a) is oriented perpendicular to the given elevated surface, b) is in contact with an atmosphere interface above the given elevated surface, and c) is aligned along the major axis of the pre-pattern.

Another method of forming a hybrid pre-pattern is disclosed, comprising:

selecting a self-assembly material (SA material) capable of self-assembling to form a phase separated lamellar domain pattern comprising lamellar domains having a characteristic pitch Lo;

forming a underlayer disposed on a substrate, wherein the underlayer is non-neutral wetting to the domains;

forming a topographical resist pattern disposed on the underlayer, the resist pattern comprising resist features separated by trenches having bottom surfaces comprising material of the underlayer;

treating top surfaces of the resist features with a material that is neutral wetting to the domains (neutralization material), thereby forming the hybrid pre-pattern;

wherein the pre-pattern has a top surface and a geometrical major axis at the top surface, the top surface of the pre-pattern comprises a) independent elevated surfaces comprising resist and neutralization material interspersed with adjacent recessed surfaces comprising underlayer material b) sidewalls joining elevated surfaces to recessed surfaces, the elevated surfaces are neutral wetting to the domains, the recessed surfaces and sidewalls are non-neutral wetting to the domains, material underlying the elevated surfaces of the pre-pattern has greater etch-resistance in a given etch process than material underlying the recessed surfaces of the pre-pattern, elevated surfaces of the pre-pattern have independent widths $W_E$ defined as the length of the given elevated surface in a direction perpendicular to the major axis, recessed surfaces of the pre-pattern have independent widths $W_R$ defined as the length of the recessed surface in a direction perpendicular to the major axis, $W_E+W_R$ of a given pair of adjacent elevated and recessed surfaces has a value of about an integer multiple of Lo, wherein the integer is 2 to about 30, $W_E$ of at least one of the elevated surfaces is greater than about 2 Lo, $W_R$ of at least one of the recessed surfaces is greater than about 2 Lo, the sidewalls have a height $H_N$ of about 0.1 Lo to about 2 Lo, a self-assembly layer (SA layer), comprising the given SA material, which is disposed on the top surface of the pre-pattern and has a top surface in contact with an atmosphere interface, is capable of self-assembling to form the lamellar domain pattern, the domain pattern comprising alternating domains comprising respective chemically distinct components of the SA material, each of the domains comprising a plurality of lamellae, wherein each of the elevated surfaces contacts at least one of the lamellae of each of the domains, and each of the lamellae in contact with a given elevated surface of the pre-pattern a) is oriented perpendicular to the given elevated surface, b) is in contact with an atmosphere interface above the given elevated surface, and c) is aligned along the major axis of the pre-pattern.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 2A-2E are cross-sectional layer diagrams showing a process of forming a self-aligned customized transfer pattern using a hybrid pre-pattern.

FIGS. 4A-4C are cross-sectional layer diagrams illustrating Method 2 of forming a hybrid pre-pattern using a backfill layer.

FIGS. 7A-7B are cross-sectional layer diagrams illustrating Method 5 of forming a hybrid pre-pattern using surface modification of a resist.

FIG. 11A: 5 polystyrene (PS) lines are aligned on the elevated stripes on top of the SiARC stripes and 3 PS lines are aligned on the recessed stripe. FIG. 11B: 6 PS lines are aligned on the elevated stripes on top of SiARC, and 2 PS lines are on the recessed stripes. FIG. 11C: 4 PS lines aligned on the elevated stripes on top of SiARC, and 4 PS lines are on the recessed stripes.

DETAILED DESCRIPTION

Figure 1A:
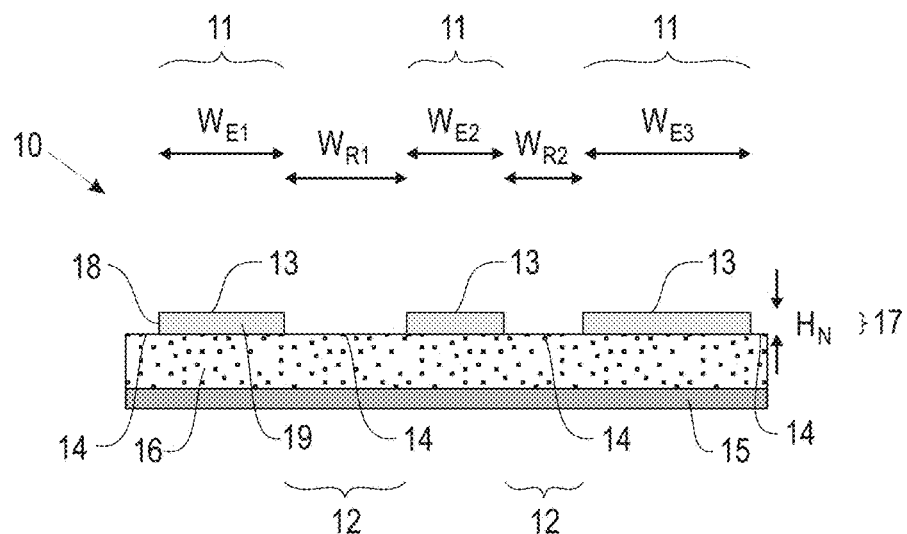
FIG. 1A is a cross-sectional diagram representing an exemplary 3-layered hybrid pre-pattern.

Disclosed are hybrid pre-patterns for forming customized lithographic array patterns using directed self-assembly (DSA). The top surface of a hybrid pre-pattern (referred to as "pre-pattern") has a geometric major axis. The top surface comprises independent elevated surfaces interspersed with adjacent recessed surfaces, and sidewalls of height $H_N$ joining the recessed surfaces to the elevated surfaces. The materials underlying the elevated surfaces have higher etch resistance compared to materials underlying the recessed surfaces of the pre-pattern in a given etch process. The surface properties of the elevated and recessed surfaces can differ, described in more detail below. A self-assembly layer (SA layer) comprising an SA material (e.g., block copolymer) capable of forming lamellar domains is disposed on the top surface of the pre-pattern. That is, the SA layer has a thickness greater than $H_N$ and contacts the elevated surfaces, recessed surfaces, and sidewalls of the pre-pattern. Self-assembly forms a lamellar domain pattern in which the lamellae over the elevated surfaces of the pre-pattern are oriented perpendicular relative to the main plane of the elevated surface and are aligned along the major axis of the pre-pattern. The lamellae over the recessed surfaces can have perpendicular orientation and/or a parallel orientation relative to the main plane of the recessed surface. Preferably, the sidewalls contact one domain after self-assembly. The topology and surface properties of the pre-pattern influences the self-assembly of the SA material and the global alignment of the domains. The etch contrast between underlying materials of the elevated and recessed surfaces allows for the formation of customized transfer patterns to be prepared (e.g., unidirectional line-space arrays, two-dimensional patterns). Methods of forming and utilizing the hybrid pre-patterns are also disclosed.

An "SA material" is a material capable of self-assembling into compositionally different phase-separated domains. The SA material preferably comprises a block copolymer (BCP). Non-limiting block copolymers include diblock and triblock copolymers. An "SA layer" is a layer comprising an SA material. The SA layer is disposed on the top surface of the pre-pattern and contacts the elevated surfaces, recessed surfaces, and sidewalls of the pre-pattern. In general, the SA layer can have a thickness of about 5 nm to about 500 nm over the elevated surfaces, more specifically about 20 nm to about 50 nm.

The term "pre-pattern" refers to the collection of surfaces on which the SA layer is disposed for self-assembly. The elevated surfaces, recessed surfaces, and sidewalls of the top surface of the pre-pattern have contact with the SA layer. The SA layer also has a top surface in contact with an atmosphere.

Optionally, a topcoat layer can be applied to the top surface of the SA layer prior to self-assembly for orientation control of the domains formed by self-assembly. Alternatively, a topcoat layer can be formed by self-assembly of the SA layer (i.e., the SA layer comprises an embedded topcoat). In this instance, a component of the SA layer phase separates to form a separate and discrete layer at the atmosphere interface of the SA layer, thereby forming a topcoat layer disposed on other phase separated domains of the self-assembled SA layer. The topcoat can be any material that allows self-assembly of the SA layer to form perpendicular oriented domains in contact with, and above, the elevated surfaces of the pre-pattern.

A "graphoepitaxial pre-pattern" is a pre-pattern in which topography and surface properties influence self-assembly. A "chemical pre-pattern" is a pre-pattern in which self-assembly is predominantly influenced by surface properties. No sharp dimensional limits exist between these two pre-pattern categories because the extent of topographical influence on self-assembly is also dependent on the thickness of the SA layer in relation to the underlying relief surface. In general, however, when graphoepitaxial pre-patterns are used, the thickness of the SA layer is typically less than or about equal to the trench height of the underlying pre-pattern. For chemical pre-patterns, the SA layer thickness is greater than any trench height of the underlying topography. The hybrid pre-pattern is used as a chemical pre-pattern (the thickness of the SA layer exceeds the highest sidewall height of the pre-pattern), yet has underlying topography that influences and guides self-assembly. In addition, typical DSA is supported by an underlying pre-pattern with a relatively uniform etch resistivity. Contrary to typical pre-patterns for DSA, the hybrid pre-patterns have significant etch contrast between elevated and recessed surfaces (e.g., etch contrast between inorganic versus organic materials). For this reason, the use of the term "hybrid" is used to describe the pre-pattern.

Self-assembly can occur spontaneously upon formation of the SA layer or can be induced (e.g., by thermal annealing and/or solvent vapor annealing the SA layer).

A block copolymer for self-assembly comprises at least two blocks that are immiscible with each other. Self-assembly of the block copolymer occurs by phase separation of the blocks to form a pattern of segregated solid phase domains. As an example, self-assembly of a diblock copolymer produces a domain pattern comprising a first domain containing substantially a first block A of the diblock copolymer and a second domain containing substantially a second block B of the diblock copolymer. In this instance, the first and second domains are linked by the covalent bond joining block A to block B of the block copolymer.

Herein, a surface or an interface is said to be "neutral" to an SA material, or "neutral wetting" to an SA material, if each domain of the self-assembled SA material can wet the surface or the interface (i.e., each domain contacts the surface or the interface after self-assembly). Otherwise, the surface or interface is said to be "non-neutral" to the SA material. Elevated surfaces of the pre-pattern are neutral to the SA material. Recessed surfaces of the pre-pattern can be neutral or non-neutral to the SA material, with the proviso that the wetting properties of the recessed surfaces do not adversely affect formation of perpendicular oriented domains on the elevated surfaces. The sidewalls of the pre-pattern are preferably non-neutral surfaces. In an embodiment, the sidewalls of the pre-pattern contact one domain of the self-assembled SA material. Depending on the intended ultimate transfer pattern, the domains formed over respective recessed surfaces can have perpendicular orientation, parallel orientation, or a combination thereof relative to the plane of the respective underlying recessed surfaces (or the plane of the bottom layer of the substrate).

A surface is said to have a "preferential affinity for" or is "preferential to" a referenced domain of a self-assembled SA material if the referenced domain can wet the surface in preference to another domain of the self-assembled SA material. Otherwise, the surface is said to be "non-preferential" to the domains of the SA material. The elevated surfaces are non-preferential to the domains of the self-assembled SA material. In an embodiment, the recessed surfaces and sidewalls have a preferential affinity for one of the domains of the self-assembled SA material.

Herein, any material of the hybrid pre-pattern that contacts the bottom surface of the SA layer is referred to generally as "underlayer material". A layer in contact with the bottom of the SA layer is an "underlayer" (UL). The underlayer material of the elevated surfaces in contact with the SA layer is a first underlayer material. The underlayer material of the recessed surfaces in contact with the SA layer is a second underlayer material. The underlayer material of the sidewalls in contact with the SA layer can be a third underlayer material. The bulk material of an underlayer can be neutral or non-neutral wetting to the SA material. A non-neutral underlayer (UL) is an underlayer whose bulk material has non-neutral wetting properties to the domains of the self-assembled SA material. A non-neutral underlayer (UL) is an underlayer whose bulk material has neutral wetting properties to the domains of the self-assembled SA material. Regardless of the wetting properties of the bulk material used to form a given underlayer, the various processes used in preparing the hybrid pre-patterns result in elevated surfaces of the pre-pattern that are neutral wetting to the SA material, recessed surfaces that are neutral or non-neutral wetting to the SA material, and sidewalls that are preferably non-neutral wetting to the SA material. The elevated surfaces, recessed surfaces, and sidewalls of the pre-pattern can include residual resist materials, backfill materials, surface modification materials, and/or trace amounts of materials including small molecules left on the elevated surfaces after various processes. These surfaces can also include residual SA material left on the elevated surfaces, recessed surfaces, and sidewalls after stripping a first-formed domain pattern of the SA material.

Herein, the atmosphere interface and/or topcoat in contact with the self-assembled SA layer supports perpendicular orientation of domains over the elevated surfaces. Each of the lamellae over the elevated surfaces contacts the respective elevated surfaces and atmosphere and/or topcoat.

Herein, the term "substrate" refers to an initial stack of layered materials used to construct the pre-pattern surfaces. The substrate can comprise one or more layers of materials arranged in a stack. The elevated features of the top surface of the pre-pattern can encompass one or more layers. As non-limiting examples, the substrate can include a silicon wafer or a metal foil as a bottom layer, a hard mask layer, a dielectric layer, metal oxide layer, silicon oxide layer, and/or an anti-reflection layer (ARC). Generally, the substrate is the initial stack comprising a silicon wafer and any other layers used to prepare a hybrid pre-pattern. For clarity, the substrate in the figures described below is the initial stack on which an underlayer (e.g., neutral UL or non-neutral UL) is disposed as a first step in preparing a hybrid pre-pattern.

The term "disposed" refers to a layer in contact with a surface of another layer. "Disposing" or "applying" refer to forming a layer to be in contact with a surface of another layer, without limitation as to the method employed as long as the desirable characteristics of the disposed or applied layer are obtained, such as uniformity and thickness.

The term "casting" refers to forming a layer of a material by disposing on a surface a solution of the material dissolved in a solvent, and removing the solvent.

Random copolymers are indicated by "-co-", or "-r-" in the name. Block copolymers are indicated by "-b-" or "-block-" in the name. Alternating block copolymers are indicated by "-alt-" in the name.

Herein, the term "interface" refers to a contact boundary between two substantially immiscible phases. Each phase can, independently, be a solid, a liquid, or a gas.

Herein, self-assembly of the SA material preferably forms a domain pattern comprising alternating domains that comprise chemically distinct components of the SA material (e.g., each domain can comprise a block of a diblock copolymer). Preferably, the domains have a lamellar (i.e., thin plate or ribbon structure) or cylindrical morphology. Each lamellar domain can have a plurality of lamellae. The lamellar or cylindrical domains can have parallel or perpendicular orientation to the main plane of the underlying surface, or to the bottom layer of the substrate. A lamella has a parallel orientation when the main plane of the lamella is oriented parallel to the main plane of the underlying surface, or to the bottom layer of the substrate. A lamella has a perpendicular orientation when the main plane of the lamella is oriented perpendicular to the main plane of the underlying surface, or to the bottom layer of the substrate. A cylindrical domain has a parallel orientation when the main cylinder axis is oriented parallel to the plane of the underlying surface, or to the bottom layer of the substrate. A cylindrical domain has a perpendicular orientation when the cylinder axis is oriented perpendicular to the plane of the underlying surface, or to the bottom layer of the substrate.

Perpendicular orientation of lamellar domains is desirable for forming high resolution line patterns by selective etching of a given lamellar domain. In general, parallel orientation is not desirable for forming high resolution line patterns. The hybrid pre-pattern allows self-assembly of the SA layer to produce a domain pattern wherein portions of the SA layer over the elevated surfaces consist essentially of perpendicularly oriented lamellae disposed on the elevated surfaces, and portions of the SA layer over the recessed surfaces comprise parallel and/or perpendicularly oriented lamellae. In an embodiment, self-assembly of the SA layer produces perpendicularly oriented domains over the elevated and recessed surfaces of the pre-pattern having long range alignment.

The examples further below utilize the hybrid pre-pattern in the manner of a chemical pre-pattern (i.e., the thickness of the SA layer over the recessed surfaces is greater than the trench height (sidewall height) of the underlying topography). The SA layer resides on and above the elevated and recessed surfaces of the pre-pattern and contacts the elevated surfaces, recessed surfaces, and sidewalls. The topography and surface properties of the hybrid pre-pattern guide global alignment of the domains formed by self-assembly.

Summarizing with respect to the elevated surfaces, the elevated surfaces of the hybrid pre-pattern are neutral to the SA material. The materials underlying the elevated surfaces of the pre-pattern have higher etch resistivity compared to the materials underlying the recessed surfaces of the pre-pattern. The elevated surfaces can independently have different widths $W_E$, where $W_E$ is the length of the elevated surface perpendicular to the major axis of the pre-pattern. The portion of the self-assembled SA layer that is disposed on the elevated surfaces consists essentially of domains (preferably lamellar domains) having a perpendicular orientation relative to the main plane of the elevated surface, or to the bottom layer of the substrate. Each of the domains is in contact with the elevated surface and the atmosphere interface (and/or a topcoat) at the top of the SA layer. In addition, the domains are aligned to the major axis of pre-pattern.

Summarizing with respect to the recessed surfaces, the recessed surfaces of the hybrid pre-pattern can be neutral or non-neutral to the SA material with the above state proviso. In an embodiment, the recessed surfaces have a preferential affinity for one domain of the self-assembled SA material. The materials underlying the recessed surfaces of the pre-pattern have lower etch resistivity compared to the materials underlying the elevated surfaces of the pre-pattern. The recessed surfaces can independently have different widths $W_R$. $W_R$ is the length of the recessed surface perpendicular to the major axis of the pre-pattern. The portion of the self-assembled SA layer over the recessed surfaces can comprise domains (preferably lamellar domains) having a parallel and/or perpendicular orientation relative to the main plane of the recessed surface, or to the bottom layer of the substrate. One or more of the domains can be in contact with the recessed surfaces and/or the atmosphere interface (and/or topcoat) at the top of the SA layer. The portion of the self-assembled SA layer disposed on the recessed surfaces can contain zero or more parallel domains depending on the width and the surface properties of the recessed surfaces, the SA layer thickness, and the surface properties of sidewalls of the pre-pattern.

Summarizing with respect to the sidewalls, the sidewalls of the hybrid pre-pattern are preferably non-neutral to the SA material, with the above stated proviso. The sidewalls have height $H_N$ of at least 0.1 Lo. In an embodiment, the sidewalls have a preferential affinity for one domain of the self-assembled SA material. In another embodiment, the sidewalls contact one domain after self-assembly, and the domain has a perpendicular orientation relative to the respective underlying recessed surfaces.

With respect to an adjacent pair of elevated and recessed surfaces, the sum of the widths can have a value about equal to an integer multiple of Lo, the periodicity (characteristic pitch) of the domain pattern. Thus, $W_E+W_R$ is about equal to nLo (n times Lo) for adjacent elevated and recessed surfaces, where n is an integer of 2 to about 30.

The combination of surface properties, in-plane geometry, and topography (elevated surfaces, recessed surfaces and sidewalls) direct self-assembly of the SA material over the hybrid pre-pattern. The preferential affinity of the sidewalls to a particular domain can promote alignment of the domains along the sidewalls. The neutral elevated surfaces support the perpendicular orientation of the domains in contact with the elevated surfaces. The global alignment of domains is achieved by maintaining the in-plane dimensionality of the pre-pattern across the major axis direction (i.e., $W_E+W_R=nLo$ where n is a positive integer for adjacent elevated and recessed surfaces) in combination with the topography and surface properties of the pre-pattern surfaces.

sidewalls, and parallel lamellae formed over the central portion of the recessed surfaces ($W_E+W_R=8$ Lo for adjacent elevated and recessed surfaces, SEM images of $W_E\sim2$ Lo, 3 Lo, and 4 Lo). Each region of the lamellar pattern over the elevated and recessed surfaces displays long range alignment.

The following discussion is focused on lamellar domain patterns but applies also to cylindrical domain patterns. For illustration purposes, the SA material is a diblock copolymer capable of self-assembly. It should be understood that the layer diagrams of the figures and schemes below are not drawn to scale or meant to be limiting with respect to the possible structures that can be produced using the below-described processes. The diagrams are intended for illustration purposes.

Without being bound by theory, Scheme 1 is a schematic representation of parallel oriented lamellar domains of a self-assembled diblock copolymer. In this instance the main plane of each lamellar domain is parallel to the plane of the underlayer surface.

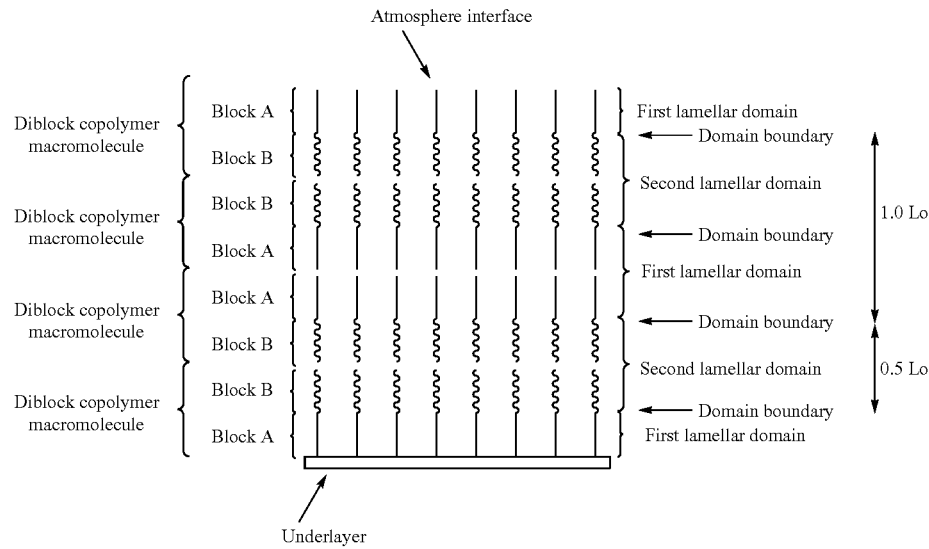

Scheme 1.

FIG. 2B, described in more detail below, illustrates an embodiment where the self-assembled SA layer contains perpendicularly oriented lamellae over the elevated and recessed surfaces. The perpendicular lamellae over the elevated surfaces are in contact with the elevated surfaces and the atmosphere interface at the top surface of the SA layer. The perpendicularly oriented lamellae over the recessed surfaces are disposed on a thin layer of one domain (parallel domain) in contact with the recessed surfaces. In this case, each of the domains of the self-assembled SA material over the recessed surface contacts the atmosphere interface, but only one domain contacts the recessed surface. From a top-down view, the perpendicularly oriented domain pattern can appear as a uniform unidirectional lamellar domain pattern extending throughout the SA layer (e.g., as a large scale linear array pattern).

Figure 8:
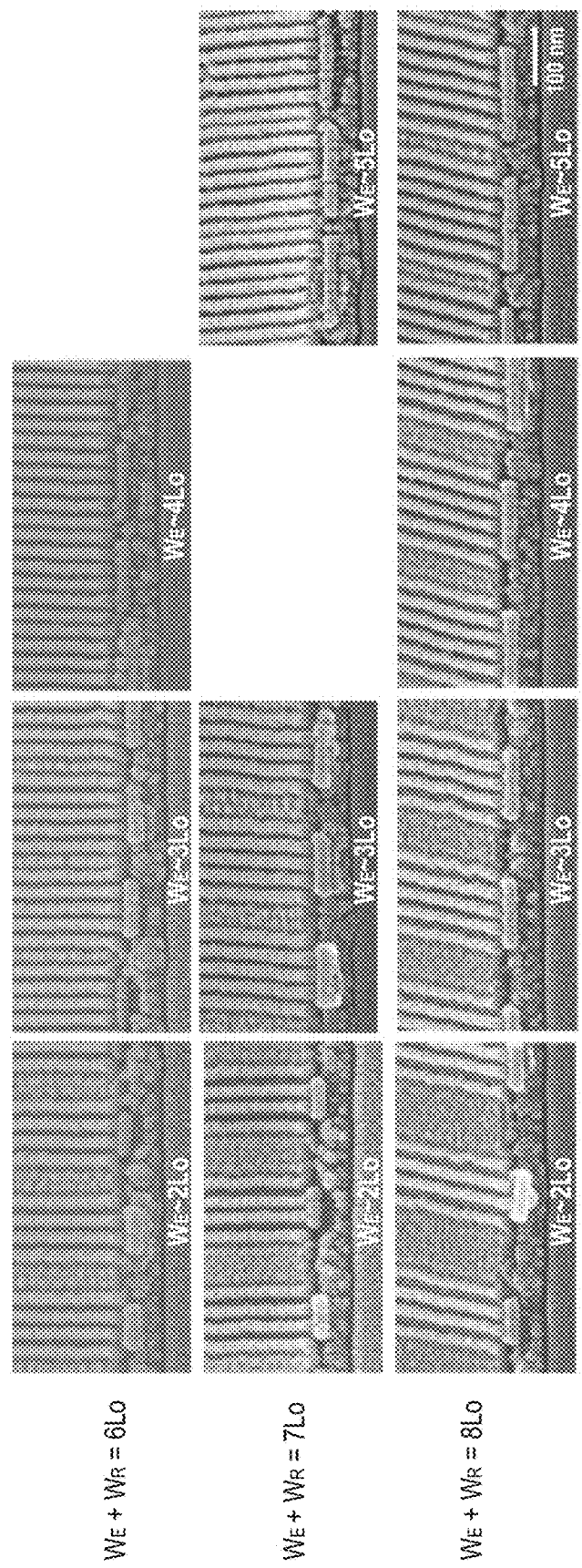
FIG. 8 is a series of cross-sectional scanning electron micrograph (SEM) images showing good directed self-assembly (DSA) over hybrid pre-patterns of Example 1 having various width combinations of elevated surfaces ($W_E$) and recessed surfaces ($W_R$). The hybrid pre-pattern of Example 1 was prepared by the backfill process (Method 2). $W_E$ and $W_R$ were varied by integral multiples of the bulk periodicity, Lo, of the block copolymer, at different values of $W_E+W_R=6$ Lo, 7 Lo, and 8 Lo. Good DSA was observed for $W_E$ having a value of about 2 Lo to about 5 Lo.

As another example, FIG. 8 shows perpendicular lamellae formed over the elevated surfaces and adjacent to the Scheme 1 shows the arrangement of blocks A and B of a diblock copolymer after self-assembly of the diblock copolymer on an underlayer having a non-neutral surface that is preferential to block A. In this example, the atmosphere interface is also preferential to block A. The first lamellar domain comprises block A and the second lamellar domain comprises block B. The periodicity, Lo, of the domains is indicated by 1.0 Lo (one times Lo, Lo=1.0 Lo). For lamellar domains, the thickness of a lamellar domain is approximately 0.5 Lo. The individual diblock copolymer macromolecules, domain boundaries, and 0.5 Lo are also indicated. In this example, the underlayer surface has contact only with block A of the self-assembled diblock copolymer. It should be understood that within a given lamellar domain (e.g., the second lamellar domain of Scheme 1) blocks from different polymer macromolecules (e.g., B blocks) can be arranged end-to-end (shown) and/or interwoven (not shown). Each block can have a backbone that is rigid, non-rigid, or of intermediate rigidity. Each block can have any suitable coiling, rotational and/or flexural capability.

Without being bound by theory, Scheme 2 is a schematic representation of perpendicularly oriented lamellar domains of a self-assembled block copolymer on an underlayer having a neutral surface. The main plane of each lamellar domain is perpendicular to the plane of the underlayer (or the bottom layer of the substrate, not shown).

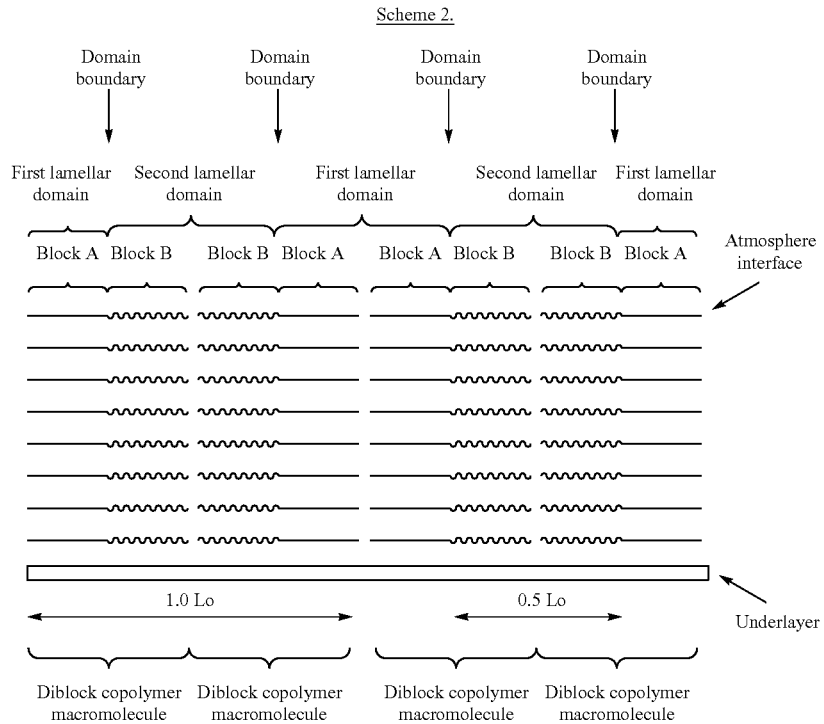

In this example, each lamellar domain contacts the atmosphere interface (and/or topcoat interface, not shown) and underlayer surface. The bulk periodicity, 1.0 Lo, is indicated, as well as 0.5 Lo. In this example, the underlayer surface contacts block A and block B of the self-assembled diblock copolymer.

The atmosphere interface is typically not neutral wetting to a block copolymer for self-assembly. Nevertheless, the inventive hybrid pre-patterns can in some instances provide perpendicular orientation of lamellar domains over the elevated surfaces, and optionally the recessed surfaces, without the use of a neutral topcoat.

The lamellar domain patterns can have a periodicity, Lo, in the range of about 4 nm to about 80 nm, which is useful for producing line features having a half-pitch of about 2 nm to about 40 nm, respectively, more particularly about 5 nm to about 30 nm.

Hybrid Pre-Patterns

The hybrid pre-patterns comprise two or more layers. The hybrid pre-patterns have a topographical top surface comprising elevated features and recessed features. The elevated features comprise elevated surfaces. The recessed features comprise recessed surfaces bounded by sidewalls. The elevated surfaces are neutral to a given SA material. The recessed surfaces can be neutral or non-neutral, with the above proviso. The sidewalls are preferably non-neutral to the SA material. The combination of elevated surfaces, recessed surfaces and sidewalls directs self-assembly.

Figure 1B:
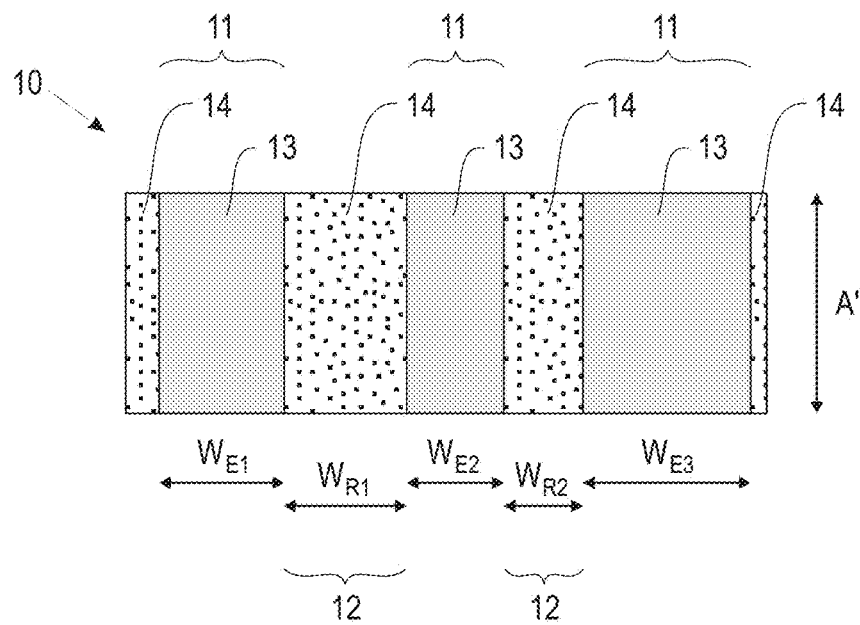
FIG. 1B is a top-down view of the hybrid pre-pattern of FIG. 1A.

FIG. 1A is a cross-sectional diagram of a non-limiting exemplary 3-layered hybrid pre-pattern 10 comprising a first layer 15 (e.g., a silicon wafer), a second layer 16 (e.g., transfer layer), and a topographic layer 17 (e.g., inorganic hardmask layer). Topographic layer 17 comprises elevated features 11 comprising etch resistant material 19 interspersed with and adjacent to recessed features 12 (e.g., trenches). Elevated features 11 have elevated surfaces 13, which are neutral to a given SA material for self-assembly. Elevated surfaces 13 support perpendicular orientation of the self-assembled domains of the given SA material. The material below elevated surfaces 13 also has higher etch resistance in an etch process compared to the material below recessed surfaces 14. The etch process can be a wet and/or dry etch process. Elevated surfaces 11 can also have different widths represented by $W_{E1}$, $W_{E2}$, and $W_{E3}$, which is the length of a given elevated surface 11 in a direction perpendicular to the major axis 19 (FIG. 1B). Elevated features 11 can also comprise one or more layers of materials (not shown), which can be organic, inorganic, or combinations thereof Recessed features 12 have recessed surfaces 14 bounded by sidewalls 18 of height $H_N$. Recessed surfaces 14 can be neutral and/or non-neutral to the given SA material, with the above stated proviso (i.e., that the surface properties of recessed surfaces 12 do not adversely affect formation of perpendicularly oriented domains over elevated surfaces 13). Sidewalls 18 are preferably non-neutral to the SA material. In the case of strong affinity between one domain and recessed surfaces 14, recessed surfaces 14 can have contact substantially or exclusively with one of the domains of the SA material. In this instance, recessed surfaces 14 can support parallel orientation of the preferential domain in contact with recessed surfaces 14 (shown). In some cases, as will be shown below, lamellae of each of the domains that are in contact with the atmosphere interface (and/or topcoat, not shown) over the recessed surfaces can be oriented perpendicular to the underlying recessed surfaces. Sidewalls 18 can play a significant role in directing the alignment of the domains. Strong affinity between sidewalls and one domain can enhance the alignment of domains over the elevated and recessed surfaces. Material below recessed surfaces 14 also has less etch-resistance in an etch process compared to the material 19 below elevated surfaces 13. Recessed features 12 can also have different widths represented by $W_{R1}$ and $W_{R2}$, which is the length of a given recessed surface 13 in a direction perpendicular to the major axis A' (FIG. 1B).

The sum of the widths of a pair of adjacent elevated ($W_{Ei}$) and recessed ($W_{Ri}$) surfaces is an integral multiple of the characteristic pitch, Lo, of the SA material (e.g., block copolymer). That is, $W_{Ei}+W_{Ri}=n\times Lo$ (i.e., n times Lo, or nLo), where n is an integer having a value of 2 or more, 2 to about 30, 2 to about 20, or more specifically 2 to about 10. Subscript i is a number representing an index value denoting adjacency. At least one elevated surface 13 and at least one recessed surface 14 have respective widths greater than about 2.0 Lo. Sidewall height $H_N$ can be greater than or equal to about 0.1 Lo. More specifically, $H_N$ is about 0.1 Lo to about 2.0 Lo, more specifically about 0.2 Lo to about 2.0 Lo.

FIG. 1B is a top-down view of hybrid pre-pattern 10 showing major geometrical axis A', elevated features 11 having elevated surfaces 13, recessed features 12 having recessed surfaces 14, and widths $W_{E1}$, $W_{E2}$, $W_{E3}$, $W_{R1}$, and $W_{R2}$.

The top surface of the hybrid pre-pattern can comprise two or more regions differing in the value of $W_R$, $W_E$, $W_R+W_E$, or combinations thereof, with the proviso that $W_R+W_E$ is an integer multiple of Lo for adjacent elevated and recessed surfaces in each of the two or more regions. In an embodiment, the top surface of the hybrid pre-pattern comprises two or more regions along the major axis of the hybrid pre-pattern, and the two or more regions have different values of $W_R+W_E$ for adjacent elevated and recessed surfaces.

Figure 2C:
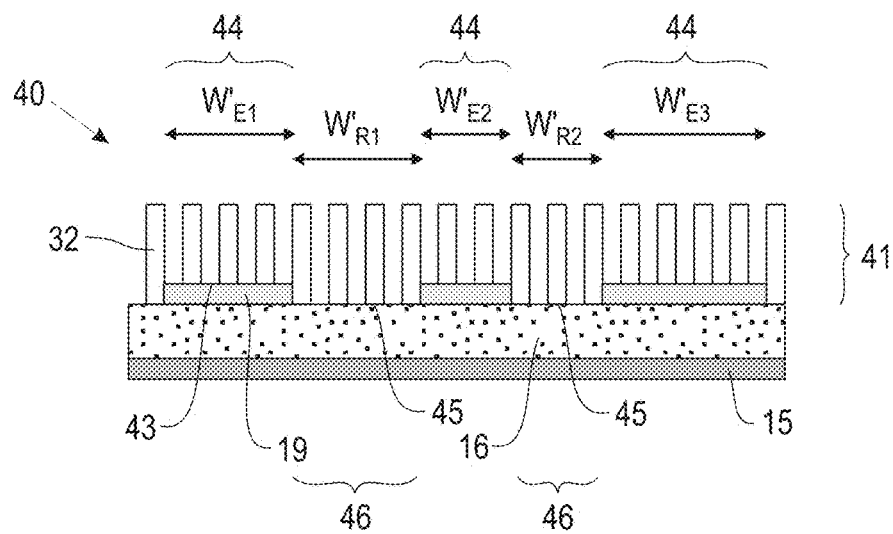

FIGS. 2A to 2D are cross-sectional layer diagrams showing an exemplary non-limiting process for making a transfer pattern having customized features using a hybrid pre-pattern. A solution comprising an SA material and a solvent is applied to the hybrid pre-pattern 10 of FIG. 1A (e.g., by spin coating) followed by removal of the solvent, forming (FIG. 2A). Structure 20 comprises SA layer 21 comprising SA material disposed on elevated surfaces 13 of elevated features 11 and on recessed surfaces 14 of recessed features 12. Elevated surfaces 13 are neutral wetting to the domains of the self-assembled SA material. In this example, recessed surfaces 14 and sidewalls 18 are non-neutral wetting to the domains of the self-assembled SA material. Sidewalls 18 have height $H_N$. Allowing or inducing SA layer 21 to self-assemble produces structure 30 (FIG. 2B). Structure 30 comprises a self-aligned lamellar domain pattern 31 of self-assembled SA material that extends over elevated surfaces 13 and recessed surfaces 14. $W_{Ei}+W_{Ri}=nLo$ (n times Lo) for a pair of adjacent elevated and recessed surfaces, where n is an integer of 2 to about 30, and i is an index number denoting adjacency.

Optionally, domain pattern 31 can be stripped from structure 30 (not shown) to form a modified hybrid pre-pattern. Applying a second layer of SA material to the top surface of the modified hybrid pre-pattern followed by self-assembly of the second layer can form a second lamellar domain pattern having perpendicularly oriented domains over the elevated surfaces. The second lamellar domain pattern can comprise fewer defects associated with the self-assembled domains compared to the initial lamellar domain pattern 31.

Lamellar domain pattern 31 comprises alternating first domain 32 and second domain 33. Each of first domain 32 and second domain 33 comprises a plurality of lamellae. First domain 32 and second domain 33 comprise chemically distinct components of the SA material (e.g., blocks of a block copolymer). Elevated surfaces 13 contact first domain 32 and second domain 33. The lamellae of each domain that are in contact with elevated surfaces 13 are oriented perpendicular to the main plane of elevated surfaces 13 (or to first layer 15, which is a bottom layer of the substrate). In this example, the lamellae of each domain that are in contact with atmosphere interface 34 over recessed surfaces 14 are oriented perpendicular to the respective underlying recessed surfaces 14. The perpendicularly oriented lamellae over elevated surfaces 13 and recessed surfaces 14 are aligned along the major axis (not shown) of the hybrid pre-pattern. The characteristic pitch Lo of the self-assembled SA material is also indicated in structure 30. In this example, recessed surfaces 14 and sidewalls 18 have contact substantially or exclusively with the material of first domain 32 due to strong preferential affinity of recessed surfaces 14 and sidewalls 18 for first domain 32 (shown). Therefore, first domain 32, can be in the form of a thin wetting layer on recessed surfaces 14, as shown in structure 30. In this example, second domain 33 has substantially no contact with the recessed surfaces 14. Sidewalls 18 aid in the alignment of the lamellar domain pattern 31 along the major axis of the pre-pattern.

Figure 2D:
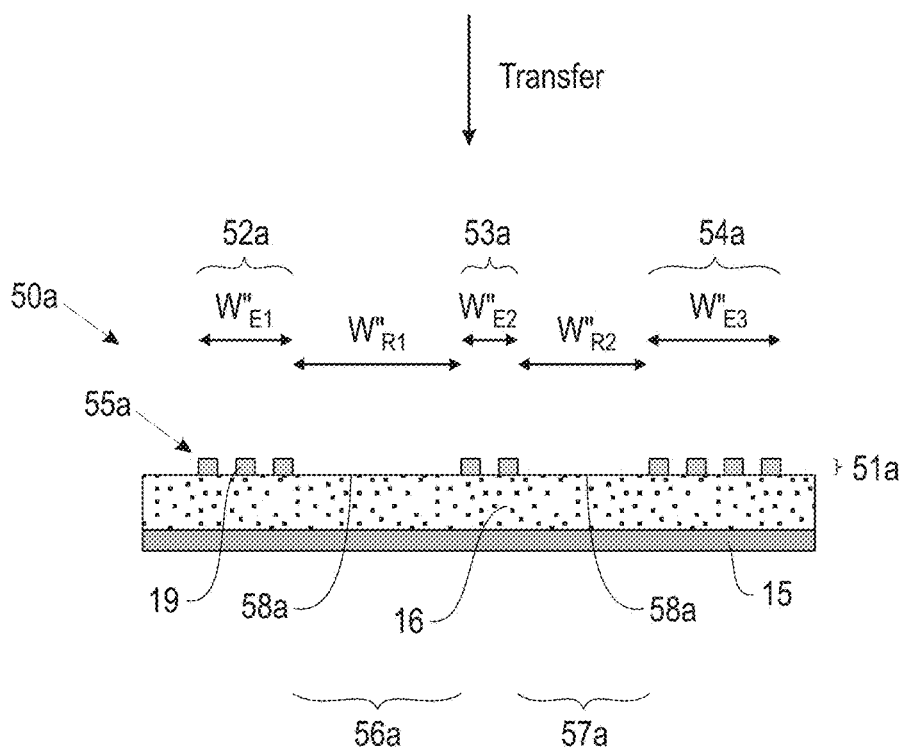

One of the domains has higher etch resistance in a given etch process, which can be a wet and/or a dry etch process. In this example, first domain 32 (e.g., domains comprising a poly(styrene) (PS) block of the BCP) have higher etch resistance compared to second domain 33 (e.g., domains comprising a poly(methyl methacrylate) (PMMA) block of the BCP). Therefore, the lamellae of second domain 33 can be selectively removed, leaving lamellae of first domain 32 as shown in structure 40 (FIG. 2C). Structure 40 comprises etched domain pattern 41 disposed on second layer 16. Etched domain pattern 41 comprises lamellae of first domain 32, which are disposed on elevated surfaces 43 and on recessed surfaces 45. It should be understood that recessed surfaces 45 can have a residual thin layer of first domain 32 disposed thereon (not shown). Depending on the etch conditions, elevated features 44 can have the same or different widths, as represented by $W'_{E1}$, $W'_{E2}$, and $W'_{E3}$, compared to elevated features 11. Likewise, recessed features 46 can have the same or different widths, as represented by $W'_{R1}$ and $W'_{R2}$, compared to recessed features 12. Recessed surfaces 45 can be top surfaces of second layer 16. Etched domain pattern 41 can then be transferred into the higher etch resistant materials underlying elevated surfaces 43 using a second etch process, thereby forming structure 50a (FIG. 2D). Structure 50a comprises a transfer pattern 51a comprising topographic transfer features 55a disposed on second layer 16. In this example, topographic transfer features 55a comprise etch resistant material 19. Transfer pattern 51a can also comprise residual portions of the lamellae of first domain 32 (not shown).

In this example, transfer pattern 51a has three customized features. Other customizable features are possible. A first customized feature is first array 52a comprising three transfer features 55a, formed by etching relief pattern 41 over elevated feature 44 of width $W'_{E1}$. Another customized feature is second array 53a comprising two transfer features 55a, formed by etching relief pattern 41 over elevated feature 44 of width $W'_{E2}$. Another customized feature is third array 54a comprising four transfer features 55a, formed by etching relief pattern 41 over elevated feature 44 of width $W'_{E3}$. First array 52a has a width of $W''_{E1}$, which is less than $W_{E1}$. Second array 53a has a width of $W''_{E2}$, which is less than $W'_{E2}$. Third array 54a has a width of $W''_{E3}$, which in this example is less than $W'_{E3}$. First array 52a is separated from second array 53a by spatial region 56a having width $W''_{R1}$, which in this example is greater than $W'_{R1}$. Second array 53a is separated from third array 54a by spatial region 57a having width $W''R_2$, which in this example is greater than $W'_{R2}$.

Figure 2E:
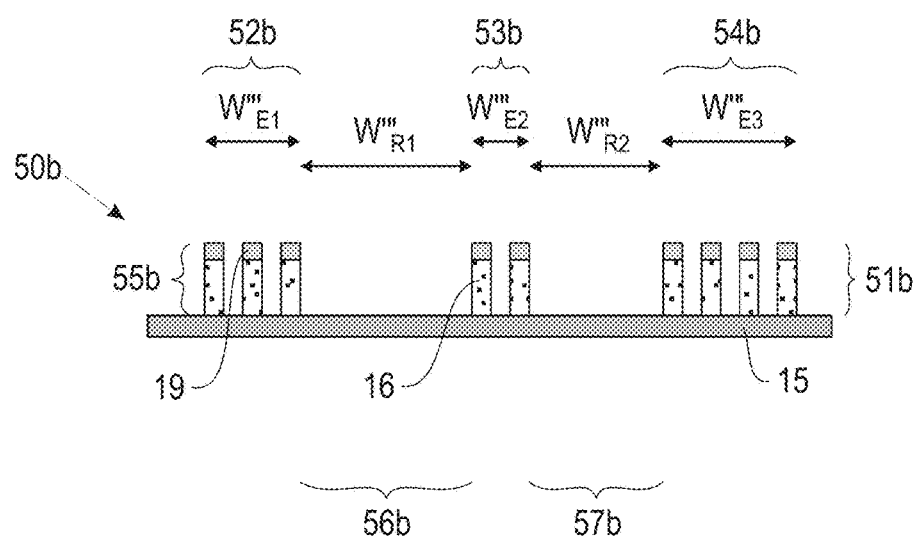

Optionally, transfer pattern 51a can be selectively transferred into one or more underlying layer(s) of the substrate using a third etch process, thereby forming structure 50b (FIG. 2E). In this example, structure 50b comprises a second transfer pattern 51b comprising topographic features 55b (e.g., pillars) disposed on first layer 15. In this example, topographic features 55b (shown as pillars) comprise residual etch resistant material 19 and material of second layer 16.

In this example, transfer pattern 51b has three customized features. Other customizable features are possible. A first customized feature is first array 52b comprising three topographic features 55b, formed by transferring first array 52a of width $W''_{E1}$ into second layer 16. Another customized feature is second array 53b comprising two topographic features 55b, formed by transferring second array 53a of width $W''_{E2}$ into second layer 16. Another customized feature is third array 54b comprising four topographic features 55b, formed by transferring third array 54a of width $W''_{E3}$ into second layer 16. First array 52b has a width of $W'''_{E1}$, which can be the substantially the same as $W''_{E1}$. Second array 53b has a width of $W'''_{E2}$, which can be the substantially the same as $W''_{E2}$. Third array 54b has a width of $W'''_{E3}$, which can be the substantially the same as $W''_{E3}$. First array 52b is separated from second array 53b by spatial region 56b having width $W'''_{R1}$, which can be the substantially the same as $W''_{R1}$. Second array 53b is separated from third array 54b by spatial region 57b having width $W'''_{R2}$, which can be the substantially the same as $W''_{R2}$.

Methods of Preparing Hybrid Pre-Patterns

Figure 3A:
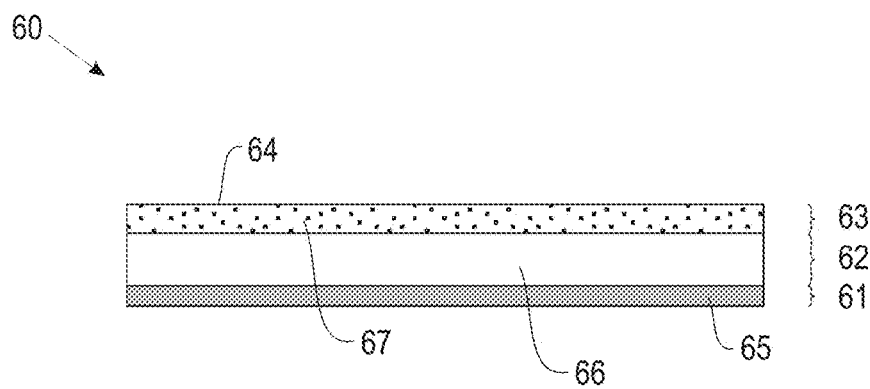
FIGS. 3A-3E are cross-sectional layer diagrams illustrating Method 1 (basic method) of forming a hybrid pre-pattern.

Several methods of preparing hybrid pre-patterns are described below. Each of the methods utilizes a three layer substrate 60 shown in FIG. 3A. Substrate 60 comprises a first layer 61 (e.g., Si wafer) comprising first material 65 (e.g., silicon, metal), also referred to as the bottom layer of the substrate, a second layer 62 (e.g., transfer layer (TL)) comprising second material 66 (e.g., silicon nitride ($SiN_x$), carbon film, spin-on carbon), and a third layer 63 (e.g., hard mask (HM)), comprising third material 67 (e.g., silicon oxide, metal oxide, anti-reflection coating such as SiARC and/or TiARC). Third layer 63 has surface 64.

Method 1

Figure 3B:
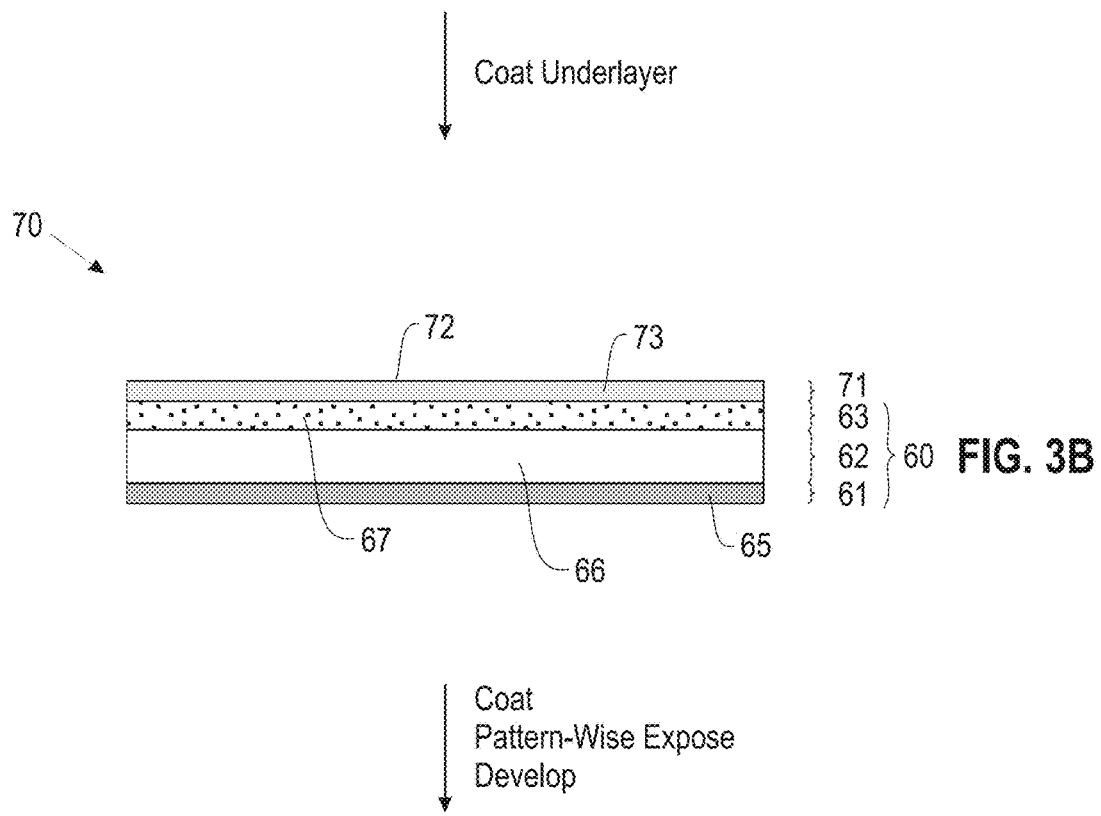
Figure 3C:
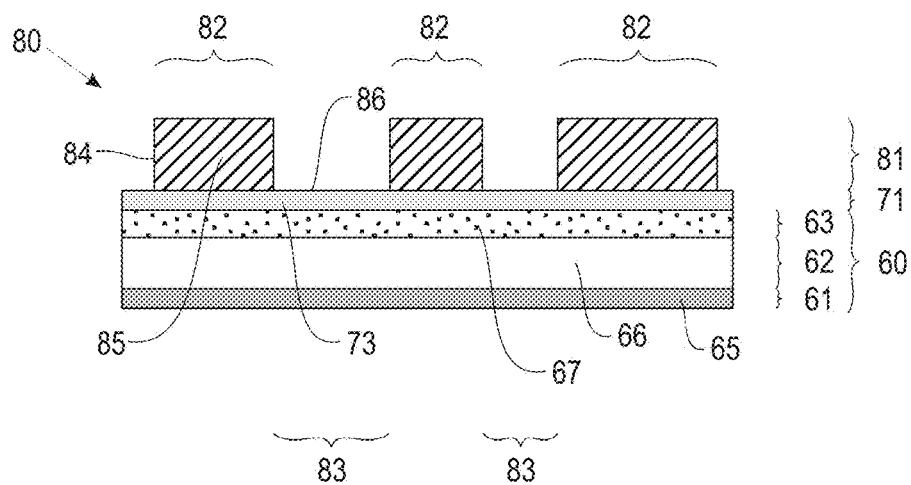

FIGS. 3A-3E illustrate Method 1 (basic method) of forming a hybrid pre-pattern utilizing pre-formed multi-layer substrate 60. A solution of a neutralization material (a polymer that is neutral wetting to a given SA material such as a block copolymer) is applied to surface 64, followed by removal of solvent, forming structure 70 (FIG. 3B). Structure 70 comprises neutral underlayer 71. Neutral underlayer 71 can be crosslinked, covalently bound to third layer 63, or otherwise immobilized. Neutral layer 71 has neutral surface 72 comprising neutral material 73. Neutral surface 72 is neutral wetting to the domains of the given SA material. The topographic resist pattern is formed on neutral surface 72 using known lithographic techniques, forming structure 80 (FIG. 3C). In this example, the neutral properties of surface 72 are retained after forming the resist pattern, transferring the resist pattern, and stripping the resist pattern.

Formation of the resist pattern can comprise i) disposing a resist on surface 72 (e.g., by spin-coating) and removing any solvent to form a resist layer, ii) optionally baking the resist layer, iii) pattern-wise exposing the baked or non-baked resist layer to radiation (e.g., e-beam, extreme UV (EUV), deep ultraviolet (DUV)), iv) optionally baking the exposed resist layer, v) developing the baked or non-baked exposed resist layer to form a positive or negative tone resist pattern, and vi) optionally baking the resist pattern.

Structure 80 comprises first topographical pattern 81 disposed on neutral surface 72. First topographical pattern 81 can be a positive tone pattern or a negative tone pattern. First topographical pattern 81 comprises topographical resist features 82 comprising resist material 85 disposed on neutral surface 72. Resist features 82 can have different widths (not shown). Resist features 82 are separated by trenches 83 having bottom surfaces 86 comprising neutral material 73. Trenches 83 can have different widths (not shown). Trenches 83 are bounded by sidewalls 84 comprising resist material 85 and bottom surfaces 86.

Figure 3D:
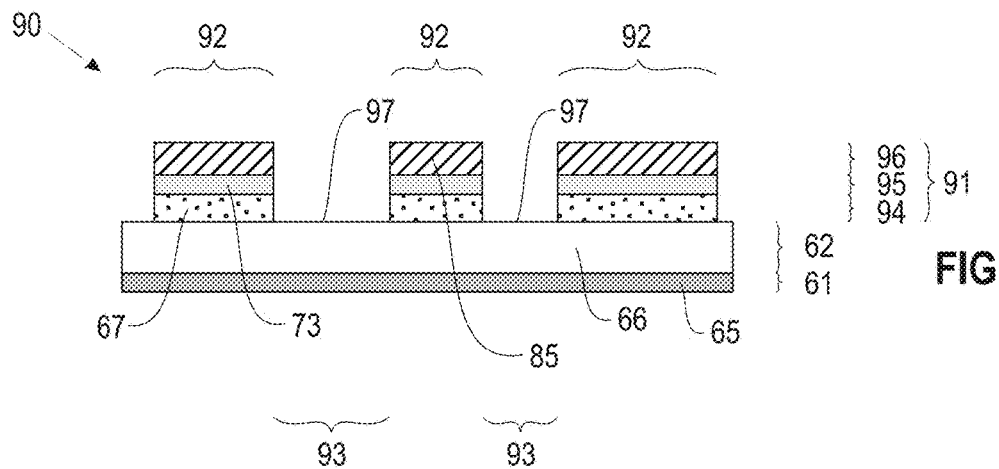

Structure 80 is then treated with one or more wet and/or dry etches and optional oxygen etches, thereby producing structure 90 (FIG. 3D). In this example, third material 67 of third layer 63 and neutral material 73 of neutral layer 71 are removed below bottom surfaces 86 of trenches 83 (FIG. 3C), forming recessed features 93 of FIG. 3D. A portion of the resist features 82 can also be removed by the etch process (shown). Structure 90 comprises second topographical pattern 91 comprising elevated features 92 separated by recessed features 93. Second topographical pattern 91 comprises resist layer 96, neutral layer 95, and third layer portion 94. Recessed features 93 have recessed surfaces 97 that are non-neutral to the SA material.

Stripping the remaining resist material 85 from structure 90 forms structure 100 (FIG. 3E), a hybrid pre-pattern for self-assembly. Structure 100 comprises patterned layer 101 (top surface of the hybrid pre-pattern) comprising elevated features 102, recessed features 103, and sidewalls 108 joining elevated features 102 to recessed features 103. Patterned layer 101 comprises elevated features 102 comprising third layer 104 comprising third material 67, and neutral layer 105 comprising neutral material 73. Elevated features 102 comprise elevated surfaces 106 comprising neutral material 73 and any residual resist 85. Elevated surfaces 106 are neutral wetting to the domains formed by self-assembly of the SA material. In this example, the neutral properties of surface 72 are retained after forming the resist pattern, transferring the resist pattern, and stripping the resist pattern. Recessed features 103 comprise recessed surfaces 107 comprising second material 66 bounded by sidewalls 108 of height $H_N$. In this example, recessed surfaces 107 and sidewalls 108 have desirable surface properties for self-assembly of the SA material without further modification. Recessed surfaces 107 can be neutral or non-neutral to the SA material, with the proviso stated above. Sidewalls 108 are preferably non-neutral to the SA material. Elevated features 102 can have different widths represented by $W_{E1}$, $W_{E2}$ and $W_{E3}$. Recessed features 103 can have different widths represented by $W_{R1}$ and $W_{R2}$. $W_{Ei}+W_{Ri}=nLo$ for a pair of adjacent elevated and recessed surfaces, where n is an integer of 2 to about 30, and i is an index number denoting adjacency.

Method 2

Figure 4A:
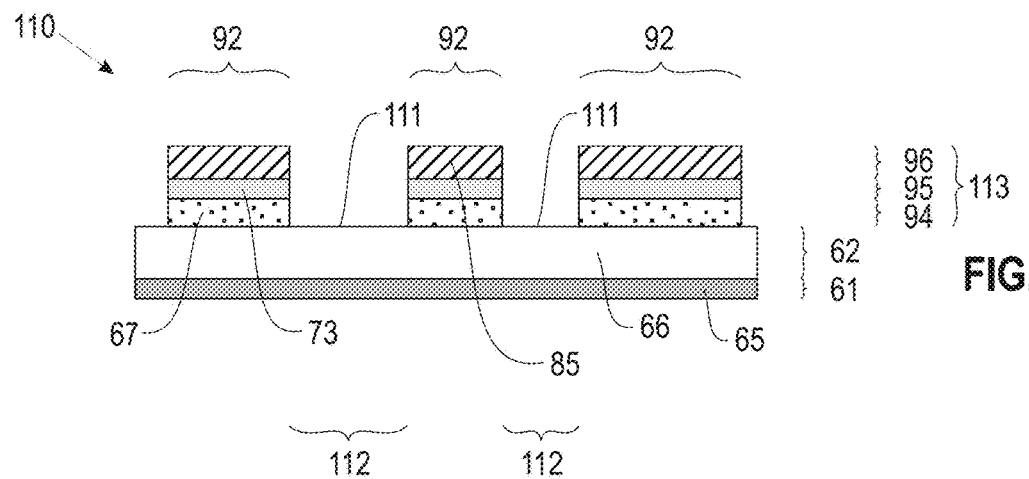
Figure 4B:
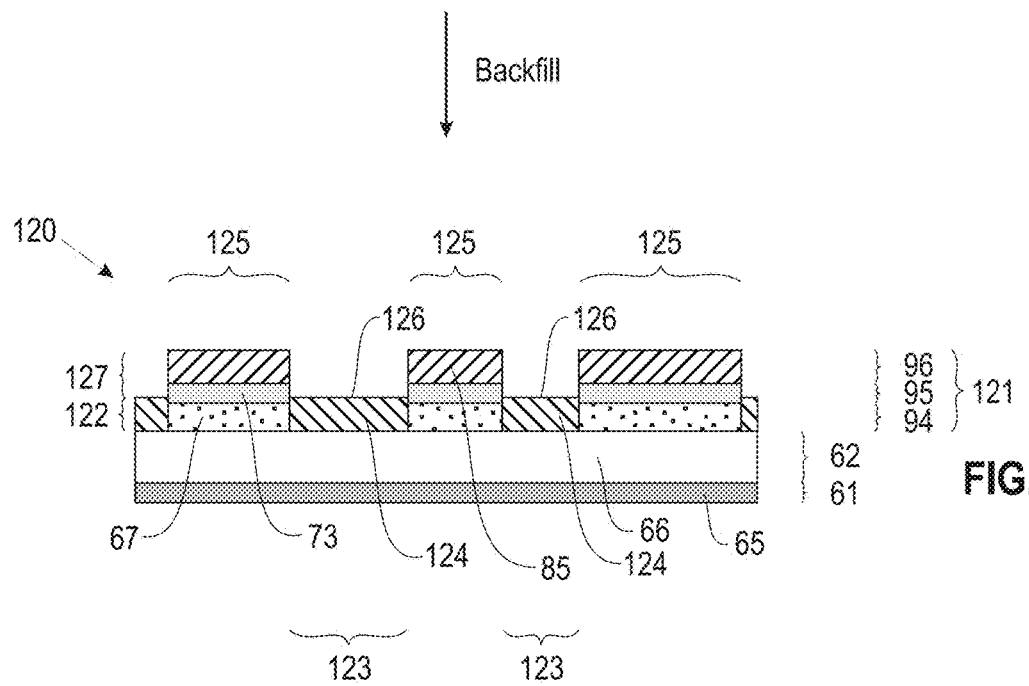

FIGS. 4A-4C illustrate Method 2 (backfill method) of forming a hybrid pre-pattern starting from structure 110 (FIG. 4A). Structure 110 is similar to above-described structure 90 of FIG. 3D except bottom surfaces 111 of trenches 112 of FIG. 4A do not have desirable surface properties for directed self-assembly of a given SA material.

In this example, after optional hardening of topographic pattern 113 (e.g., by baking second topographic pattern 113 at a suitable elevated temperature), trenches 112 of topographic pattern 113 are partially backfilled with a material to a level below the top of neutral layer 95, thereby forming structure 120 (FIG. 4B). Structure 120 comprises patterned layer 121 comprising elevated features 125 having sidewalls 127, and trenches 123. Structure 120 also includes backfill layer 122 comprising backfill material 124. Trenches 123 have bottom surfaces 126 comprising backfill material 124. In this example, patterned layer 121 includes resist layer 96, and a section of neutral layer 95. Elevated features 125 comprise resist material 85 and neutral material 73. Sidewalls 127 can interact with backfilled materials 124 to form a thin layer of backfill material 124 on sidewalls 127 (not shown).

Stripping resist material 85 from structure 120 produces structure 130 (FIG. 4C), a hybrid pre-pattern for self-assembly. Structure 130 comprises patterned layer 131 comprising elevated features 132, recessed features 133, and sidewalls 135 joining elevated features 132 to recessed features 133. In this example, elevated features 132 comprise a section of neutral layer 95 comprising neutral material 73 and any residual resist 85. Recessed features 133 comprise recessed surfaces 136 comprising backfill material 124 bounded by sidewalls 135 of height $H_N$. Sidewalls 135 can comprise neutral material 73 (shown) and/or a thin coating of backfill material 124 (not shown). Elevated surfaces 134 comprising neutral material 73 and any residual resist material 85 are neutral to the SA material. In this example, recessed surfaces 136 and sidewalls 135 have desirable surface properties for self-assembly of the SA material without further modification. Recessed surfaces 136 can be neutral or non-neutral to the SA material, with the proviso stated above. Sidewalls 135 are preferably non-neutral to the SA material. The material below elevated surfaces 134 has higher etch resistivity than the material below recessed surfaces 136 in a given etch process. In an embodiment, sidewalls 135 and recessed surfaces 136 have a preferential affinity to one domain of the SA material. Elevated features 132 can have different widths represented by $W_{E1}$, $W_{E2}$ and $W_{E3}$. Recessed features 133 can have different widths represented by $W_{R1}$ and $W_{R2}$. $W_{Ei}+W_{Ri}=nLo$ for a pair of adjacent elevated and recessed surfaces, where n is an integer of 2 to about 30, and i is an index number denoting adjacency.

Method 3

Figure 3E:
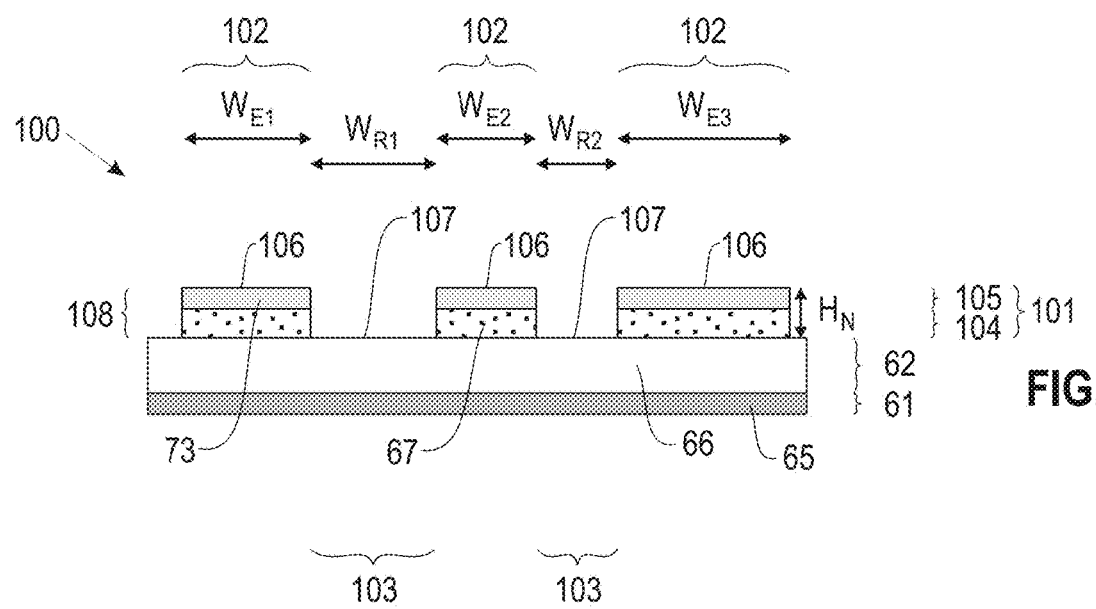
Figure 5A:
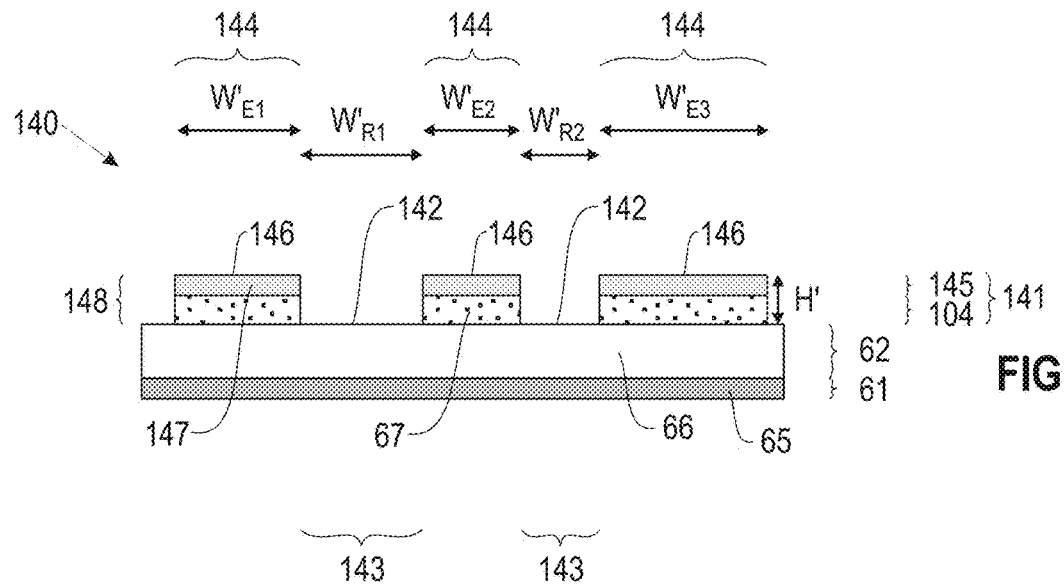
FIGS. 5A-5B are cross-sectional layer diagrams illustrating Method 3 of forming a hybrid pre-pattern using surface modification.
Figure 5B:
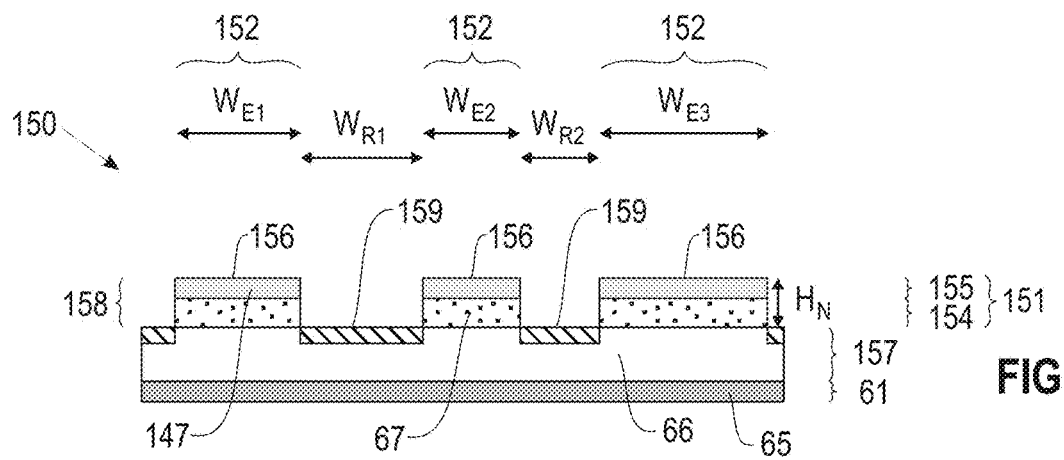

FIGS. 5A-5B illustrate Method 3 (surface modification method) of forming a hybrid pre-pattern starting from structure 140 (FIG. 5A), which is similar to structure 100 of FIG. 3E with the following exceptions. Structure 140 comprises patterned layer 141 comprising elevated features 144 and recessed features 143, comprising layer 104 and layer 145. Layer 145 comprises material 147. Elevated features 144 have elevated surfaces 146. Recessed features 143 have recessed surfaces 142 bounded by sidewalls 148 of height H'. Elevated surfaces 146 are neutral to a given SA material. Recessed surfaces 142 do not have surface properties suitable for directed self-assembly of the given SA material. Sidewalls 148 may or may not have surface properties suitable for self-assembly of a given SA material.

Structure 140 is treated with a non-neutral surface modification material, thereby forming structure 150 (FIG. 5B), a hybrid pre-pattern. Structure 150 comprises patterned layer 151 comprising elevated features 152 and recessed features 153. Patterned layer 151 comprises third layer 154 and neutral layer 155. Structure 150 also comprises surface modified second layer 157. Modified second layer 157 comprises modified recessed surfaces 159 of recessed features 153. Surface modification can alter the surface properties of sidewalls 148 (not shown). Elevated surfaces 156 and sidewalls 158 can comprise surface modification material (not shown) in amounts that do not adversely affect self-assembly of the given SA material to produce perpendicularly oriented lamellae on elevated surfaces 156. Thus, elevated surfaces 156 are neutral to the given SA material after surface modification. Modified recessed surfaces 159 and sidewalls 158 after surface modification are non-neutral to the SA material. The material below elevated surfaces 156 has higher etch resistivity than the material below modified recessed surfaces 159 in a given etch process.

Patterned layer 151 can have substantially similar topology and dimensions as patterned layer 141 of FIG. 5A (not shown). That is, surface modification can substantially leave unaltered the dimensions of patterned layer 141. Typically, surface modification results in about a 5 nm difference in sidewall height H'. Height $H_N$ of FIG. 5B can be substantially the same as height H' of FIG. 5A. Widths $W_{E1}$, $W_{E2}$ and $W_{E3}$ of elevated features 152 of FIG. 5B can be the same or substantially the same as $W'_{E1}$, $W'_{E2}$ and $W'_{E3}$ of elevated features 102 of FIG. 5A. Widths $W_{R1}$ and $W_{R2}$ of recessed features 153 of FIG. 5B can be the same or substantially the same as $W'_{R1}$ and $W'_{R2}$ of recessed features 143 of FIG. 5A. In FIG. 5B, $W_{Ei}+W_{Ri}=nLo$ for a given pair of adjacent elevated and recessed surfaces, where n is an integer of 2 to about 30, and i is an index number denoting adjacency. Height $H_N$ is about 0.1 Lo to about 2.0 Lo.

Surface modification can be performed, for example, by applying a dilute solution of a brush polymer to structure 140 using conditions that can reduce the deposition of the brush polymer on elevated surfaces 106, followed by a bake.

Method 4

Figure 6A:
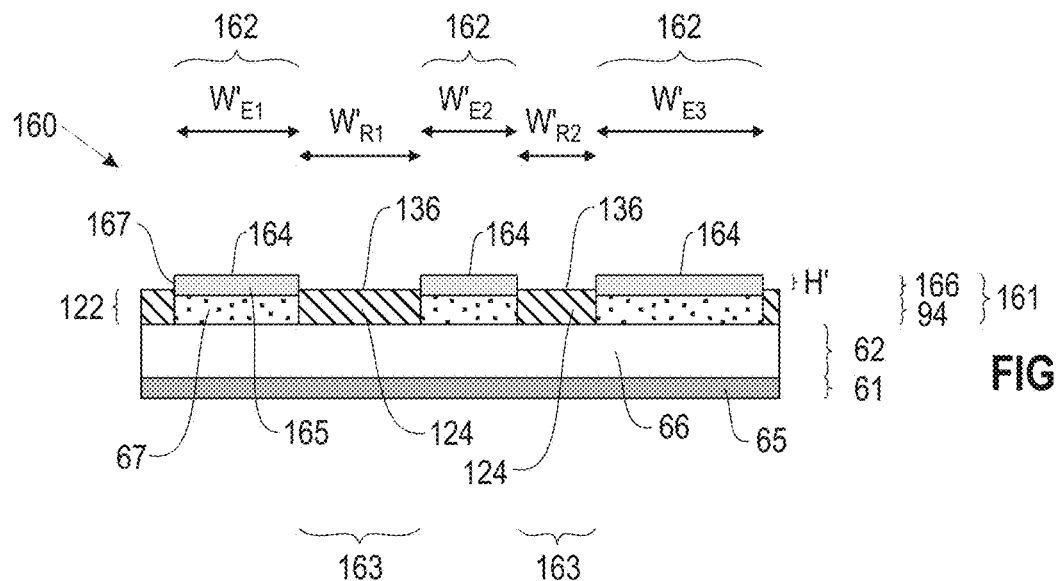
FIGS. 6A-6B are cross-sectional layer diagrams illustrating Method 4 of forming a hybrid pre-pattern using double surface modification.
Figure 6B:
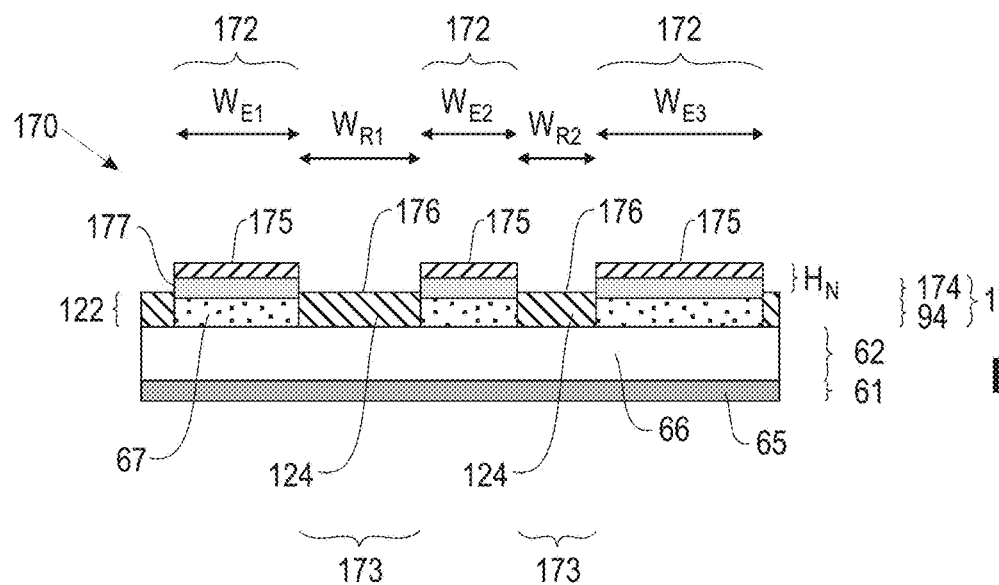

FIGS. 6A-6B illustrate Method 4 (double modification method) of forming a hybrid pre-pattern starting from structure 160 (FIG. 6A), which is similar to structure 130 of FIG. 4C with the following exceptions. Structure 160 comprises pattern layer 161 comprising elevated features 162 and recessed features 163. Elevated features 162 comprise a section of top layer 166 comprising top layer material 165. Recessed surfaces 136 comprising backfill material 124 are bounded by sidewalls 167 of height H'. Elevated features 162 have elevated surfaces 164, which in this example do not have properties suitable for self-assembly of a given SA material. Recessed surfaces 136 and sidewalls 167 have suitable surface properties for self-assembly of a given SA material.

Elevated surfaces 164 are surface modified with a neutral material, producing structure 170 (FIG. 6B), a hybrid pre-pattern. Structure 170 comprises patterned layer 171 comprising elevated features 172 and recessed features 173. Patterned layer 171 also comprises backfill layer 122 comprising backfill material 124, remaining third layer 94 comprising third material 67, and surface modified top layer 174. Elevated features 172 have modified elevated surfaces 175, which are neutral to the given SA material. Recessed features 173 have recessed surfaces 176 bounded by sidewalls 177. Recessed surfaces 176 and sidewalls 177 have suitable surface properties for self-assembly of the given SA material (i.e., their surface properties are not adversely affected by the surface modification agent). Recessed surfaces 176 and sidewalls 177 can comprise surface modification material (not shown) in amounts that do not adversely affect self-assembly of the given SA material to produce perpendicularly oriented lamellae on elevated surfaces 175. The material below modified elevated surfaces 175 has higher etch resistivity than the material below recessed surfaces 176 in a given etch process.

Patterned layer 171 can have substantially the same topology and dimensions as patterned layer 161 of FIG. 6A. That is, surface modification of the elevated features 162 does not necessarily substantially alter the dimensions of patterned layer 161, but rather the surface properties of elevated features 162. Height H' of FIG. 6A can be substantially the same as height $H_N$ of FIG. 6B. Widths $W_{E1}$, $W_{E2}$ and $W_{E3}$ of elevated features 172 of FIG. 6B can be the same or substantially the same as $W'_{E1}$, $W'_{E2}$ and $W'_{E3}$ of elevated features 162 of FIG. 6A. Likewise, widths $W_{R1}$ and $W_{R2}$ of recessed features 173 of FIG. 6B can be the same or substantially the same as widths $W'_{R1}$ and $W'_{R2}$ of recessed features 163 of FIG. 6A. In FIG. 6B, $W_{Ei}+W_{Ri}=nLo$ for a given pair of adjacent elevated and recessed surfaces, where n is an integer of 2 to about 30, and i is an index number denoting adjacency. Sidewalls 177 have height $H_N$, which is about 0.1 Lo to about 2.0 Lo.

Method 5

FIGS. 7A-7B illustrate Method 5 (resist modification method) for forming a hybrid pre-pattern starting from structure 180 (FIG. 7A), which is similar to structure 80 of FIG. 3C with the following differences. Structure 180 comprises topographical resist pattern 181 comprising elevated features 182 and recessed features 183. Elevated features 182 comprise resist material 187 and have sidewalls 184 of height H'. Resist pattern 181 is disposed on non-neutral layer 185 comprising non-neutral material 186. Recessed features 183 have recessed surfaces 188 comprising non-neutral material 186 and are bounded by sidewalls 184. Recessed surfaces 188 and sidewalls 184 have suitable surface properties for self-assembly of a given SA material. Elevated surfaces 189 do not have suitable surface properties for self-assembly of a given SA material.

Elevated surfaces 189 are surface modified with a neutral material (e.g., by treating elevated surfaces 189 with a brush polymer), producing structure 190 (FIG. 7B), a hybrid pre-pattern. Structure 190 comprises modified resist pattern 191 comprising elevated features 192 and recessed features 193. Elevated features 192 have modified elevated surfaces 199, which are neutral to the given SA material. Recessed features 193 have recessed surfaces 198 bounded by sidewalls 194. Recessed surfaces 198 and sidewalls 194 have desirable surface properties for self-assembly of the given SA material (i.e., the surface properties of recessed surfaces 188 and sidewalls 184 are not adversely affected by the surface modification agent). Recessed surfaces 198 and sidewalls 194 can comprise surface modification material (not shown) in amounts that do not adversely affect self-assembly of the given SA material to produce perpendicularly oriented lamellae on elevated surfaces 199. The material below modified elevated surfaces 199 has higher etch resistivity than the material below recessed surfaces 198 in a given etch process.

Modified resist pattern 191 can have substantially the same topology and dimensions as resist pattern 181 of FIG. 7A. That is, surface modification of the elevated features 182 does not necessarily substantially alter the dimensions of resist pattern 181, but rather the surface properties of elevated features 182. Height H' of FIG. 7A can be substantially the same as height $H_N$ of FIG. 7B. Widths $W_{E1}$, $W_{E2}$ and $W_{E3}$ of modified elevated features 192 of FIG. 7B can be the same or substantially the same as widths $W'_{E1}$, $W'_{E2}$ and $W'_{E3}$ of elevated features 182 of FIG. 7A. Likewise, widths $W_{R1}$ and $W_{R2}$ of modified recessed features 193 of FIG. 7B can be the same or substantially the same as widths $W'_{R1}$ and $W'_{R2}$ of recessed features 183 of FIG. 7A. In FIG. 7B, $W_{Ei}+W_{Ri}=nLo$ for a given pair of adjacent elevated and recessed surfaces, where n is an integer of 3 to about 30, and i is an index number denoting adjacency. Sidewalls 194 have height $H_N$, which is about 0.1 Lo to about 2.0 Lo.

Underlayer Materials

Herein, an underlayer is any layer having contact with the bottom of the SA layer. Underlayers include neutral layers, non-neutral layers, backfill layers, surface modified resist layers, substrate layers, surface modified substrate layers, and etched substrate layers. Underlayer material is any material having contact with the bottom of the SA layer. The underlayer material can comprise organic material, inorganic material, organometallic material, or a combination of the foregoing materials. The underlayer material can be neutral or non-neutral to a given SA material with the following restrictions. Underlayer materials of elevated surfaces of the pre-pattern are neutral to the given SA material. Underlayer materials of recessed surfaces and sidewalls of the pre-pattern can independently be neutral or non-neutral to the SA material, with the above stated proviso. Sidewall surfaces which are typically preferential to one domain also serve as part of directing features and can be modified by the chosen underlayer materials during the pre-pattern fabrication processes. The choice of underlayer materials for the elevated and recessed surfaces depends on the choice of SA material, fabrication method for the pre-pattern including resist materials for lithography and plasma etch processes, and the dimensions of the pre-pattern. Therefore, no attempt is made to separately categorize neutral and non-neutral underlayer materials for forming a hybrid pre-pattern. The following is a general discussion of underlayer materials for potential use in forming the above-described neutral layers, backfill layers, non-neutral layers, and various modified surfaces. It should be understood that surfaces of substrate layers and surfaces of etched substrate layers can potentially be used for the elevated and recessed surfaces of the hybrid pre-pattern without further surface modification. Alternatively, the surfaces of the substrate layers and etched substrate layers can be surface modified with an underlayer material having suitable wetting properties with respect to the SA material.

Underlayer materials include polymers comprising a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)). Other underlayer materials include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers can react as a result of thermal or photochemical treatment either alone or in conjunction with an additional crosslinking agent. In particular, a catalytic species such as a strongly acidic species can be used to facilitate reaction. The strongly acidic species can be directly incorporated into the underlayer material or the solution comprising the underlayer material. Alternatively, a thermal acid generator or photoacid generator molecule can be used to generate an acidic species as a result of thermal or photochemical treatment, respectively. The above materials are particularly suitable for use with an SA material comprising poly(styrene-b-methyl methacrylate) block copolymers. Poly(methyl glutarimide) (PMGI) can be an underlayer material for an SA material comprising poly(styrene-b-ethylene oxide) block copolymer.

Other non-limiting examples of underlayer materials include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (e.g., optical properties, surface energy, etch resistance). The polymer components also typically contain a plurality of reactive sites distributed along the polymer for reaction with a crosslinking component.

More specific materials used in ARC layers include poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl end-capped poly(bisphenol A-co-epichlorohydrin), and silicon-containing anti-reflection coating A940 from Shin Etsu. Another more specific underlayer material comprises poly(styrene-co-epoxydicyclopentadiene methacrylate) random copolymer, P(S-r-EDCPMA):

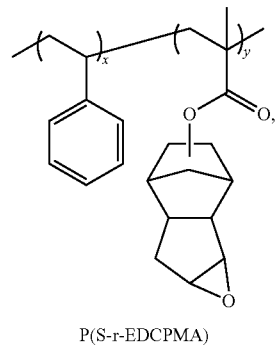

P(S-r-EDCPMA)

wherein x and y are each integers greater than 1.

Other underlayer materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinnamate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI).

Other underlayer materials comprise polymer brush materials, including hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing materials.

Other underlayer materials include self-assembled monolayers.

A layer comprising an underlayer material (e.g., neutral layer, non-neutral layer) can include, for example, a thin dielectric material having a thickness from 1 nm to 20 nm.

The elevated surfaces of the hybrid pre-pattern comprise a neutral underlayer material having substantially the same affinity to each block of a BCP used for self-assembly. The recessed surfaces can comprise a neutral underlayer material or a non-neutral underlayer material having a preferential affinity to fewer than all blocks of a BCP used for self-assembly, typically one block. In an embodiment, the neutral underlayer material and/or non-neutral underlayer material are random copolymers. In another embodiment, the neutral underlayer material and/or the non-neutral underlayer material includes an etch-resistant material.

The mechanism for the orientation control by the underlayer material in any specific context is complicated. Without being bound by any specific theory, the mechanism for the orientation control by the underlayer material can depend on net surface energy, wetting characteristics, surface energy distribution, hydrogen bonding, net dipole moments, dipole moment density, and/or composition. Underlayer surfaces possessing desirable characteristics can comprise: cross linked organic polymer including an epoxy-based homopolymer or copolymer, organic homopolymers or copolymers; self-assembled monolayers, polymer brushes, cross-linked organosilicates, random copolymer brushes, random cross-linked copolymers, mixtures of polymer brushes or cross-linked polymers, ARC materials, oxidized silicon, and combinations of the foregoing materials.

Surface Modification for Orientation Control

Polymer brushes can provide a modified surface that is neutral or non-neutral to the SA material. A modified surface can be formed by reactively modifying a surface to a desired thickness and surface properties using polymeric brush precursors having a desired composition, often followed by an additional rinse step to remove non-bound material. The composition of a random copolymer brush layer can be tuned to afford the desired surface properties. This can be accomplished in some instances by randomly copolymerizing two monomers, for example the same monomers used in the preparation of a block copolymer for self-assembly, in a precise ratio. In instances where otherwise useful self-assembling materials (i.e., those that can form domains) exist for which it is unfeasible to synthesize random copolymers of repeating units of each polymeric block components (such as where different polymerization mechanisms would be required), end-group functionalization or incorporation of reactive-group containing monomers can be used to functionalize polymers to provide grafting sites. Thermally crosslinkable underlayers based on, for example, vinyl benzocyclobutene, can also be used. Photo-patternable underlayers, based on random copolymers of the monomers of the self-assembling material with an appropriate functional monomer, for example, monomers having azide, glycidyl or acryloyl groups, can also be used.

The underlayer surface can also be a coating of a cross-linked epoxy-containing polymer prepared from monomers including glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations including at least one of the foregoing. Herein, where "(meth)acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth)acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth)acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, a-methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Specifically useful epoxy-containing polymers include poly(epoxydicyclopentadienyl methacrylate) homopolymer or poly(styrene-ran-epoxydicyclopentadienyl methacrylate), a random copolymer of styrene and epoxydicyclopentadienyl methacrylate.

Organosilicate or silicon oxide-based coatings of the substrate can also be used to provide an underlayer surface. Useful surfaces can be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials can be used to provide the underlayer surface, where such organosilicate coatings are advantageously crosslinkable to form a solid underlayer surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis(triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

An underlayer (e.g., neutral layer, non-neutral layer, resist layer, backfill layer, substrate layer) can comprise an etch-resistant material including, but not limited to, a material selected from hydrogen silsesquioxane, methyl silsesquioxane, an alkyl silsesquioxane, an alkene silsesquioxane, an aryl silsesquioxane, an arylene silsesquioxane, a silicon-based resist, an inorganic resist, a silicon-based ARC, a metal-based ARC, silicon oxide, a silicon oxynitride, a silicon-based spin-on-dielectric, a metal, a metal oxide, a metal nitride, a metal oxynitride, and a metal carbide, provided that a suitable etch chemistry exists for removing some domains of a self-assembling material selectively to other domains and the etch-resistant material. In one embodiment, the etch-resistant material can include hydrogen silsesquioxane.

A layer of such etch-resistant material formed on the substrate can be deposited by any suitable method and is not particularly limited. Where the etch-resistant material is soluble in solutions, the application of an etch-resistant material layer to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

In another example, the etch-resistant material can be deposited from the vapor phase by a process including, chemical vapor deposition (CVD), plasma enhanced CVD, atomic layer deposition (ALD), sputtering, thermal evaporation, electron beam evaporation, pulsed laser deposition, or other suitable deposition method that is compatible with the processes and equipment used in microelectronics fabrication.

An underlayer material can be applied by any suitable method and is not particularly limited. Where polymer-based underlayer material is desired, the application of such layers to a surface of the substrate can be accomplished by a process including, for example, spin-casting, dip-coating, doctor blading, spray dispense, or other suitable coating method, which is compatible with the processes and equipment used in microelectronics fabrication assembly lines.

Solvents that can be used to cast underlayer materials on a substrate vary with the solubility requirements of these materials. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

The surface energy or composition required for an underlayer material depends on the application. For example, in order to form polystyrene (PS)-poly(methyl methacrylate) (PMMA) perpendicularly oriented lamellae, a PS-r-PMMA random copolymer layer can be employed as a neutral underlayer material.

As another example, for an unpatterned surface, a brush composition can comprise 57-70% polystyrene (PS). However, the ideal underlayer material for a patterned surface (e.g., one having a chemical pre-pattern) can differ from that designed for an unpatterned surface, and the ideal underlayer material can depend upon the composition of the directing portion of the chemical pattern (e.g., PS or PMMA preferential) and the multiplication factor, as described in Liu, et al., "Chemical Patterns for Directed Self-Assembly of Lamellae-Forming Block Copolymers with Density Multiplication of Features", Macromolecules, 2013, 46, 1415-1424. The multiplication factor for spatial frequency multiplication refers to the ratio of the pitch of the chemical pre-pattern to the periodicity of a self-assembling material. The ideal underlayer material can be different for different BCP morphologies (e.g., perpendicular cylinders versus lamellae).

For a given underlayer material, the efficacy and the surface properties of the material can depend on various factors. For example, the efficacy and surface property of an underlayer-modified substrate can depend on the thickness of the underlayer material, the surfaces underneath the underlayer materials, the process condition of underlayers materials as well as the topography and pattern density of the substrate where the underlayer is applied for surface property control. The molecular architecture of the underlayer material can have an effect. For example, a polymer brush underlayer material can have a composition range different from that of a cross-linked underlayer material due to difference in mobility of the brush. For the same reason, a higher molecular weight brush can act differently compared to a lower molecular weight brush. Similar changes in the efficacy of orientation control can be observed for cross-linked underlayer materials having the same composition but different molecular weights. The efficacy of orientation control can also depend on the thickness of the self-assembly material layer above the underlayer according to the relative difference in surface free energies among the polymeric block components. The exact orientation of polymer domains at the air interface or the polymer/underlayer interface can be other than perpendicular to the substrate, even if the majority of each polymer domain is. The underlayer material can still function even when it is weakly preferential.

Substrate

The substrate can comprise inorganic or organic materials such as metals, carbon, or polymers. More particularly, the substrate can comprise a semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein. A substrate comprising a surface affinity material such as a silicon native oxide, silicon oxide, or silicon nitride can be preferentially wetted by, for example, PMMA block components, but not by PS block components of a PS-b-PMMA block copolymer. Therefore, surfaces comprising these surface affinity materials can direct self-assembly of a PS-b-PMMA block copolymer by chemical epitaxy. The substrate can have a top ARC layer or bottom ARC (BARC) layer to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Lithography

The process of forming a hybrid pre-pattern can employ radiation of various types, including ultraviolet (UV) radiation of wavelengths from 400 nm to 300 nm, deep ultraviolet (DUV) radiation of wavelengths from 300 nm to 150 nm, extreme ultraviolet (EUV) radiation of wavelengths from 120 nm to 4 nm, electron-beam (e-beam) radiation, x-ray radiation, and combinations of the foregoing. Exemplary radiation sources include single wavelength and/or narrow band radiation sources, specific mercury emission lines, lasers, and particle beam emitters. For less stringent conditions, a broad band multiple wavelength source can be used. More specifically, the radiation wavelength for the pattern-wise exposure can be, for example, 405 nm, 313 nm, 334 nm, 257 nm, 248 nm, 193 nm, 157 nm, 126 nm, or 13.5 nm. Even more particularly, the wavelength of the radiation for the pattern-wise exposure can be less than 250 nm. In an embodiment, the radiation wavelength is selected from the group consisting of 248 nm, 193 nm, 157 nm, and 13.5 nm.

The in-plane patterns of high etch resistivity (elevated surfaces) and low etch resistivity (recessed surfaces) of the hybrid pre-pattern can be prepared by various methods known in the art. For example, direct writing of patterns can be achieved by exposure of a polymer (e.g., a surface-bound polymer brush or self-assembled monolayer) in an e-beam direct write lithography or EUV interference lithography process. Alternatively, a conventional photoresist can be patterned on top of an underlayer (e.g., neutral layer, non-neutral layer) to form patterned photoresist features. The photoresist pattern can protect the underlying surface during an etch process that creates non-neutral surfaces (i.e., surfaces having a particular affinity for one domain of a self-assembled material), either by removing the underlayer material to uncover the underlying substrate or by inducing enough damage to the underlayer material that it becomes preferential to one of the self-assembled domains of the SA material. The protecting photoresist layer can then be removed by an organic solvent rinse to expose the underlayer having desirable surface properties.

Rather than selectively removing or altering an underlayer material, negative-tone photo-patternable underlayer materials have been developed that can be patterned on top of conventional anti-reflective coatings. Alternatively, direct patterning of a crosslinking negative-tone photoresist on top of an underlayer material can produce a chemical pattern. The best reported efforts have used a hydrogen silsesquioxane negative-tone e-beam photoresist (used in Example 6). A number of schemes compatible with conventional 193 nm immersion lithography have been reported that are also suitable, for example, the pattern first—neutralized last scheme described by Cheng, et al. "Simple and Versatile Methods To Integrate Directed Self-Assembly with Optical Lithography Using a Polarity-Switched Photoresist", ACS Nano, 2010, 4, 4815-4823. In an alternative method described by Liu, et al., "Fabrication of Lithographically Defined Chemically Patterned Polymer Brushes and Mats", Macromolecules, 2011, 44, 1876-1885, a photoresist is patterned on top of a crosslinked mat (in this case of crosslinked poly(styrene)). A subsequent etch process is used to break through the mat to the underlying substrate and laterally trim the crosslinked mat. The resist is stripped and an underlayer material is grafted to the portions of the substrate not covered by the crosslinked poly(styrene) mat.

Other techniques that may be used to create suitable patterns include nanoimprint lithography, polymer inking/stamping, molecular transfer printing, dip-pen lithography, and nanoprobe lithography (including thermal, electron emission, and other variants).

Any method known for creating topographic patterns known in the art may be used to create the hybrid pre-patterns. The topographical patterns may be comprised of photoresist (either crosslinked or otherwise stabilized), an anti-reflective coating (e.g., a bottom anti-reflective coating (BARC), a developable bottom anti-reflective coating (DBARC), a photosensitive bottom anti-reflective coating (PS-BARC), a silicon anti-reflective coating (SiARC)), an inorganic or metal hardmask layer, an organic planarization layer, a spin-on carbon layer, a dielectric layer, CVD carbon layer, an inorganic oxide layer, an inorganic nitride layer, and/or an inorganic carbide layer). The bottom surface of the topographic pre-pattern may be comprised of an underlayer material or other material with tuned surface properties. One method to preserve the surface properties of the underlayer material is to use a negative-tone imaging process with an organic developer to image a crosslinkable (or thermally hardenable) photoresist on top of the underlayer material. A polymer brush may be grafted to one of more surfaces of the topographic pattern. Other means of creating graphoepitaxial templates is the use of so-called sidewall image transfer (or self-aligned double patterning) techniques, where a conformal inorganic material is applied (usually by chemical vapor deposition or a similar process) over a mandrel. The mandrel can be removed to create a topographic structure with twice the spatial frequency. Variants of this process can be used to create topographic structures with triple or quadruple the frequencies of the initial mandrel structure.

Self-Assembly Materials

SA materials are comprised of immiscible materials that can phase separate into domains. Phase separation can occur with different types of polymer blends (e.g., binary, ternary) as well as block copolymers comprising two or more immiscible polymeric block components. The term "immiscible" as used herein refers to two or more components (e.g., blocks of a block copolymer, polymers of a polymer blend, and the like) that are incompatible enough to phase separate under certain process conditions.

SA materials for directed self-assembly can comprise immiscible polymer blends. The immiscibility of the polymers in the polymer blends can depend on the composition as well as the film-forming process of the polymer blends. The ratio of the polymers, molecular weights of the individual polymers in the blend, and the presence of other additional components in the blend can be used to adjust the compatibility of the polymers in the polymer blend. Temperature, coating conditions, and underlayer surface properties can also affect the phase separation of the polymers. As used herein, an "immiscible polymer" is a polymer that in a polymer blend composition phase separates on a properly prepared underlayer surface under appropriate process conditions.

Examples of polymers for the two or more immiscible polymer blends include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly (1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2, 2,2-trifluoroethyl methacrylate), poly(hexafluoroisopropyl methacrylate), poly(2,3,4,5,6-pentafluoro styrene), and substituted derivatives thereof. The two or more immiscible polymers can be selected such that each polymer is immiscible with each other polymer in the blend.

The SA material can comprise a block copolymer, or blends of block copolymers and other polymers. In an embodiment, the block copolymer consists essentially of a first polymeric block component A and a second polymeric block component B that are immiscible with each other. Typically, homopolymers of suitable immiscible block components form a blend that exhibits multiple glass transition temperatures representing each homopolymer phase. Preferably, one of the components A and B is selectively removable without having to remove the other, so as to form isolated and orderly arranged structural units composed of the un-removed component, or a continuous structural layer containing isolated and orderly arranged cavities formed after the removable component has been removed. Alternatively, the components A and B can simply have different electrical, optical, and/or magnetic properties, so that the ordered patterns composed of such components A and B can be used for fabricating different device structures.

The block copolymer can comprise blocks comprising one or more monomers, and at least two blocks in the block copolymer are compositionally, structurally, or both compositionally and structurally non-identical. Exemplary block copolymers include di-block copolymers, tri-block copolymers, or multi-block copolymers, any of which can be used in conjunction with DSA to further enhance the resolution. The blocks themselves can be homopolymers or copolymers, including terpolymers. The SA material, which forms phase separated structures of chemically different domains, can comprise an amphiphilic organic block copolymer, amphiphilic inorganic block copolymer, organic di-block copolymer, organic multi-block copolymer, inorganic-containing di-block copolymer, inorganic-containing multi-block copolymer, linear block copolymer, star block copolymer, dendritic block copolymer, hyper-branched block copolymer, graft block copolymer, a bottle brush block copolymer, or a combination comprising at least one of the foregoing block copolymers. In an embodiment, the block copolymer is a di-block copolymer. Combining a suitable tri-block copolymer and a chemical pre-pattern can, for example, be used to quadruple the spatial frequency of the chemical pre-pattern.

The block components can in general be any appropriate microdomain-forming block that can be copolymerized with, attached to, or self-organize with another dissimilar block. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In an embodiment, the blocks of the block copolymer comprise repeating units derived from $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or alpha-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth) acrylate, or hydroxyethyl (meth)acrylate. Combinations of two or more of these monomers can be used. Exemplary blocks that are homopolymers include blocks prepared using styrene (i.e., polystyrene blocks), or (meth)acrylate homopolymer blocks such as poly(methyl methacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride dyad repeating structure due to the inability of maleic anhydride to homopolymerize under most conditions (e.g., poly(styrene-alt-maleic anhydride)) where "-alt-" indicates alternating polymeric blocks. It is understood that such blocks are exemplary and should not be considered to be limiting.

More specific di-block or tri-block copolymers include poly(styrene-b-vinyl pyridine) (PS-b-PVP), poly(styrene-b-butadiene) (PS-b-PBD), poly(styrene-b-isoprene) (PS-b-PI), poly(styrene-b-methyl methacrylate) (PS-b-PMMA), poly (styrene-b-alkenyl aromatics), poly(isoprene-b-ethylene oxide) (PI-b-PEO), poly(styrene-b-(ethylene-propylene)), poly(ethylene oxide-b-caprolactone), poly(butadiene-b-ethylene oxide) (PBD-b-PEO), poly(styrene-b-t-butyl (meth) acrylate), poly(methyl methacrylate-b-t-butyl methacrylate), poly(ethylene oxide-b-propylene oxide), poly(styrene-b-tetrahydrofuran), poly(styrene-b-dimethylsiloxane) (PS-b-PDMS), poly(styrene-b-ferrocenyldimethylsilane) (PS-b-PFS), poly(styrene-b-isoprene-b-ethylene oxide) (PS-b-PI-b-PEO), poly(styrene-b-isoprene-b-methyl methacrylate) (PS-b-PI-b-PMMA), poly(styrene-b-ferrocenyldimethylsilane-b-isoprene) (PS-b-PFS-b-PI), poly(styrene-b-lactide) (PS-b-PLA) or a combination comprising at least one of the foregoing block copolymers.

Specific examples of self-assembling block copolymers can include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). Other exemplary block copolymers that are contemplated for use in the present method include diblock or triblock copolymers such as, poly(styrene-b-alkenyl aromatics), poly(styrene-b-(ethylene-propylene)), poly(ethylene oxide-b-caprolactone), poly(styrene-b-t-butyl (meth)acrylate), poly (methyl methacrylate-b-t-butyl methacrylate), poly(ethylene oxide-b-propylene oxide), poly(styrene-b-tetrahydrofuran), poly(styrene-b-dimethylsiloxane), poly(vinyl pyridine-b-dimethylsiloxane), poly(ethylene oxide-b-dimethylsiloxane), poly(methyl methacrylate-b-dimethylsiloxane), poly(isoprene-b-dimethylsiloxane), poly(isoprene-b-vinyl pyridine), partially epoxidized poly(styrene-b-isoprene) poly(butadiene-b-vinyl pyridine), poly(trimethylsilyl styrene-b-lactic acid), poly(styrene-b-lactic acid), poly(styrene-b-hydroxystyrene), poly(styrene-b-acrylic acid), poly(ethylene oxide-b-hydroxystyrene), poly(methyl methacrylate-b-vinyl pyridine), poly(ethylene oxide-b-methyl methacrylate-b-styrene), poly(styrene-b-isoprene-b-ethylene oxide), poly (methyl methacrylate-b-styrene-b-methyl methacrylate), poly(isoprene-b-styrene-b-ferrocenyldimethylsilane), poly (styrene-b-trimethylsilyl styrene-b-styrene) or a combination including at least one of the foregoing block copolymers.

The polymer blend or block copolymers can also comprise inorganic constituents, including inorganic-containing homopolymers, copolymers, and block copolymers, and inorganic-containing monomers, molecules, and additives. These include, for example, those based on silicon, germanium, iron, titanium, aluminum, or the like.

The block copolymer desirably has an overall molecular weight and polydispersity amenable to further processing. In an embodiment, the block copolymer has a weight-average molecular weight (Mw) of 3,000 to 200,000 g/mol. Similarly, the block copolymer has a number average molecular weight (Mn) of 1,000 to 80,000. The block copolymer can also have a polydispersity (Mw/Mn) of 1.01 to 6, and is not particularly limited thereto. Average molecular weight, both Mw and Mn, can be determined by, for example, gel permeation chromatography using a universal calibration method, calibrated to polystyrene standards.

The block copolymers can be prepared by methods previously described in the art, including living polymerization techniques such as atom transfer free radical polymerization (ATRP) nitroxide-mediated radical polymerization, ring-opening metathesis polymerization (ROMP), and living cationic or living anionic polymerizations.

In a particular embodiment, the block copolymer used for forming the self-assembled periodic patterns is PS-b-PMMA. The PS and the PMMA blocks in such a PS-b-PMMA block copolymer can have a total (summed over all blocks) number average molecular weight (Mn) ranging from about 5000 to about 300000, with a total number average molecular weight from about 10000 to about 200000 being more typical. Each block can have a Mn of 2000 to 100000, more particularly 5000 to 60000.

The morphology (e.g., shape, dimension, and orientation) of the self-assembled domains from block copolymer thin films is a function of composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement). Therefore, by adjusting one or more parameters, the morphology can be adjusted to the need of specific applications.

In order to form the self-assembled periodic patterns, the block copolymer can be first dissolved in a suitable solvent system to form a block copolymer solution, which can then be applied onto the treated layer, thereby forming a thin block-copolymer layer disposed thereon. Optionally, annealing the thin block-copolymer layer can aid in the self-assembly process of the polymeric block components.

In an embodiment, the SA material comprises at least one block copolymer. Non-limiting exemplary solvents for the SA material include substituted or unsubstituted aromatic hydrocarbons, substituted or unsubstituted aromatic ethers, substituted or unsubstituted aromatic alcohols, saturated monoalcohols comprising 5 to 20 carbons, glycols, ketones, glycol mono ethers, and glycol mono ether esters. In an embodiment, the SA solvent is a glycol, glycol mono ether, or glycol mono ether ester, or combinations thereof. More specific solvents for the SA material include but are not limited to toluene, ethylene glycol, propylene glycol, propylene glycol monomethyl ether acetate (PGMEA), propylene glycol monomethyl ether (PGME), 4-methyl-2-pentanol, n-butyl acetate, anisole, acetone, and combinations thereof. In an embodiment, the solvent for the SA material is ethylene glycol, propylene glycol, propylene glycol monomethyl ether acetate (PGMEA), propylene glycol monomethyl ether (PGME), 4-methyl-2-pentanol, or combinations thereof. The solution of SA material can have a concentration ranging from about 0.1 weight percent (wt. %) to about 5 wt. % SA material based on total weight of the solution. More particularly, the SA material is dissolved at a concentration ranging from about 0.5 wt. % to about 2.5 wt. %. In an embodiment, the solution of SA material comprises about 0.5 wt. % to about 2.5 wt. % PS-b-PMMA block copolymer dissolved in anisole. The solution of SA material can optionally further comprise additional block copolymers, homopolymers, random copolymers, surfactants, and photoacid generators, photobase generators, thermal acid generators, thermal base generators, acid amplifiers, and photodestructible bases.

The application of SA materials to a surface of the substrate can be accomplished by a process including, for example, spin-casting, dip-coating, doctor blading, spray dispense, or other suitable coating method, which is compatible with the processes and equipment used in microelectronics fabrication assembly lines.

The solution of SA material is cast on the pre-pattern followed by removal of the solvent, thereby forming a thin film of SA material disposed on at least one elevated surface and at least one recessed surface of the hybrid pre-pattern. In an embodiment, the SA material is disposed on substantially all elevated and recessed surfaces of the hybrid pre-pattern. The solution of SA material can be cast by any suitable technique, including, but not limited to: spin coating, roll coating, spraying, ink coating, dip coating, and the like.

Additional annealing (including thermal annealing, thermal gradient annealing, and solvent vapor annealing or other gradient field) can be optionally employed to remove defects in the SA layer and/or promote self-assembly of the SA material. More particularly, the SA layer comprising a block copolymer can be thermally annealed at a temperature that is above the glass transition temperature (Tg) of the block copolymer but below the decomposition or degradation temperature (Td) of the block copolymer. The thermal annealing step can be carried out at an annealing temperature of about 100° C. to about 300° C. The thermal annealing can be performed for a period of about 1 minute to about 120 hours, more particularly 0.5 minutes to 1 hour. The thermally annealed block copolymer self-assembles to form ordered domains whose orientation can be perpendicular to the underlying surface plane. In general, the SA layer can have a thickness of 100 to 10000 angstroms, more particularly 200 to 5000 angstroms, and even more particularly 300 to 2000 angstroms.

Second DSA

Optionally, after a first self-assembly step, all or substantially all of the first DSA layer comprising self-assembled SA material can be removed from the pre-pattern using at least one solvent. In one embodiment, all or substantially all the first DSA layer is removed from the pre-pattern by applying a layer of solvent on top of the first DSA layer and spinning the wafer dry. The application of a layer of solvent can be accomplished by any method known in the art, including puddling, spraying, and/or dipping. During the removal process, dynamic wafer agitation by controlled rotation or sonication may be employed to facilitate the removal of the first DSA layer. In another embodiment, a combination of solvents is used. In yet another embodiment, a combination of solvents is used in a sequential manner. In yet another embodiment, the wafer (substrate) is baked after the removal process to drive off any remaining solvent.

After the first DSA layer has been removed, what remains is a modified pre-pattern comprising elevated and recessed surfaces possessing the same or substantially the same wetting properties with respect to the SA material. It is believed, without being bound by theory, the elevated and recessed surfaces are slightly surface modified with SA material relative to the original pre-pattern. Thus, the residual SA material is underlayer material for a second SA layer. A second SA layer is then formed on the modified pre-pattern using the techniques described above in connection with forming the first SA layer. Specifically, a (second) solution is prepared comprising one or more SA materials dissolved in a solvent. The solution is cast onto the modified pre-pattern, followed by removal of the solvent, thereby forming a second SA layer. The second solution of SA material can additionally comprise other materials including polymers, block copolymers, surfactants, photoacid generators, and thermal acid generators. For example, an organosilicate resin can be included that is miscible with the poly(ethylene oxide) domains of poly(ethylene oxide-block-styrene) copolymer. The second SA layer is allowed or induced to self-assemble, and the resulting domains align as directed by the underlying modified pre-pattern to form a second domain pattern having fewer defects than the first domain pattern.

Herein, the term "defects" refers to those defects that arise from the DSA process itself, and is not meant to include routine fabrication defects that are not inherent in the DSA process (e.g., defects related to undesired foreign particles and/or material, and line collapse arising from removing one of the domains). Defects in a self-assembled cylindrical structure, for example, would include displacement errors, discontinuous cylindrical domains, and cylinders that do not extend through the SA film. Defects may also be orientational in nature, for example, domains may be oriented parallel to the substrate when a perpendicular orientation is desired.

Self-Assembly

Self-assembly of the SA material of the SA layer can occur during film formation, during a post-application bake, or during a subsequent annealing process. Suitable annealing processes include thermal annealing, thermal gradient annealing, solvent vapor annealing or annealing by other gradient fields. As with the first self-assembled structure, the second self-assembled structure comprises a first domain and a second domain of SA material. The first and the second domains comprise different components of SA material; that is, they are compositionally different. The first domain can, for example, comprise one block of a block copolymer, and the second domain can comprise a different block of a block copolymer.

Etching

One of the domains can be selectively removed (e.g., ion-etched) or modified in the presence of the other domain, to generate topographical or chemical contrast. Selective removal of one of the domains can also remove underlayer material and/or substrate layer material. The resulting relief pattern of openings can have a spatial frequency greater than that of the chemically patterned surface. The selective removal process can be carried out by a thermal bake (for thermally decomposable materials), a reactive ion etch process, dissolution in a selective solvent, or a combination thereof. A chemical modification can be accomplished by a variety of known methods. For example, domains can be selectively reacted with silanes or silyl chlorides to introduce silicon content into a domain and thereby increase its plasma etch resistance. Alternatively, chemical agents may be used to bind or chemically couple to functional groups that are exclusively located in one type of self-assembled domain, to effect, for example, increased solubility property differences that can advantageously be used to selectively remove one domain in the presence of the other domain. Chemical infiltration from a liquid phase also can be used to selectively deposit materials with high-etch resistance to one domain in the block copolymer. Sequential infiltration synthesis of high etch resistant materials can also be used to increase selective etch resistance of block copolymer domains (e.g., forming alumina in a PMMA domain by infiltrating trimethyl aluminum into the PMMA domain and reacting the trimethyl aluminum with water to form alumina).

The difference in the etch rates between two ordered domain regions of the block copolymer, and between the underlying materials of the elevated and recessed surfaces of the pre-pattern, allows the generation of complex and customized patterns. Selectively removing by etching, solvent or other means, at least one self-assembled domain, creates a nano-scale relief pattern comprising, for example, a pattern of line arrays that can be transferred into the underlying substrate. The line arrays can be further customized when transferred to the substrate.

Types of etching include any common etching applied in the manufacture of semiconductor devices, for example, dry-etching such as plasma etching, or wet-etching using selective solvents. Typically, dry etching processes are employed for etching at sub-50 nm dimensions.

Prior to this domain pattern development/pattern transfer, the self-assembled layer of SA material can be optionally chemically modified to improve properties necessary for pattern transfer, such as etch resistance or mechanical properties.

Pattern transfer can be facilitated by a material stack. The material stack can include a hardmask layer, an etch-resistant inorganic layer typically located above an organic transfer layer. The material stack can include an organic transfer layer directly underneath the chemical patterned layer. In one embodiment, the material stack can provide etch selectivity needed to transfer the composite pattern into underlying layers.

In certain cases, it may be desirable to invert the transferred pattern, which may be accomplished in a variety of ways. In an illustrative example, cavities formed by transfer of the pattern into the organic transfer layer may be filled with a fill material (backfill material), such as a spin-on dielectric (SOD) material, having etch selectivity relative to the organic transfer layer in an etch. Optionally, the fill material may be treated to promote cross-linking or hardening. The organic transfer layer can be removed selective to the fill material to form a complementary pattern including fill material portions.

Also disclosed is a layered structure formed by any of the above-described methods. In an embodiment, the layered structure is a semiconductor device. The method can be used to form layered structures comprising metal wiring lines, holes for contacts or vias, insulation sections (e.g., damascene trenches or shallow trench isolation), and trenches for capacitor structures suitable for the design of integrated circuit devices. The method can be useful for creating patterned layers of oxides, nitrides or polysilicon.

When the SA material is a block copolymer or blend containing a block copolymer, the method advantageously allows self-assembled structures having reduced feature width and increased periodicity relative to the pre-pattern feature(s). In this case, the domain feature width can be from 1 to 50 nm, from 1 to 30 nm, or more particularly from 1 to 20 nm. When the SA material is an immiscible polymer blend, the method permits a photoresist feature size less than 500 nm, more particularly less than 150 nm, and even more particularly less than 100 nm. The domain feature sizes tend to be larger, ranging from 1 to 500 nm, from 1 to 250 nm, or more particularly from 1 to 150 nm. Secondly, the method advantageously utilizes a self-assembled material with reduced feature size and an increased the periodicity relative to the pre-pattern.

The following non-limiting examples are provided to further illustrate the disclosed methods.

EXAMPLES

Materials used in the following examples are listed in Table 1.

TABLE 1

| ABBREVIATION | DESCRIPTION | SUPPLIER |
| --- | --- | --- |
| ODL-401 | Organic hardmask | Shin Etsu |
| SHB A-940 L10 | Silicon Anti-Reflection Coating Layer | Shin Etsu |
| PGMEA | Propylene Glycol Methyl Ether Acetate | Sigma-Aldrich |
| S | Styrene MW 104.15 | |
| MMA | Methyl Methacrylate | Sigma-Aldrich |
| GMA | Glycidyl Methacrylate; MW 142.2 | |
| AZ PME 120 | Poly(styrene-b-methyl methacrylate) block copolymer, PS-b-PMMA, Mn = 22000 of each block | AZ Electronic |
| ArF AIM7210JN-8 | 193i Photoresist | JSR |
| P(S-r-EDCPMA) | Poly(styrene-co-epoxydicyclopentadiene methacrylate) random copolymer | |
| AZ NLD 201 | Material for forming a neutral layer | AZ Electronic |
| TMAH | 0.26N Tetramethylammonium hydroxide, developer solution, OPTIYIELD CD | Fuji Film |
| HM8500 | Carbon Hard Mask Layer | JSR |
| AZ PME 751 | PS-b-PMMA block copolymer, 27.5 nm pitch | AZ Electronic |
| AZ NLD 226 | Surface modification materials | AZ Electronic |
| P(S-r-EDCPMA) | poly(styrene-co- epoxydicyclopentadiene methacrylate) random copolymer (S:EDCPMA = 70:30 by mole, Mn = 5800) | Prepared below |
| P(S-r-MMA-r-GMA) | Poly(styrene-co-methyl methacrylate-co-glycidylmethacrylate) random copolymer (ratio of S:MMA:GMA = 56:42:2 by mole, $M_n$ = 12.1 kg/mol) | Prepared below |
| HSQ | XR-1541 negative-tone hydrogen silsesquioxane electron beam resist. | Dow Corning |
| QZ3501 | Edge bead remover; gamma-butyrolactone/butyl acetate developer | Fuji Film |

Preparation of P(S-r-MMA-r-GMA) and its Formulation.

Poly(styrene-co-methyl methacrylate-co-glycidyl methacrylate) random copolymer was prepared by free-radical polymerization of styrene, methyl methacrylate, and glycidyl methacrylate in a molar feed ratio of 58:40:2 (isolated polymer composition: 56:42:2 as determined by $^{13}$C NMR). Mn=12.1 kg/mol. PDI: 1.59. A PGMEA solution of P(S-r-MMA-r-GMA) and p-NBT (p-nitrobenzyltosylate) [95:5 w/w ratio] was used as the formulation for forming an underlayer for PS-b-PMMA. See Cheng et al., "Simple and Versatile Methods To Integrate Directed Self-Assembly with Optical Lithography Using a Polarity Switched Photoresist", ACS Nano, 2010, 4, 4815-4823 for details regarding preparation of this material.

Preparation of P(S-r-EDCPMA) and its Formulation

Poly(styrene-co-epoxydicyclopentadiene methacrylate) random copolymer, P(S-r-EDCPMA), was prepared by free-radical polymerization of styrene and epoxydicyclopentadiene methacrylate in a mole ratio of 70:30 according to the method described in U.S. Pat. No. 7,521,090, Mn=5819 g/mol. PDI: 1.51. A PGMEA solution of poly(styrene-co-epoxydicyclopentadiene methacrylate) and N-phthalimide triflate [95:5 w/w ratio] was used as the formulation for forming an underlayer for SA material PS-b-PMMA.

Example 1

Exemplary working DSA on various hybrid pre-patterns prepared by backfill process. Layer diagrams are provided below for clarity.

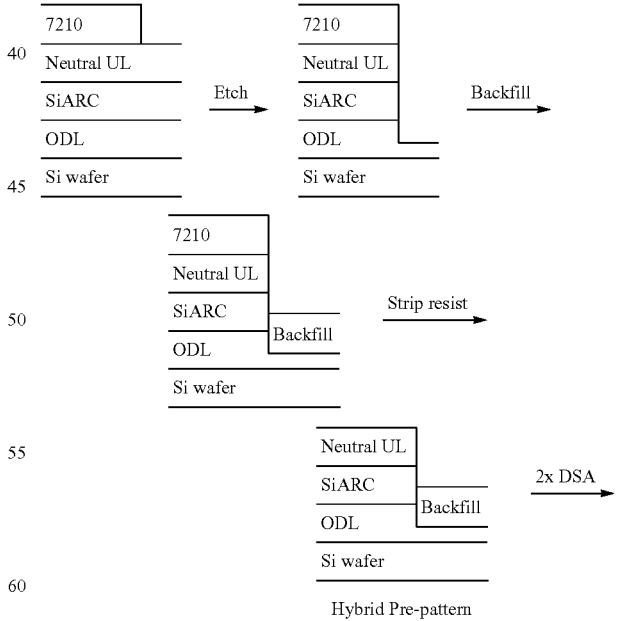

Hybrid Pre-pattern

A silicon wafer substrate (5 inch diameter) was coated with a 50 nm thick organic hard mask ("ODL", Shinetsu ODL-401) and 10 nm thick silicon anti-reflection coating layer ("SiARC", Shinetsu SHB A-940 L10) to form the building stack of the hybrid pre-pattern. The stack was treated with an oxygen reactive-ion etch (O2 RIE) for 45 seconds to oxidize the SiARC surface. A PGMEA solution containing a random copolymer of styrene (S), methyl methacrylate (MMA) and glycidyl methacrylate (GMA), P(S-r-MMA-r-GMA)) and a thermal acid generator was then cast on the oxidized SiARC stack, baked at 215° C. for 2 minutes, and rinsed with PGMEA to remove any non-crosslinked P(S-r-MMA-r-GMA), forming a neutral underlayer (neutral UL). The neutral UL was neutral wetting to the SA material, a poly(styrene)-b-poly(methyl methacrylate) block copolymer (PS-b-PMMA) used below). The P(S-r-MMA-r-GMA) is referred to as "neutralization material". A 60 nm thick 193i photoresist ("7210", JSR ArF AIM7210JN-8) layer was then coated on the top surface of the neutral UL. The resist layer was pattern-wise exposed with 193 nm interference lithography and developed in negative tone (non-exposed areas removed) with an organic developer (2-heptanone) to produce a grating pre-pattern having a pitch of 168 nm, 196 nm, and 224 nm allowing a 6×, 7×, and 8× multiplication of self-assembled lamellar domains, respectively, for the block copolymer PS-b-PMMA having a 28 nm pitch.

The resist pattern was then transferred into the underlying substrate by a series of reactive-ion etches (5 seconds O2 RIE, 10 seconds CF$_4$/H$_2$ RIE and 10 seconds O2 RIE), generating oxidized ODL layer at the bottom of the trenches and etched resist as the mesa. A polarity switch/hardening process was carried out by exposing the resist pattern to a broadband deep ultraviolet (DUV) light from a Hg/Xe 500 W short-arc lamp (UXM-501MA-Ushio America) with a total flood exposure dose of 60 mJ/cm$^2$, followed by a hard-bake at 95° C. for 60 seconds, and at 200° C. for 180 seconds. After hardening the resist, a PGMEA solution containing poly(styrene-co-epoxydicyclopentadiene methacrylate) random copolymer, P(S-r-EDCPMA), a non-neutral wetting backfill material, and thermal acid generator was then cast on the hardened pre-pattern and baked at 200° C. for 2 minutes. The concentration and spin rate of the backfill material were adjusted to avoid filling the trenches up to the resist features (i.e., the top surface of the backfill material was below the bottom interface of the resist features and the neutral UL). The backfilled pre-pattern was then brought into contact with a standard aqueous alkaline developer, 0.26 N tetramethylammonium hydroxide (TMAH) for 30 seconds, followed by de-ionized water (DI water) rinse to remove the hardened resist pattern. The resulting hybrid pre-pattern comprised alternating recessed surfaces comprising non-neutral wetting backfill material and neutral wetting elevated surfaces. The sidewalls had a height $H_N$ of about 0.5 Lo. The sidewalls have a preferential affinity for one domain of the self-assembled SA material. In this example, stripping of the resist did not substantially alter the the neutral wetting properties of the neutral UL surface (elevated surfaces).

A PGMEA solution of the SA material (AZ Electronic PME 120, poly(styrene)-b-poly(methyl methacrylate) block copolymer (PS-b-PMMA)), was then spin-coated on the backfilled pre-pattern at 1500 rpm and the sample was annealed at 255° C. for 5 minutes to form a first DSA structure. After a single DSA process was carried out, a solvent rinse was done by casting PGMEA on the first DSA structure for 30 seconds and spinning dry the sample to remove any solvent and all or substantially all of the DSA structure. Another spin-coating of AZ PME 120 was then carried out at 1500 rpm and the sample was annealed at 255° C. for 10 minutes to generate a second DSA structures having fewer defects than those of the first DSA structures. A short O2 RIE was applied to partially remove the PMMA domain of the DSA structures and increase the contrast between the PMMA and the PS domains for scanning electron microscopy (SEM) characterization purposes.

FIG. 8 shows the self-assembled block copolymer over a variety of hybrid pre-patterns having different geometry combinations of $W_E$ and $W_R$. $W_E$ is the width of the elevated features comprising a neutral layer on slabs of SiARC, and $W_R$ is the width of the recessed surfaces comprising backfill material P(S-r-EDCPMA) in the trenches. Self-assembly of the SA material forms a 28 nm pitch line perpendicularly oriented lamellar line pattern on the elevated surfaces, which are neutral wetting and have underlying material of high etch resistivity. The PS lines (lamellae) can be transferred to the inorganic SiARC slabs to form a composite mask for customizing the DSA arrays. In this example, $W_E+W_R=6$ Lo, 7 Lo or 8 Lo (integer times Lo). As shown in FIG. 8, good DSA was obtained on hybrid pre-patterns having various combinations of $W_E$ and $W_R$. Good DSA was also obtained on the hybrid pre-patterns when $W_E$ had a value other than 0.5 Lo or 1.5 Lo (e.g., when $W_E$ was about 2 Lo, 3 Lo, 4 Lo, or 5 Lo), which is not expected based on conventional chemoepitaxy.

Example 2

Determination of $W_E$ process window for DSA on hybrid pre-patterns prepared by backfill process. The general layer diagrams of Example 1 apply to Example 2.

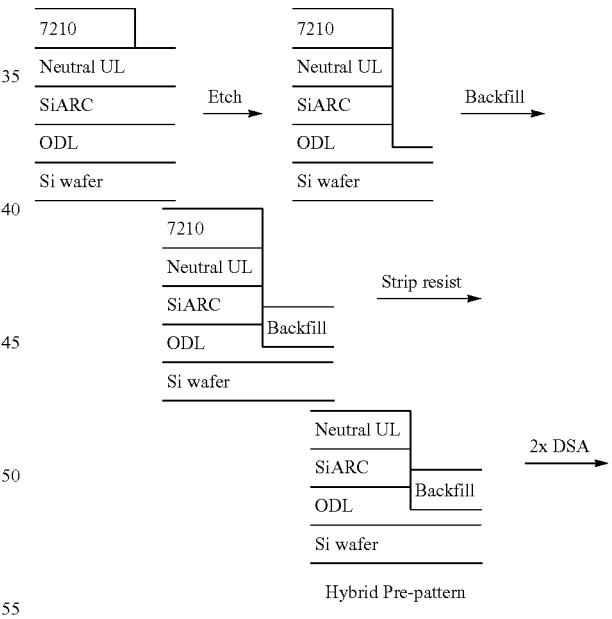

Silicon wafer substrates were coated with 50 nm thick organic hard mask (Shinetsu ODL-401) and 10 nm thick SiARC (Shinetsu SHB A-940 L10) to form the building stacks of the hybrid pre-patterns. The stack was treated with O2 RIE for 50 seconds to oxidize the SiARC surface. P(S-r-MMA-r-GMA) with thermal acid generator was then cast on the oxidized SiARC stack, baked at 215° C. for 2 minutes, and rinsed with PGMEA to remove any non-crosslinked material to form a neutral UL. A 60 nm thick 193i photoresist (JSR ArF AIM7210JN-8) was then coated on top of the neutral UL, pattern-wise exposed with e-beam lithography (EBL), and developed in the negative tone with an organic developer (2-heptanone) to produce a grating pre-pattern allowing 6× multiplication of self-assembled block copolymer having a 28 nm pitch. The pre-patterns consisted of a number of dies that were 8.5 micrometers×5.8 micrometers in size. The pitch of each die was kept constant while the trench width was systematically varied from 41 nm to 118 nm with a step size of 2 nm to 3 nm.

The EBL test patterns were then transferred into the substrate by a series of RIE etches (5 seconds O2 RIE, 11 seconds CF$_4$ RIE, and 10 seconds O2 RIE). A polarity switch/hardening process was carried out by exposing the etched pre-pattern to a broadband DUV light from a Hg/Xe 500 W short-arc lamp (UXM-501MA-Ushio America) with a total flood exposure dose of 60 mJ/cm$^2$, followed by a hard-bake at 95° C. for 60 seconds and 200° C. for 180 seconds. After hardening the resist, a non-neutral backfill material P(S-r-EDCPMA) with thermal acid generator was then cast on the hardened pre-pattern and baked at 200° C. for 3 minutes. The concentration and spin rate of the backfill material were adjusted to avoid filling the trenches up to the resist features (i.e., the top surface of the backfill material was below the bottom surface of the neutral UL). In this case a 0.2% solution was spin cast at 4000 rpm. The backfilled pre-pattern was then brought into contact with a standard aqueous alkaline developer (0.26N TMAH) for 60 seconds, followed by DI water rinse to remove the hardened resist pattern. The resulting hybrid pre-pattern contained neutral wetting elevated surfaces on slabs of neutral UL/SiARC, and non-neutral recessed stripes containing the backfill material disposed in the trenches. The sidewall height difference, $H_N$, between these two regions was 0.5 Lo. SA material (block copolymer solution AZ PME 120) was then spin-coated on the hybrid pre-pattern at 1500 rpm and the sample was annealed at 255° C. for 5 minutes to form the first DSA structures. After a single DSA process was carried out, a solvent rinse was done by casting PGMEA on the first DSA structure for 30 seconds and spinning the sample dry to remove any solvent and all or substantially all of the DSA structure. Another spin-coating of AZ PME 120 was then carried out at 1500 rpm and the sample was annealed at 255° C. for 10 minutes to generate the second DSA structures having fewer defects than those of the first DSA structures. The DSA structures were then etched using O2 RIE such that both the block copolymer domains and the underlying pattern can be seen. The patterns can be transferred into the stack by performing a carefully measured CF$_4$ RIE followed by O2 RIE. The samples were imaged top-down using SEM.

Figure 9:
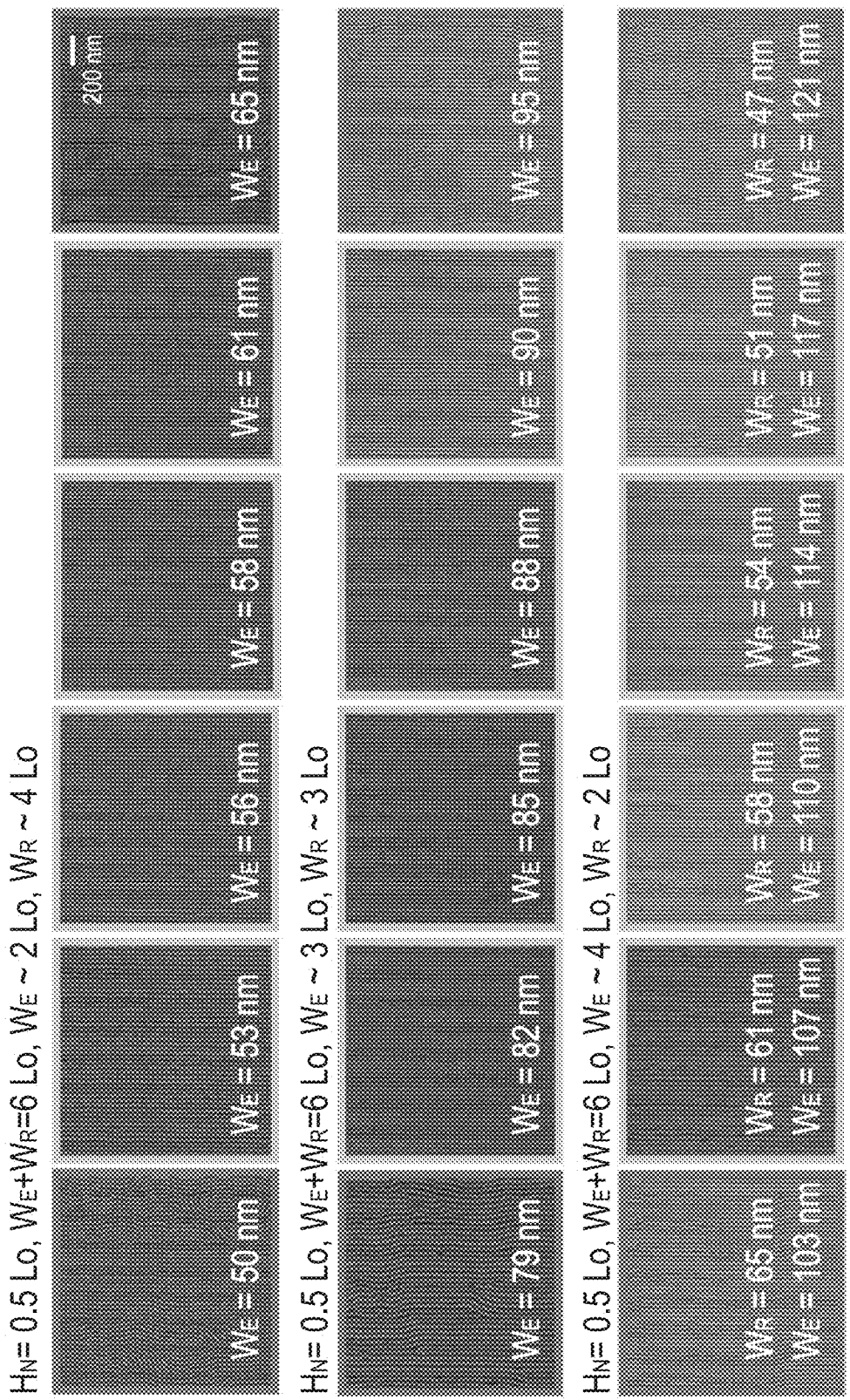
FIG. 9 is a series of plane view SEM images showing an exemplary process window for good DSA (Example 2). A process window of about 10 nm for $W_E$ was observed in each of three different cases where $W_E$ is about 2 Lo, 3 Lo, and 4 Lo at constant $W_E+W_R=6$ Lo.

FIG. 9 is a series of SEMs showing the amount of variation in width of elevated surfaces $W_E$ for good DSA when $W_E$ is set to different integer multiples of Lo. In this series, $W_E+W_R=6$ Lo. When $W_E$ was approximately 2 Lo (56 nm), good DSA was achieved over the hybrid pre-pattern when $W_E$ was in a range of about 53 nm to 61 nm. When $W_E$ was approximately 3 Lo (84 nm), good DSA was achieved when $W_E$ was in a range of about 82 nm to 90 nm. When $W_E$ was approximately 4 Lo (112 nm), good DSA was achieved when $W_E$ was in a range of 107 nm to 117 nm. These ranges (8-10 nm) represent reasonable process windows for $W_E$.

Example 3

DSA and customization of DSA arrays over hybrid pre-patterns (basic process). The following layer diagrams are provided for clarity.

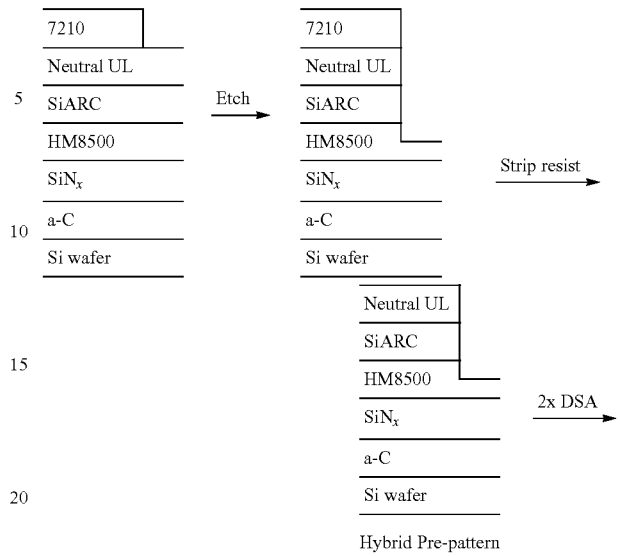

Figure 10A:
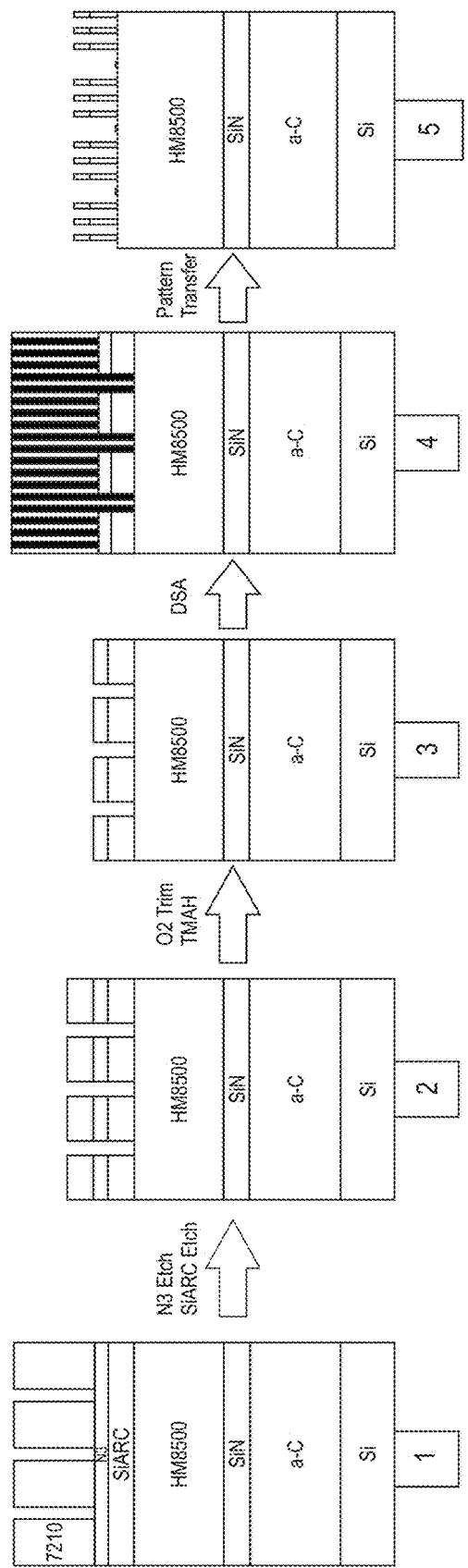
FIG. 10A is a series of cross-sectional layer diagrams showing the process flow of Example 3 of i) preparing two hybrid pre-patterns labeled "wide" and "narrow" from a patterned resist/stack (step 3), ii) using the pre-patterns to form a perpendicularly oriented domain pattern by directed self-assembly (step 4), and iii) transferring the resulting pattern to form a customized line pattern (step 5). The step number appears in the square box below each layer diagram.
Figures 10B, 10C, 10D:
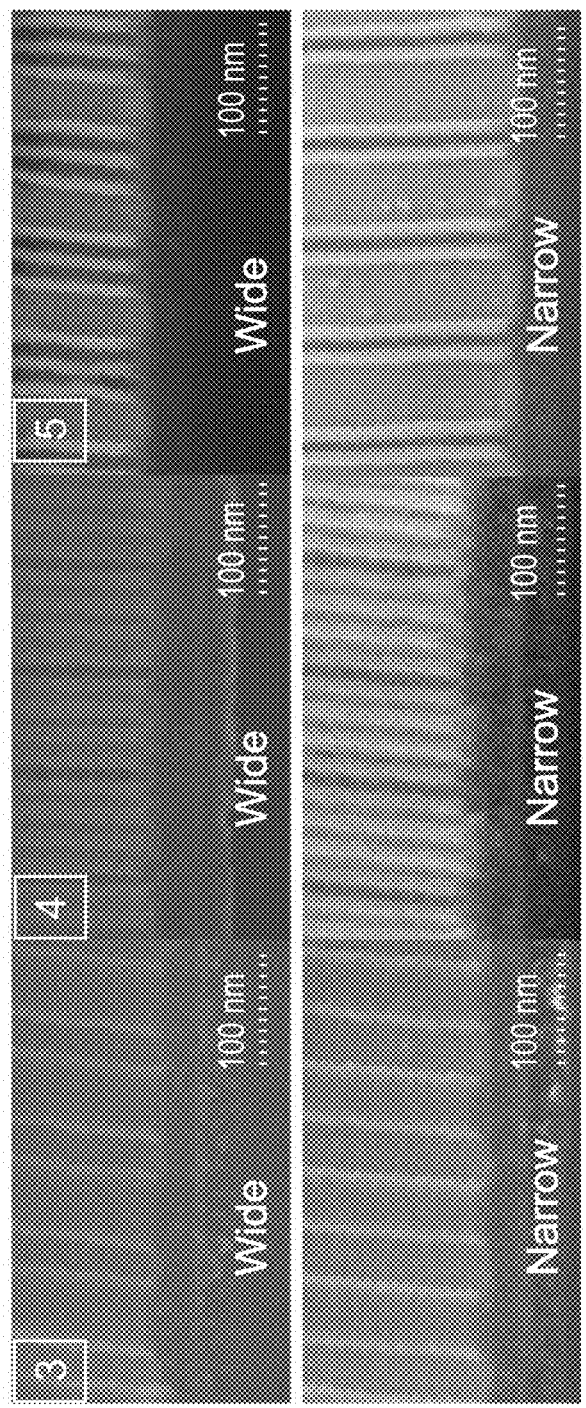
FIG. 10B is a pair of SEMs labeled "wide" and "narrow" of the hybrid pre-patterns prepared by the process of FIG. 10A (Example 3). The "3" in the box corresponds to step 3 in FIG. 10A.
FIG. 10C is a pair of SEMs labeled "wide" and "narrow" of self-assembled line patterns (DSA patterns) formed using the hybrid pre-patterns of FIG. 10B (Example 3). The "4" in the box corresponds to step 4 in FIG. 10A.
FIG. 10D is a pair of SEMs labeled "wide" and "narrow" of transfer patterns formed using the DSA patterns of FIG. 10C (Example 3). The "5" in the box corresponds to step 5 in FIG. 10A.

FIG. 10A is a series of cross-sectional layer diagrams showing the basic process flow of Example 3 to prepare two hybrid pre-patterns from a patterned resist/stack, with the steps numbered in square boxes below the diagram. The corresponding SEM images for the two hybrid pre-patterns are shown in FIG. 10B, labeled "wide" and "narrow", with the corresponding step number of FIG. 10A labeled in the square box. DSA line patterns over the hybrid pre-patterns are shown in FIG. 10C, labeled "wide" and "narrow", with the step number of FIG. 10A labeled in the square box. Customized patterns are shown in FIG. 10D, labeled "wide" and "narrow", with the step number of FIG. 10A labeled in the square box. The procedure was as follows.

A stack having a 9 nm silicon antireflection layer ("SiARC", Shinetsu SHB A-940 L9) and 35 nm carbon hard mask layer ("HM8500", JSR HM8500) was prepared on top of a 10 nm SiNx layer ("SiN$_x$") and a 30 nm amorphous carbon layer ("a-C") that were deposited by chemical vapor deposition (CVD) process on a silicon substrate. The stack was treated with O2 RIE for 45 seconds to have the SiARC surface oxidized. P(S-r-MMA-r-GMA) with thermal acid generator was then cast on the oxidized SiARC stack, baked at 215° C. for 2 minutes, and rinsed with PGMEA to remove any non-crosslinked material, thereby forming a neutral UL. A 60 nm thick 193i photoresist (JSR ArF AIM7210JN-8) was then coated on top of the neutral UL (labeled "N3" in FIG. 10A) stack, pattern-wise exposed with 193 nm interference lithography, and developed in negative tone with an organic developer (2-heptanone) to produce grating pre-pattern with pitch of 100 nm allowing a 4× multiplication for a block copolymer with 25 nm pitch (FIG. 10A, step 1).

The resist pre-pattern was then transferred into the neutral UL/SiARC/HM8500 layers by a series of RIE etches (4 seconds O2 RIE, 9 seconds CF$_4$/H$_2$ RIE and 10 seconds O2 RIE), generating oxidized HM8500 layer at the bottom of the trenches and etched resist as the mesa (FIG. 10A, step 2). The treated substrate was then brought into contact with a standard aqueous alkaline developer (0.26N TMAH) for 30 seconds, followed by deionized (DI) water rinse to remove the hardened resist to form a hybrid pre-pattern comprising neutral elevated surfaces on slabs of neutral UL/SiARC, and recessed stripes comprising the oxidized HM8500 material in the trenches (FIG. 10A, step 3). Sidewalls had height $H_N$ of about 0.5 Lo. In this example, stripping the resist did not adversely affect the neutral wetting properties of the elevated surfaces.

The corresponding SEM images of FIG. 10B labeled "3") show the topography of the hybrid pre-pattern with different widths $W_E$ of elevated surfaces next to the recessed stripes (oxidized HM8500). The wider stripes are the elevated surfaces in FIG. 10B wide and FIG. 10B narrow.

A 2 wt % solution (based on total weight of the solution) of SA material (PS-b-PMMA block copolymer from Polymer Source, Mn of each block 22k-22k, 25 nm pitch) in PGMEA was spin-coated on the hybrid pre-pattern at 1500 rpm for 30 seconds and annealed at 255° C. for 5 minutes to form a first directed self-assembled structure. After a single DSA process was carried out, a solvent rinse was done by casting PGMEA on the first DSA structure for 30 seconds and spinning dry the sample to remove any solvent and all or substantially all of the DSA structure. Another spin-coating of the solution of PS-b-PMMA block copolymer in PGMEA was then carried out at 1500 rpm and the sample was annealed at 255° C. for 5 minutes to generate a second DSA structure having fewer defects than those of the first DSA structure (FIG. 10A, step 4). The process was repeated for two different $W_E$ widths labeled wide and narrow.

The PMMA domain was removed to show the PS lines (FIG. 10C, SEM images). FIG. 10C wide shows 3 PS lines on each wider elevated neutral stripe. FIG. 10C narrow shows 2 PS lines on each narrower elevated neutral stripe.

Customization of DSA arrays. The aligned PS lines over the SiARC were used as the etch mask for subsequent etch of the SiARC layer to form the structure of FIG. 10A, step 5. The corresponding SEM images show the etched SiARC/HM8500 pattern, with three SiARC/HM8500 lines (FIG. 10D wide) or two SiARC/HM8500 lines (FIG. 10D narrow), respectively.

Although not shown, the etch selectivity of SiARC against HM8500 under 02 RIE gas allows the resulting etched SiARC pattern to be used as the etch mask for the HM8500 layer. Depending on the width of the elevated surfaces, one or two lines cut in the HM8500 layer can be achieved.

Example 4

DSA on hybrid pre-patterns prepared by surface modification process.

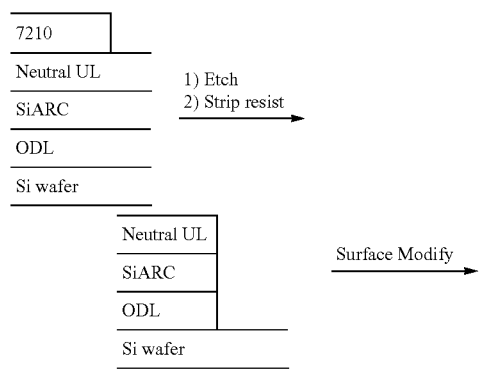

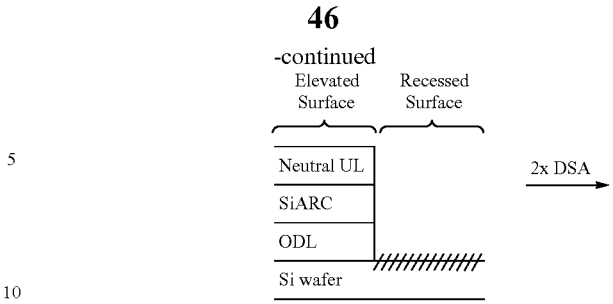

Silicon substrates were coated with 50 nm thick organic hard mask (Shinetsu ODL-401) and 10 nm thick SiARC (Shinetsu SHB A-940 L10) to form the building stack of the pre-pattern. The stack was treated with O2 RIE for 45 seconds to oxidize the SiARC surface. A neutralization material P(S-r-MMA-r-GMA) with thermal acid generator was then cast on the oxidized SiARC stack, baked at 215° C. for 2 minutes, and rinsed with PGMEA to remove any non-crosslinked material, thereby forming a neutral UL. A 60 nm thick 193i photoresist (JSR ArF AIM7210JN-8) was then coated on top of the neutral layer, pattern-wise exposed using 193 nm interference lithography, and developed in the negative tone with an organic developer (2-heptanone) to produce a grating pre-pattern with pitch of 224 nm allowing an 8× multiplication for a block copolymer with 28 nm pitch ($W_E+W_R$=8 Lo, Lo=28 nm). The resist pre-pattern was then transferred into the neutral layer and ODL layer by a series of RIE etches (5 seconds O2 RIE, 7 seconds $CHF_3$ RIE and 10 seconds 02 RIE), generating oxidized ODL layer (organic hard mask) at the bottom of the trenches and etched resist at the mesa. The pre-pattern was brought into contact with a standard aqueous alkaline developer (0.26N TMAH) for 30 seconds, followed by DI water rinse and a rinse in QZ 3501 (Fuji film). A solution of a non-neutral surface modification material (AZ Electronic materials NLD 226, a poly(styrene) brush) was then spin-cast on the pre-pattern at 1500 rpm and baked at 110° C. for 5 minutes, followed by n-butyl acetate rinse to remove any non-grafting AZ NLD 226 material. The elevated surfaces were neutral wetting after the surface modification. The recessed surfaces were non-neutral wetting. The elevated surfaces and recessed surfaces were separated by a height $H_N$=0.5 Lo. DSA structures were formed by spin coating AZ PME 120 block copolymer solution on the pre-pattern at 1500 rpm and annealing the sample at 255° C. for 5 minutes. Short O2 RIE was applied to partially remove the PMMA domain of the DSA structures and increase the contrast between PMMA and PS domains for the SEM characterization purposes.

Figure 11A:
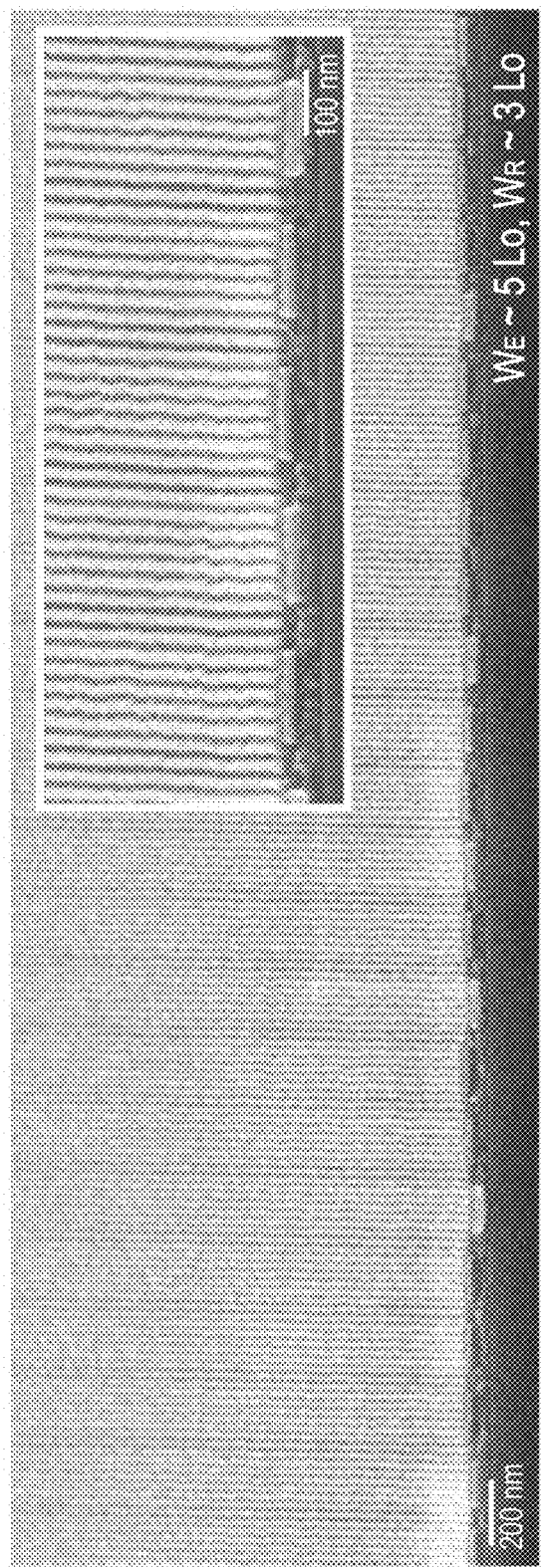
FIGS. 11A-11C are plane view SEMs of DSA patterns formed using hybrid pre-patterns of Example 4 prepared by surface modification of the recessed surfaces. Width $W_E$ of the elevated stripe and the width $W_R$ of the adjacent recessed stripe were varied at constant $W_E+W_R=8$ Lo. Each of the DSA patterns was a unidirectional array pattern.
Figure 11B:
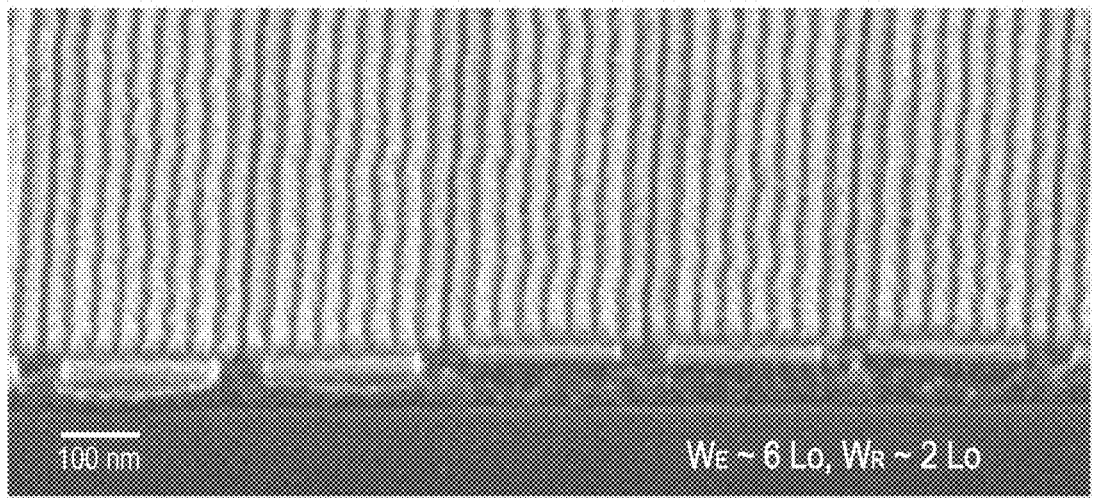
Figure 11C:
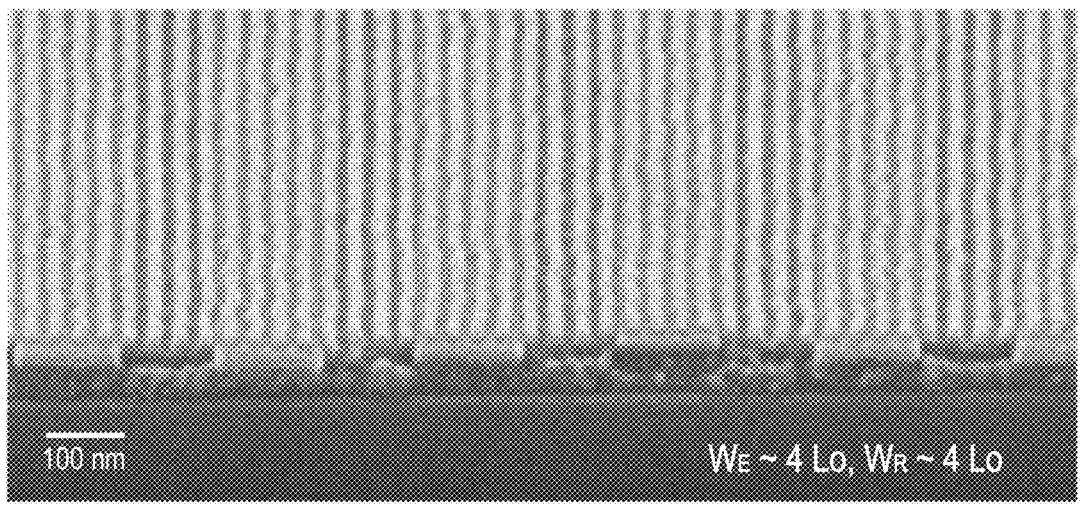

FIGS. 11A-11C (SEMs) show good DSA was achieved over the surface modified hybrid pre-pattern. When $W_E$~5 Lo (width of elevated neutral stripe on SiARC slabs), 5 PS lines were aligned on the elevated stripes and 3 PS lines were aligned on the recessed stripes of the surface modified trenches FIG. 11A. When $W_E$~6 Lo, 6 PS lines were aligned on the elevated stripes and 2 PS lines were aligned on the recessed stripes (FIG. 11B). When $W_E$~4 Lo, 4 PS lines were aligned on the elevated stripes and 4 PS lines were aligned on the recessed stripes (FIG. 11C).

Example 5

DSA and pattern transfer on hybrid pre-patterns prepared using a wafer of 300 mm diameter and surface modification process.

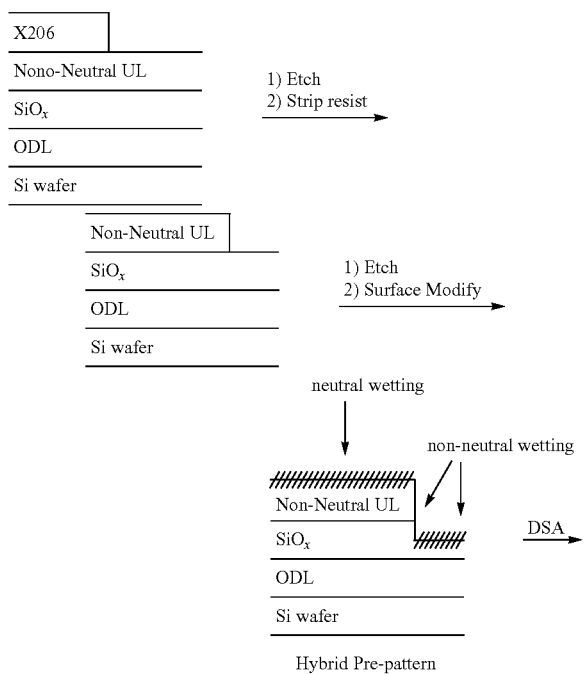

Hybrid Pre-pattern

Figure 12:
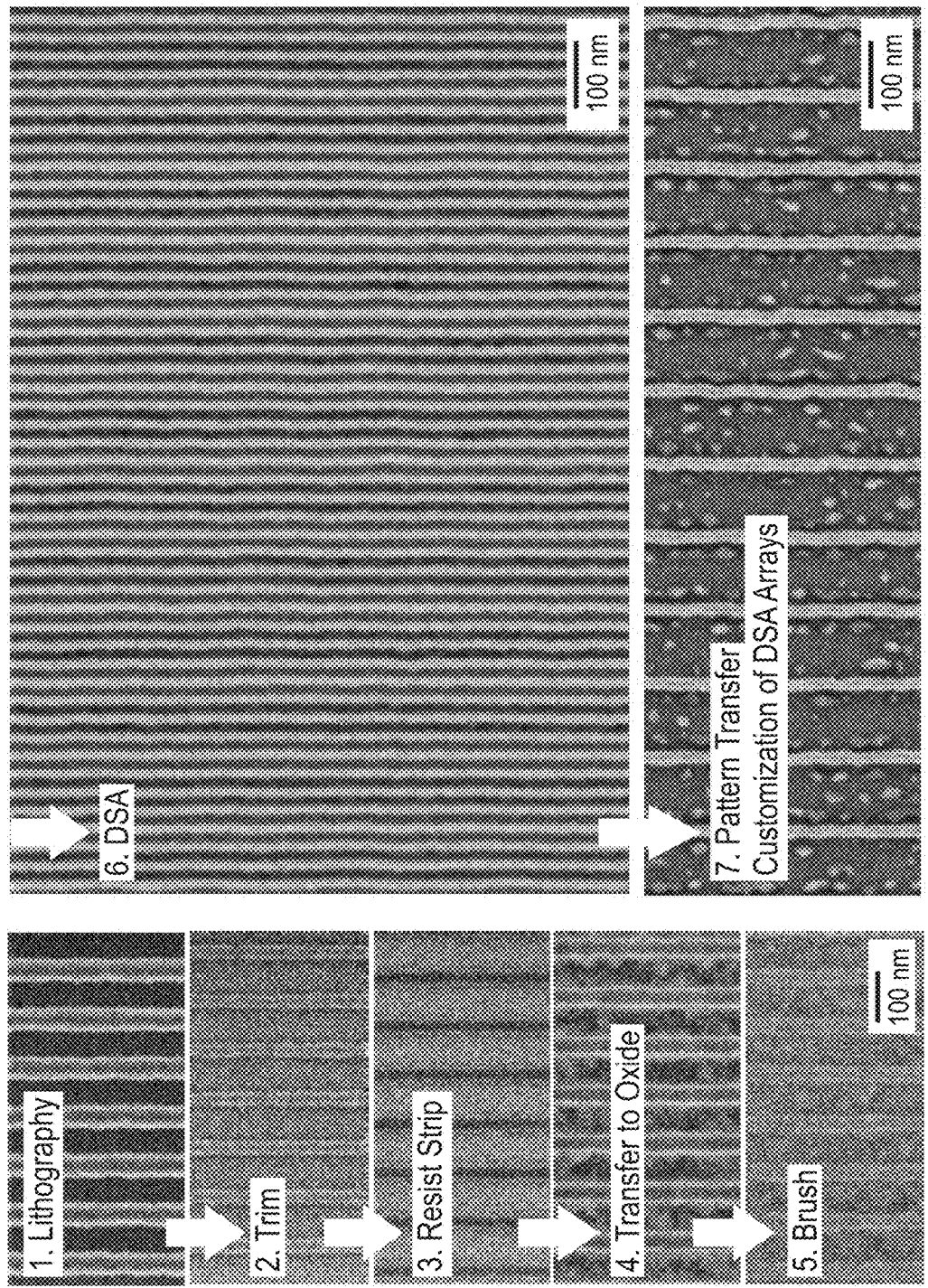
FIG. 12 is a series of plane view SEMs showing line pattern obtained at each process step of forming a customized array pattern (Example 5). The hybrid pre-pattern of Example 5 was prepared by surface modification of the recessed surfaces using a brush polymer.

Lithography and stack. A stack was prepared having a 5 nm silicon oxide layer ("SiO$_x$") formed by atomic layer deposition (ALD) on a 50 nm carbon hard mask layer ("ODL", Shinetsu ODL-410) on a silicon substrate. The ALD oxide layer was coated with a non-neutral material (AZ NLD 201), baked at 250° C. for 2 minutes, and rinsed with PGMEA to remove any non-crosslinked material, thereby forming neutral UL on the ALD oxide layer. This high PS non-neutral UL (~75 mol % PS) was chosen in order to provide a neutral surface on the ALD oxide after the process of fabrication of the hybrid pre-pattern. A 60 nm thick 193i photoresist (Shinetus X206) was then coated on top of the neutral layer, pattern-wise exposed with 193i stepper, and developed in the negative tone with n-butyl acetate to produce a grating pre-pattern ("X206") with a pitch of 110 nm allowing a 4× multiplication for a block copolymer with 27.5 nm pitch (FIG. 12, SEMs with process steps numbered, step 1). The patterned resist was trimmed, which resulted in narrower resist lines (FIG. 12, step 2).

The resist pattern was then transferred into the non-neutral UL (NLD 201 layer) using O2 RIE. The treated substrate was then brought into contact with a standard aqueous alkaline developer (0.26N TMAH) for 30 seconds, followed by DI water rinse to remove the resist (FIG. 12 step 3). The patterned NLD 201 was used as the mask for etching the ALD oxide using a COR process (vapor phase HF etch) (FIG. 12 step 4). A solution of surface modification material (AZ Electronic materials NLD 226, brush polymer) was then spin-cast on the pre-pattern at 1500 rpm and baked at 150° C. for 2 minutes, followed by n-butyl acetate rinse to remove any non-grafted AZ NLD 226 material (FIG. 12, step 5) to form a surface modified hybrid pattern. The elevated surfaces (NLD 201 layer after all fabrication steps) and recessed surfaces (modified by NLD 226 in the last fabrication step, brush polymer) were separated by a height $H_N$ of about 0.2 Lo. The modified elevated surfaces were neutral wetting to the SA material. The modified recessed surfaces and sidewalls were non-neutral wetting to the SA material.

A PGMEA solution of PS-b-PMMA block copolymer (AZ PME 751, 27.5 nm pitch) for self-assembly was spin-coated on the surface modified hybrid pattern at 1500 rpm for 30 seconds and annealed at 250° C. for 5 minutes in nitrogen to form a DSA structure. Clean 4× frequency multiplication was obtained. In this example, one application of block copolymer was used. PMMA was removed by a RIE step, leaving well-aligned PS lines. Out of a set of 4 PS lines, one PS line was on the elevated stripes (ALD oxide stripe having a neutral surface). The other 3 PS lines were aligned on the surface modified ODL stripe in the trenches (FIG. 12 step 6). The PS lines on top of the ALD oxide stripes are used as the etch masks during the subsequent pattern transfer into ALD oxide layer and ODL layer. The customized arrays where 3 lines were removed out of original 4 lines is shown in FIG. 12 Step 7. The remaining line is an oxide/ODL line.

Examples 6A-6B

Two-dimensional (2D) customization using DSA on hybrid pre-patterns prepared by surface modification of patterned resist.

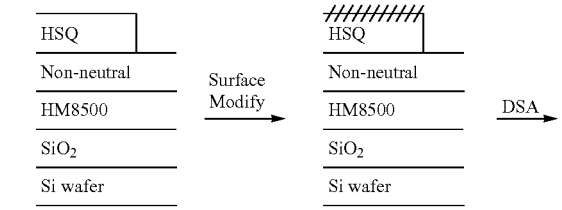

Figure 13A:
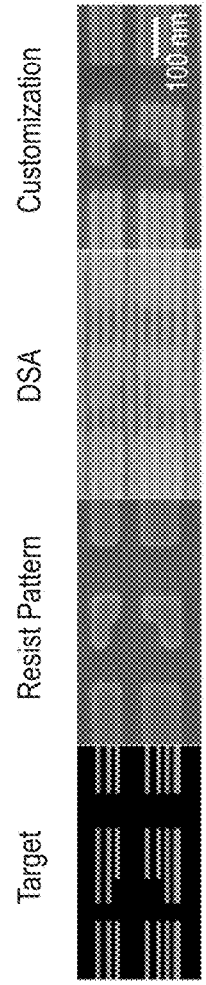
FIG. 13A is a series of images showing two-dimensional customization (Example 6A) for forming a target pattern with a modulated line cut. The hybrid pre-pattern was prepared by surface modification of resist features (HSQ resist). The images include the target 2D pattern, the corresponding plane-view SEM images of resist pattern, the DSA pattern, and customization results after transferring the DSA pattern. The transfer pattern contained the various tapers in the line cut target.
Figure 13B:
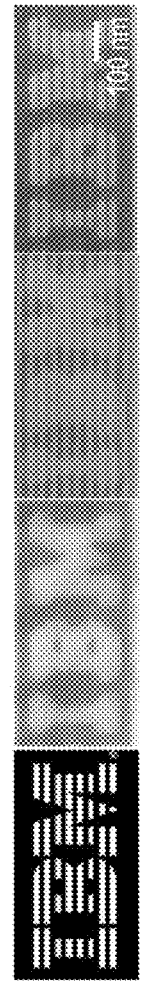
FIG. 13B is a series of images showing two-dimensional customization (Example 6B) to form a target pattern of "IBM". The hybrid pre-pattern was prepared by surface modification of resist features (HSQ resist). The images include the target 2D pattern, the corresponding plane-view SEM images of the resist pattern, the DSA pattern, and customization results after transferring the DSA pattern to the resist layer. The transfer pattern contained the IBM logo.

Targets of 2D customization were a modulated line cut target (Example 6A, FIG. 13A) and "IBM" target (Example 6B, FIG. 13B). A key pre-pattern is designed to generate the target patterns with 25 nm pitch of the lines. Outside the key pattern area, gratings of 75 nm pitch (3× multiplication) are used as the fill. Silicon substrates ("Si wafer") with 1 micrometer of SiO$_2$ as the top layer ("SiO$_2$") were used for these experiments. On these substrates, a 35 nm thick organic hard mask (HM8500) layer was formed ("HM8500"). On top of the HM8500 layer, a solution containing P(S-r-EDCPMA) was coated and baked at 200° C. for 3 minutes to form a non-neutral layer. The non-neutral layer provides a preferential wetting surface for PMMA domains in the recessed areas. Following this step, a 6 nm HSQ resist ("HSQ") was coated, exposed with e-beam lithography (EBL) and developed in the non-exposed area with a standard aqueous alkaline developer (0.26N TMAH). FIG. 13A-resist and FIG. 13B-resist are the SEM images of HSQ pattern (the cut mask) after exposure and development. The HSQ resist is non-neutral wetting to the SA material.

The hybrid pre-pattern was prepared by surface modification of the HSQ resist pattern with a neutral brush to generate elevated HSQ features having neutral wetting surfaces, as follows. A neutralization material P(S-r-MMA) brush (0.7% in PGMEA) was coated at 2000 rpm for 30 seconds and baked at 185° C. for 20 minutes, followed by a PGMEA rinse. The elevated surfaces (neutral brush on HSQ) and recessed surfaces (non-neutral, containing P(S-r-EDCPMA) were separated by a height $H_N$=0.6 Lo. The recessed surfaces can contain neutralization material, but it is not in sufficient amount to adversely affect self-assembly.

The elevated surfaces are neutral to the SA material. The recessed surfaces and sidewalls are non-neutral to the SA material.

A 2 wt % solution containing a 90/10 by weight blend of PS-b-PMMA block copolymer (22 k-22 k, ~25 nm pitch) and PMMA (2.5 k), respectively, was then spin-coated on the stack at 3000 rpm for 30 seconds and annealed at 260° C. for 5 minutes under ambient environment to form a DSA pattern over the hybrid pre-pattern. One application of block copolymer was used. The PMMA domains of the DSA structure were then etched using O2 RIE such that both the block copolymer domains and the underlying pattern could be seen. FIG. 13A-DSA and FIG. 13B-DSA show well aligned PS gratings overlaying the recessed surfaces and elevated surfaces of the hybrid pre-patterns. The PS lines were then used as the etch mask to pattern the HSQ layer and the HM8500 layer by performing a carefully timed $CF_4$ RIE, followed by O2 RIE. FIG. 13A-Customization and FIG. 13B-Customization show the SEM images of the customized DSA arrays as target patterns.

Example 6C

Two-dimensional customization using DSA on hybrid pre-pattern prepared by backfill process.

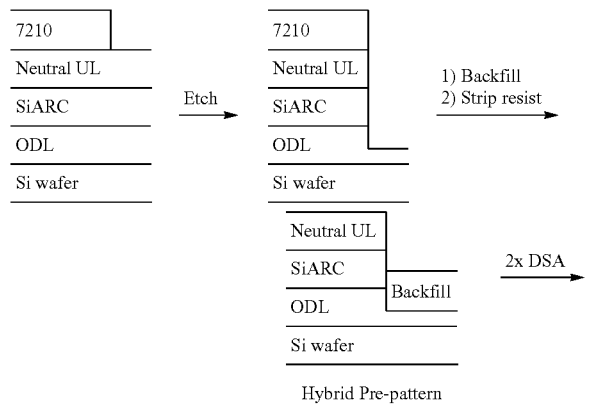

Figure 13C:
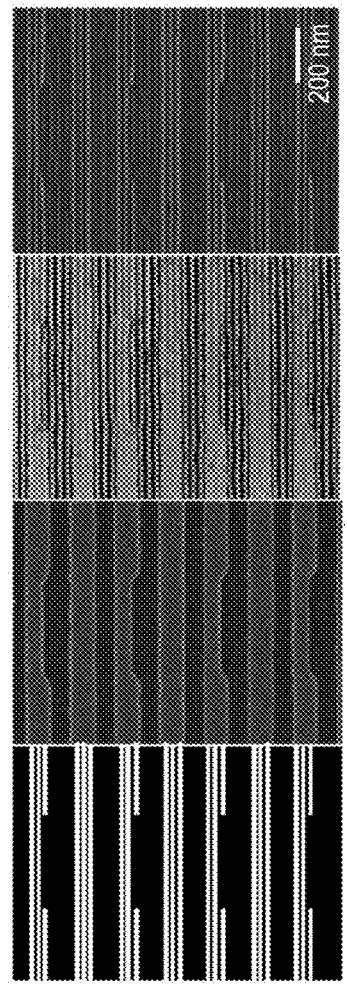
FIG. 13C is a series of images showing two-dimensional customization (Example 6C) using a target pattern having a long 1-line taper out of a combination of 3 lines alternating with a 3-line gap. The hybrid pre-pattern was prepared by the backfill process. The images include the target 2D pattern, the corresponding plane-view SEM image of the resist pattern, the DSA pattern, and customization results after transferring the DSA line pattern to the resist layer. The final array contained the 3 line gap and 1 line taper.

A target pattern having a long 1-line taper out of a combination of 3 lines alternating with a 3-line gap is shown in FIG. 13C-target. This pattern is designed for customizing 28 nm pitch DSA arrays, and repeats over an area of approximately 8.5 micrometers×5.8 micrometers in size. The hybrid pre-pattern was prepared by a backfill process. Silicon substrates ("Si wafer") were coated with 50 nm thick organic hard mask ("ODL", Shinetsu ODL 401) and 10 nm thick SiARC (Shinetsu SHB A-940 L10, "SiARC") to form the building stacks of the hybrid pre-pattern. The stack was treated with O2 RIE for 50 seconds to oxidize the SiARC surface. A neutralization material P(S-r-MMA-r-GMA) with thermal acid generator was then cast on the oxidized SiARC stack, baked at 215° C. for 2 minutes, and rinsed with PGMEA to remove any non-crosslinked material, thereby forming a neutral UL. A 60 nm thick 193i photoresist (JSR ArF AIM7210JN-8) was then coated on top of the neutral UL, pattern-wise exposed with e-beam lithography (EBL), and developed in negative tone with an organic developer (2-heptanone). FIG. 13C-resist shows the AIM7210 resist pattern ("7210").

The resist pattern was then transferred into the substrate by a series of RIE etches (5 seconds O2 RIE, 11 seconds $CF_4$ RIE, and 10 seconds O2 RIE). A polarity switch/hardening process was carried out by exposing the etched pre-pattern to a broadband DUV light from a Hg/Xe 500 W short-arc lamp (UXM-501MA-Ushio America) with a total flood exposure dose of 60 mJ/cm2, followed by a hard-bake at 95° C. for 60 seconds and 200° C. for 180 seconds. After hardening the resist, a non-neutral backfill material P(S-r-EDCPMA) with thermal acid generator was then cast on the hardened resist patterns and baked at 200° C. for 3 minutes. The concentration and spin rate of the backfill material were adjusted to avoid filling the trenches up to the resist features (i.e., the top surface of the backfill material was below the bottom interface of the resist features and the neutral layer). In this case, a 0.2% solution was spin cast at 4000 rpm. The backfilled resist pattern was then brought into contact with a standard aqueous alkaline developer (0.26N TMAH) for 60 seconds, followed by DI water rinse to remove the hardened resist pattern and form neutral elevated surfaces. The elevated surfaces (neutralization material) and recessed surfaces (backfill material) were separated by a height $H_N$=0.5 Lo. The elevated surfaces are neutral to the SA material. The recessed surfaces and sidewalls are non-neutral to the SA material.

PS-b-PMMA block copolymer solution (AZ PME 120, 28 nm pitch) for self-assembly was then spin-coated on the backfilled pre-pattern at 1500 rpm and the sample was annealed at 255° C. for 5 minutes to form the first DSA structure. After a single DSA process was carried out, a solvent rinse was done by casting PGMEA on the first DSA structure for 30 seconds and spinning the sample dry to remove any solvent and all or substantially all of the DSA structure. Another spin-coating of AZ PME 120 was then carried out at 1500 rpm and the sample was annealed at 255° C. for 10 minutes to generate the second DSA structures having fewer defects than those of the first DSA structures. The DSA structures were then etched to remove the PMMA domains using O2 RIE, resulting in a PS line pattern (FIG. 13C-DSA, SEM). The PS lines were then used as the etch mask to pattern the SiARC layer and HM8500 by performing a carefully timed $CF_4$ RIE and followed by O2 RIE. FIG. 13C-Customization shows the SEM images of the customized DSA arrays as target patterns.

CONCLUSION

The examples demonstrate that a neutral surface can retain its neutral wetting properties with respect to a selected SA material when the neutral surface is subjected to a process involving forming a resist pattern on the neutral surface, transferring the resist pattern to underlying layers, and stripping the resist pattern from the neutral surface.

The examples further demonstrate that, with respect to a given SA material, a resist pattern can be removed without adversely affecting the desirable surface properties of the recessed surfaces and sidewalls.

The examples also demonstrate that the recessed surfaces of a topographical pattern can undergo surface modification and/or backfilling to have non-neutral surface properties to a given SA material without adversely affecting the neutral surface properties of the elevated surfaces.

The examples additionally demonstrate that the elevated surfaces of a topographical pattern can undergo surface modification to have neutral surface properties to a given SA material without adversely affecting the non-neutral surface properties of the sidewalls.

The examples also demonstrate that the neutral and non-neutral surface modification materials can be applied before or after formation of the patterned resist features. Preferably, one is applied before the resist is applied and the other is applied after the resist is applied.

Using the above-described techniques, hybrid pre-patterns for self-assembly of a block copolymer were prepared comprising neutral elevated surfaces having underlying materials of high etch resistivity and recessed surfaces having underlying materials of lower etch resistivity. By setting the dimensions of the pre-pattern appropriately using the above guidelines, unidirectional perpendicularly oriented lamellae were formed on the elevated surfaces, and in some instances over the recessed surfaces. Transferring the domain patterns to the underlying layers resulted in intricate customized patterns in the underlying layers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
    i) forming a layer for self-assembly, designated SA layer, comprising a material for self-assembly, designated SA material, on a top surface of a hybrid pre-pattern, and optionally forming a topcoat disposed on a top surface of the SA layer, wherein
        the SA material is capable of self-assembling to form a phase separated lamellar domain pattern having a characteristic pitch Lo,
        the hybrid pre-pattern is disposed on a substrate,
        the top surface of the hybrid pre-pattern has a geometrical major axis,
        the top surface of the hybrid pre-pattern comprises a) independent elevated surfaces interspersed with adjacent independent recessed surfaces and b) sidewalls joining elevated surfaces to recessed surfaces,
        material underlying the elevated surfaces of the hybrid pre-pattern has greater etch-resistance in a given etch process compared to material underlying the recessed surfaces of the hybrid pre-pattern,
        a given elevated surface has width $W_{Ei}$ defined as the length of the given elevated surface in a direction perpendicular to the major axis, wherein $W_{Ei}$ is greater than 0 nm and subscript i of $W_{Ei}$ is a number representing an index value denoting adjacency,
        a given recessed surface has width $W_{Ri}$ defined as the length of the given recessed surface in a direction perpendicular to the major axis, wherein $W_{Ri}$ is greater than 0 nm and subscript i of $W_{Ri}$ is a number representing an index value denoting adjacency,
        $W_{Ri}+W_{Ei}$ of a given pair of adjacent recessed and elevated surfaces is an independent sum having a value of about nLo, meaning n times Lo, wherein n is an integer of 2 to about 30,
        the hybrid pre-pattern comprises a recessed surface whose $W_{Ri}$ is greater than about 2 Lo,
        the hybrid pre-pattern comprises an elevated surface whose $W_{Ei}$ is greater than about 2 Lo,
        each of the sidewalls has an independent height $H_N$ of about 0.1 Lo to about 2 Lo,
        the SA layer contacts the elevated surfaces, recessed surfaces, and sidewalls of the hybrid pre-pattern, and
        the SA layer has a top surface in contact with an atmosphere or the topcoat;
    ii) allowing or inducing the SA material to self-assemble, thereby forming a self-assembled SA layer comprising the lamellar domain pattern, the lamellar domain pattern comprising alternating lamellar domains comprising respective chemically distinct components of the SA material, each of the alternating lamellar domains comprising a plurality of lamellae, wherein
        the elevated surfaces are neutral wetting to the domains,
        each of the elevated surfaces contacts at least one of the lamellae of each of the domains,
        each of the lamellae in contact with a given elevated surface of the hybrid pre-pattern a) is oriented perpendicular to the given elevated surface, b) is in contact with the atmosphere interface or the topcoat above the given elevated surface, and c) is aligned along the major axis of the hybrid pre-pattern,
    iii) selectively removing one of the domains using an etch process, thereby forming an etched domain pattern comprising lamellae of a remaining domain; and
    iv) selectively transferring the etched domain pattern into the material having greater etch-resistance below the elevated surfaces using a second etch process, thereby forming a transfer pattern comprising topographical features comprising the material of greater etch-resistance.

2. The method of claim 1, wherein the method comprises selectively transferring the transfer pattern into one or more underlying layers of the substrate using a third etch process, thereby forming a second transfer pattern.

3. The method of claim 1, wherein the sidewalls contact one domain of the self-assembled SA layer.

4. The method of claim 1, wherein the recessed surfaces contact one domain of the self-assembled SA layer.

5. The method of claim 1, wherein the sidewalls are non-neutral wetting to the domains of the self-assembled SA layer.

6. The method of claim 1, wherein the sidewalls and recessed surfaces are non-neutral wetting to the domains of the self-assembled SA layer.

7. The method of claim 1, wherein regions of the self-assembled SA layer located over respective underlying recessed surfaces of the hybrid pre-pattern comprise lamellae oriented perpendicular to the respective underlying recessed surfaces.

8. The method of claim 1, wherein the etched domain pattern is a unidirectional line-space pattern having a pitch of about Lo.

9. The method of claim 1, wherein the top surface of the hybrid pre-pattern comprises two or more regions comprising recessed surfaces having different values of $W_{Ri}$.

10. The method of claim 1, wherein the top surface of the hybrid pre-pattern comprises two or more regions having different values of $W_{Ei}+W_{Ri}$ for a given pair of adjacent elevated and recessed surfaces.

11. The method of claim 1, wherein the material below the elevated surfaces comprises an inorganic material.

12. The method of claim 1, wherein the top surface of the SA layer contacts an atmosphere.

13. The method of claim 1, wherein the top surface of the SA layer contacts a topcoat.

14. The method of claim 1, wherein self-assembly of the SA layer forms a topcoat disposed on the SA layer.

15. The method of claim 1, wherein $H_N$ is about 0.2 Lo to about 2 Lo.

16. The method of claim 1, wherein the SA material comprises a block copolymer.

17. The method of claim 16, wherein the block copolymer is poly(styrene-b-methyl methacrylate) block copolymer.

18. The method of claim 1, wherein the top surface of the hybrid pre-pattern comprises two or more regions comprising elevated surfaces having different values of $W_{Ei}$.

19. The method of claim 18, wherein the two or more regions are along the major axis of the hybrid pre-pattern.

20. The method of claim 1, wherein the material below the elevated surfaces comprises a resist.

21. The method of claim 20, wherein the resist is a silsesquioxane.

22. A method, comprising:
i) forming a layer for self-assembly, designated SA layer, comprising a material suitable for self-assembly, designated SA material, on a top surface of a hybrid pre-pattern, and optionally forming a topcoat disposed on the SA layer, wherein
the SA material is capable of self-assembling to form a phase separated lamellar domain pattern having a characteristic pitch Lo,
the hybrid pre-pattern is disposed on a substrate,
the top surface of the hybrid pre-pattern has a geometrical major axis,
the top surface of the hybrid pre-pattern comprises a) independent elevated surfaces interspersed with adjacent independent recessed surfaces and b) sidewalls joining elevated surfaces to recessed surfaces,
material underlying the elevated surfaces of the hybrid pre-pattern has greater etch-resistance in a given etch process than material underlying the recessed surfaces of the hybrid pre-pattern,
a given elevated surface has a width $W_{Ei}$ defined as the length of the given elevated surface in a direction perpendicular to the major axis, wherein $W_{Ei}$ is greater than 0 nm and subscript i of $W_{Ei}$ is a number representing an index value denoting adjacency,
a given adjacent recessed surface has a width $W_{Ri}$ defined as the length of the recessed surface in a direction perpendicular to the major axis, wherein $W_{Ri}$ is greater than 0 nm and subscript i of $W_{Ri}$ is a number representing an index value denoting adjacency,
$W_{Ri}+W_{Ei}$ of a given pair of adjacent recessed and elevated surfaces is an independent sum having a value of about nLo, meaning n times Lo wherein n is an integer of 2 to about 30,
the hybrid pre-pattern comprises an elevated surface whose $W_{Ei}$ is greater than about 2 Lo,
the hybrid pre-pattern comprises a recessed surface whose $W_{Ri}$ is greater than about 2 Lo,
each of the sidewalls independently has a height $H_N$ of about 0.1 Lo to about 2 Lo,
the SA layer contacts the elevated surfaces, recessed surfaces, and sidewalls of the hybrid pre-pattern, and
the SA layer has a top surface in contact with an atmosphere interface or a topcoat;
ii) allowing or inducing the SA material to self-assemble, thereby forming a first self-assembled SA layer comprising a first lamellar domain pattern;
iii) selectively removing the first self-assembled SA layer, thereby forming a modified hybrid pre-pattern comprising a modified top surface, wherein
the modified top surface has a geometrical major axis,
the modified top surface comprises a) independent modified elevated surfaces interspersed with adjacent modified recessed surfaces and b) modified sidewalls joining modified elevated surfaces to modified recessed surfaces,
iv) disposing a second SA layer comprising the SA material on the modified top surface;
v) allowing or inducing the second SA layer to self-assemble, thereby forming a second self-assembled SA layer comprising a second lamellar domain pattern, the second lamellar domain pattern comprising alternating lamellar domains comprising respective chemically distinct components of the SA material, each of the alternating lamellar domains of the second lamellar domain pattern comprising a plurality of lamellae, wherein the second lamellar domain pattern has fewer defects compared to the first lamellar domain pattern, wherein
the modified elevated surfaces are neutral wetting to the alternating lamellar domains of the second lamellar domain pattern,
each of the modified elevated surfaces contacts at least one of the lamellae of each of the alternating lamellar domains of the second lamellar domain pattern, and
each of the lamellae of the second lamellar domain pattern in contact with a given modified elevated surface of the modified hybrid pre-pattern a) is oriented perpendicular to the given modified elevated surface, b) is in contact with the atmosphere interface or the topcoat above the given modified elevated surface, and c) is aligned along the major axis of the modified hybrid pre-pattern,
vi) selectively removing one of the alternating lamellar domains of the second lamellar domain pattern using an etch process, thereby forming an etched lamellar domain pattern comprising a remaining lamellar domain of the second lamellar domain pattern; and
vii) selectively transferring the etched lamellar domain pattern into the material having greater etch-resistance below the elevated surfaces of the modified hybrid pre-pattern, thereby forming a transfer pattern.

23. A method of forming a hybrid pre-pattern, comprising:
selecting a self-assembly material, designated SA material, capable of self-assembling to form a phase separated lamellar domain pattern comprising alternating lamellar domains having a characteristic pitch Lo;
forming a underlayer disposed on a substrate;
forming a topographical resist pattern disposed on the underlayer, the resist pattern comprising resist features separated by trenches having bottom surfaces comprising material of the underlayer;

selectively removing material below the bottom surfaces of the trenches, thereby forming a second topographic pattern, the second topographic pattern comprising trenches having a bottom surface comprising material of the substrate;

removing the resist pattern from the second topographic pattern, thereby forming the hybrid pre-pattern;

wherein the hybrid pre-pattern has a top surface and a geometrical major axis at the top surface, the top surface of the hybrid pre-pattern comprises a) independent elevated surfaces comprising underlayer material interspersed with independent adjacent recessed surfaces comprising substrate material and b) sidewalls joining elevated surfaces to recessed surfaces, the elevated surfaces are neutral wetting to the domains, the recessed surfaces and sidewalls are non-neutral wetting to the alternating lamellar domains, material underlying the elevated surfaces of the hybrid pre-pattern has greater etch-resistance in a given etch process than material underlying the recessed surfaces of the hybrid pre-pattern, a given elevated surface has an independent width $W_{Ei}$ defined as the length of the given elevated surface in a direction perpendicular to the major axis, wherein $W_{Ei}$ is greater than 0 nm and subscript i of $W_{Ei}$, is a number representing an index value denoting adjacency, a given recessed surface has an independent width $W_{Ri}$, defined as the length of the given recessed surface in a direction perpendicular to the major axis, wherein $W_{Ri}$, is greater than 0 nm and subscript i of $W_{Ri}$, is a number representing an index value denoting adjacency, $W_{Ri}+W_{Ei}$ of a given pair of adjacent elevated and recessed surfaces is an independent sum having a value of about nLo, meaning n times Lo, wherein n is an integer of 2 to about 30, the hybrid pre-pattern comprises an elevated surface whose $W_{Ei}$, is greater than about 2 Lo, the hybrid pre-pattern comprises a recessed surface whose $W_{Ri}$ is greater than about 2 Lo, the sidewalls have a height $H_N$ of about 0.1 Lo to about 2 Lo, and a layer for self-assembly, designated SA layer, comprising the SA material that is disposed on the top surface of the hybrid pre-pattern and having a top surface in contact with an atmosphere interface or a topcoat, is capable of self-assembling to form the lamellar domain pattern, the lamellar domain pattern comprising alternating lamellar domains comprising respective chemically distinct components of the SA material, each of the alternating lamellar domains comprising a plurality of lamellae, wherein each of the elevated surfaces contacts at least one of the lamellae of each of the alternating lamellar domains, and each of the lamellae in contact with a given elevated surface of the hybrid pre-pattern a) is oriented perpendicular to the given elevated surface, b) is in contact with the atmosphere interface or the topcoat above the given elevated surface, and c) is aligned along the major axis of the hybrid pre-pattern.

24. The method of claim 23, wherein the underlayer is neutral wetting to the domains.

25. The method of claim 23, wherein the underlayer is non-neutral wetting to the domains.

26. The method of claim 23, comprising backfilling the trenches of the second topographic pattern with a backfill material to a height below the bottom surface of the underlayer before said removing the resist pattern, wherein the backfill material is non-neutral wetting to the domains of the self-assembled SA material.

27. The method of claim 23, comprising surface modifying the second topographic pattern with a material that is non-neutral wetting to the domains before said removing the resist pattern.

28. The method of claim 23, wherein removing the resist pattern forms a third topographic pattern, and the method comprises treating the third topographic pattern with a surface modifying agent, thereby forming the hybrid pre-pattern, wherein the elevated surfaces and/or the recessed surfaces of the hybrid pre-pattern comprise the surface modifying agent.

29. A method of forming a hybrid pre-pattern, comprising:
selecting a material for self-assembly, designated SA material, capable of self-assembling to form a phase separated lamellar domain pattern comprising lamellar domains having a characteristic pitch Lo;

forming a underlayer disposed on a substrate, wherein the underlayer is non-neutral wetting to the domains;

forming a topographical resist pattern disposed on the underlayer, the resist pattern comprising resist features separated by trenches having bottom surfaces comprising material of the underlayer;

treating top surfaces of the resist features with a material that is neutral wetting to the domains, designated neutralization material, thereby forming the hybrid pre-pattern;

wherein the hybrid pre-pattern has a top surface and a geometrical major axis at the top surface, the top surface of the hybrid pre-pattern comprises a) independent elevated surfaces comprising resist and neutralization material interspersed with independent adjacent recessed surfaces comprising underlayer material and b) sidewalls joining elevated surfaces to recessed surfaces, the elevated surfaces are neutral wetting to the domains, the recessed surfaces and sidewalls are non-neutral wetting to the domains, material underlying the elevated surfaces of the hybrid pre-pattern has greater etch-resistance in a given etch process than material underlying the recessed surfaces of the hybrid pre-pattern, a given elevated surface has an independent width $W_{Ei}$ defined as the length of the given elevated surface in a direction perpendicular to the major axis, wherein $W_{Ei}$ is greater than 0 nm and subscript i of $W_{Ei}$ is a number representing an index value denoting adjacency, a given recessed surface has an independent width $W_{Ri}$ defined as the length of the recessed surface in a direction perpendicular to the major axis, wherein $W_{Ri}$ is greater than 0 nm and subscript i of $W_{Ri}$ is a number representing an index value denoting adjacency, $W_{Ri}+W_{Ei}$ of a given pair of adjacent elevated and recessed surfaces is an independent sum having a value of about nLo, meaning n times Lo, wherein n is an integer of 2 to about 30, the hybrid pre-pattern comprises a recessed surface whose $W_{Ri}$ is greater than about 2 Lo, the hybrid pre-pattern comprises an elevated surface whose $W_{Ei}$ is greater than about 2 Lo, the sidewalls have a height $H_N$ of about 0.1 Lo to about 2 Lo, a layer for self-assembly, designated SA layer, comprising the given SA material, which is disposed on the top surface of the hybrid pre-pattern and has a top surface in contact with an atmosphere interface, is capable of self-assembling to form the lamellar domain pattern, the lamellar domain pattern comprising alternating lamellar domains comprising respective chemically distinct components of the SA material, each of the alternating lamellar domains comprising a plurality of lamellae, wherein each of the elevated surfaces contacts at least one of the lamellae of each of the alternating lamellar domains, and each of the lamellae in contact with a given elevated surface of the hybrid pre-pattern a) is oriented perpendicular to the given elevated surface, b) is in contact with an atmosphere interface above the given elevated surface, and c) is aligned along the major axis of the hybrid pre-pattern.

30. The method of claim 29, wherein the topographical resist pattern comprises a silsesquioxane resist.

31. The method of claim 29, wherein the recessed surfaces of the hybrid pre-pattern comprise residual neutralization material.

* * * * *